(12) United States Patent
Shibata et al.

(10) Patent No.: US 6,925,004 B2
(45) Date of Patent: Aug. 2, 2005

(54) SEMICONDUCTOR MEMORY DEVICE FOR STORING MULTIVALUED DATA

(75) Inventors: Noboru Shibata, Kawasaki (JP); Tomoharu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 10/689,868

(22) Filed: Oct. 20, 2003

(65) Prior Publication Data

US 2005/0047217 A1 Mar. 3, 2005

Related U.S. Application Data

(63) Continuation-in-part of application No. 10/358,643, filed on Feb. 4, 2003, now Pat. No. 6,657,891.

(30) Foreign Application Priority Data

Nov. 29, 2002 (JP) ........................................ 2002-347797

(51) Int. Cl.⁷ ............................................. G11C 16/04
(52) U.S. Cl. ............................. 365/185.03; 365/185.12; 365/185.22
(58) Field of Search ....................... 365/185.03, 185.12, 365/185.22, 185.24, 203

(56) References Cited

U.S. PATENT DOCUMENTS

| | | | |
|---|---|---|---|
| 5,428,569 A | | 6/1995 | Kato et al. ............. 365/185.26 |
| 5,768,188 A | * | 6/1998 | Park et al. ............. 365/185.03 |
| 5,903,495 A | * | 5/1999 | Takeuchi et al. ....... 365/185.03 |
| 5,986,933 A | | 11/1999 | Takeuchi et al. ....... 365/185.12 |
| 6,028,794 A | | 2/2000 | Nakai et al. ........... 365/185.29 |
| 6,288,935 B1 | | 9/2001 | Shibata et al. |
| 6,373,746 B1 | | 4/2002 | Takeuchi et al. |
| 6,643,188 B2 | | 11/2003 | Tanaka et al. ......... 365/189.01 |
| 6,850,435 B2 | | 2/2005 | Tanaka .................. 365/185.08 |

* cited by examiner

Primary Examiner—Vu A. Le
(74) Attorney, Agent, or Firm—Hogan & Hartson, LLP

(57) ABSTRACT

In the operation of writing the second page, the control circuit precharges the bit line in verifying data "2" in the memory cell when the DDC has data "1" in it after the data cache is set and does not precharge the bit line when the DDC has data "0" in it. As a result, when data "2" has been written into the memory cell, the bit line is at the intermediate potential, which raises the threshold voltage of the memory cell a little.

30 Claims, 42 Drawing Sheets

After data load and internal read

| | Data in memory cell after writing | | | | |
|---|---|---|---|---|---|
| | 0 | 1 | 2 | 3 | |
| SDC | 0 | 1 | 0 | 1 | Data to be written and read inputted from the outside world |
| PDC | 0 | 0 | 1 | 1 | Data read by internal read |

FIG. 10A

After setting data caches

| | Data in memory cell after writing | | | | |
|---|---|---|---|---|---|
| | 0 | 1 | 2 | 3 | |
| SDC | 0 | 1 | 1 | 0 | |
| DDC | 0 | 1 | 0 | 0 | Used for charging in verifying memory cell data 1 |
| PDC | 1 | 0 | 0 | 0 | Used for charging in verifying memory cell data 2 |

1: Write unselected   0: Write

| Data cache setting procedure | SDC | | | | DDC | | | | PDC | | | | TDC | | | | |
|---|---|---|---|---|---|---|---|---|---|---|---|---|---|---|---|---|---|
| | 0 | 1 | 2 | 3 | 0 | 1 | 2 | 3 | 0 | 1 | 2 | 3 | 0 | 1 | 2 | 3 | |
| Data in memory cell after writing | 1 | 0 | 0 | 1 | | | | | | | | | | | | | |
| After internal data read | 1 | 0 | 0 | 1 | 0 | 0 | 1 | 1 | 0 | 0 | 1 | 1 | | | | | |
| Copy data in PDC into DDC | 1 | 0 | 0 | 1 | 0 | 0 | 1 | 1 | 0 | 0 | 1 | 1 | | | | | |
| Copy data in SDC into PDC | 1 | 0 | 0 | 1 | 0 | 0 | 1 | 1 | 1 | 0 | 0 | 1 | | | | | |
| TDC=H | 1 | 0 | 0 | 0 | 0 | 0 | 1 | 1 | 1 | 0 | 0 | 1 | 1 | 1 | 1 | 1 | |
| VREG=L, REG=H | 1 | 0 | 0 | 0 | 0 | 0 | 1 | 1 | 1 | 0 | 0 | 1 | 1 | 1 | 0 | 0 | |
| Copy data in TDC into SDC | 1 | 1 | 0 | 0 | 0 | 0 | 1 | 1 | 1 | 0 | 0 | 1 | 1 | 1 | 0 | 0 | |
| Copy data in PDC into TDC | 1 | 1 | 0 | 0 | 0 | 0 | 1 | 1 | 1 | 0 | 0 | 1 | 1 | 0 | 0 | 1 | |
| VREG=L, REG=H | 1 | 1 | 0 | 0 | 0 | 0 | 0 | 1 | 1 | 0 | 0 | 1 | 1 | 0 | 0 | 0 | |
| Copy data in PDC into DDC | 1 | 1 | 0 | 0 | 0 | 0 | 0 | 1 | 1 | 0 | 0 | 1 | 1 | 0 | 0 | 0 | |
| Copy data in TDC into PDC | 1 | 1 | 0 | 0 | 0 | 0 | 0 | 1 | 1 | 0 | 0 | 0 | 1 | 0 | 0 | 0 | |

| | | | | | | | | |
|---|---|---|---|---|---|---|---|---|
| TDC=H | VREG=L, REG=H | Copy data in PDC into DDC | Copy data in TDC into PDC | TDC=L | VREG=H, REG=H | Copy data in PDC into DDC | Copy data in TDC into PDC | |
| 1 | 0 | 0 | 0 | 0 | 0 | 0 | 0 | |
| 1 | 1 | 1 | 1 | 0 | 0 | 0 | 0 | TPC |
| 1 | 1 | 1 | 1 | 0 | 0 | 0 | 0 | |
| 1 | 0 | 0 | 0 | 1 | 1 | 1 | 1 | |
| 0 | 0 | 0 | 0 | 0 | 0 | 0 | 0 | |
| 0 | 0 | 0 | 1 | 1 | 1 | 1 | 0 | PDC |
| 0 | 0 | 1 | 1 | 1 | 1 | 0 | 0 | |
| 1 | 1 | 0 | 0 | 0 | 0 | 1 | 1 | |
| 1 | 1 | 0 | 0 | 0 | 0 | 0 | 0 | |
| 0 | 0 | 0 | 0 | 0 | 0 | 1 | 1 | DDC |
| 0 | 0 | 0 | 0 | 0 | 1 | 1 | 1 | |
| 1 | 1 | 1 | 1 | 1 | 0 | 0 | 0 | |
| 0 | 0 | 0 | 0 | 0 | 0 | 0 | 0 | |
| 0 | 0 | 0 | 0 | 0 | 0 | 0 | 0 | SDC |
| 1 | 1 | 1 | 1 | 1 | 1 | 1 | 1 | |
| 1 | 1 | 1 | 1 | 1 | 1 | 1 | 1 | |

FIG. 12

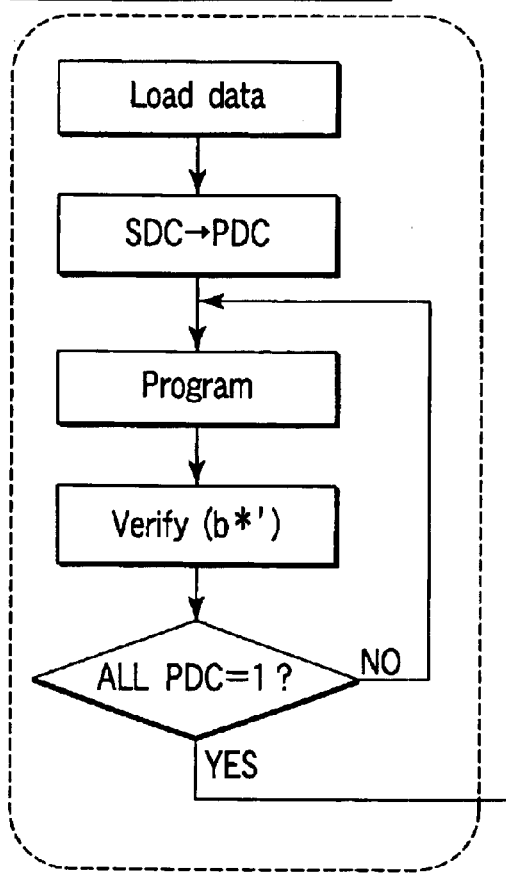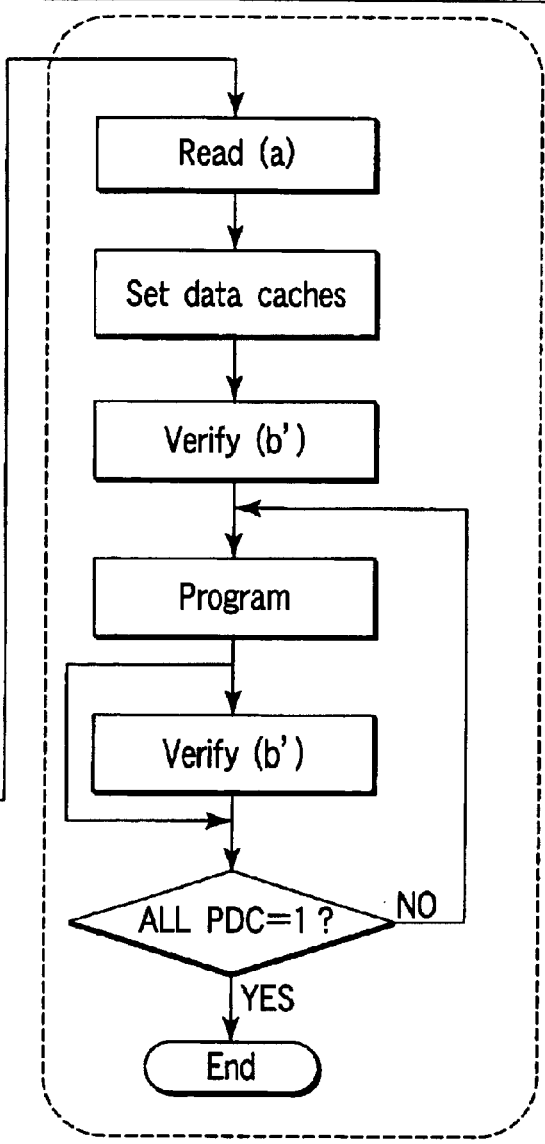
FIG. 22

Data cache setting 1

| | Data in memory cell after writing | | | |
|---|---|---|---|---|
| | 0 | 1 | 2 | 3 |
| SDC | 1 | 0 | 0 | 1 |
| DDC | 0 | 0 | 1 | 1 |
| PDC | 1 | 0 | 1 | 1 |

1 : Write unselected  0 : Write

FIG. 25

Data cache setting 1

| | Data in memory cell after writing | | | | |
|---|---|---|---|---|---|
| | 0 | 1 | 2 | 3 | |
| SDC | 0 | 1 | 0 | 0 | Used for charging in verifying memory cell data 1 |
| DDC | 0 | 1 | 1 | 0 | Used for charging in verifying memory cell data 2 |
| PDC | 1 | 0 | 0 | 0 | 1: Write unselected 0: Write |

FIG. 27A

Data cache setting 2

| | Data in memory cell after writing | | | | |
|---|---|---|---|---|---|
| | 0 | 1 | 2 | 3 | |
| PDC | 1 | 0 | 1 | 1 | 1: Write unselected 0: Write |

FIG. 27B

After data load and internal read

| | Data in memory cell after writing | | | | |
|---|---|---|---|---|---|
| | 0 | 1 | 2 | 3 | |
| SDC | 0 | 0 | 0 | 1 | Data to be written and read inputted from the outside world |
| PDC | 0 | 0 | 1 | 1 | Data read by internal read |

FIG. 29A

After data cache setting

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0 | 1 | 1 | Used for precharging bit line in programming and for charging in verifying memory cell data 1 |
| PDC | 1 | 0/1 | 0 | 0 | 1: Write unselected  0: Write |

FIG. 29B

FIG. 30A Precharge bit line on the basis of the data in DDC

| | Data in memory cell after writing | | | |
|---|---|---|---|---|
| | 0 | 1 | 2 | 3 |
| Bit line | Vdd | F(Vss) | Vdd | Vdd |

FIG. 30B With BLC1 = Vclamp, connect PDC to bit line

| | Data in memory cell after writing | | | |
|---|---|---|---|---|
| | 0 | 1 | 2 | 3 |
| Bit line | Vdd | 0/Intermediate | 0 | 0 |

FIG. 30C During program recovery, transfer data in PDC to DCC, invert data in DDC, and transfer the inverted data to PDC

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0/1 | 0 | 0 | 1: Write unselected 0: Write |
| PDC | 0 | 1 | 0 | 0 | Used for precharging bit line in programming and for charging in verifying memory cell data 1 |

Verify (a)
Charge bit line on the basis of data in PDC
Discharge bit line at a potential of WL = a*
Invert data in PDC while discharging bit line

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0/1 | 0 | 0 | 1: Write unselected 0: Write |
| PDC | 1 | 0 | 1 | 1 | Used for precharging bit line in programming and for charging in verifying memory cell data 1 |

FIG. 31A

Load the potential of bit line into TDC
With VREG = H and REG = H, make TDC 1 when dynamic data is 1
Transfer data in PDC to DDC and data in TDC to PDC

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0 | 0 | 1 | User for precharging bit line in programming and for chagrining in verifying memory cell data 1 |
| PDC | 1 | 0/1 | 1 | 1 | 1: Write unselected 0: Write |

FIG. 31B

With WL = a', discharge bit line
With VREG = H and REG = H, set 1 in TDC when dynamic data is 1
Transfer data in PDC to DDC
Transfer data in TDC to PDC

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0/1 | 0 | 0 | 1: Write unselected 0: Write |
| PDC | 1 | 0 | 1 | 1 | Used for precharging bit line in programming and for charging in verifying memory cell data 1 |

F I G. 32A

Transfer data in DDC to PDC
Then, transfer data in PDC to DDC

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0 | 1 | 1 | Used for precharging bit line in programming and for charging in verifying memory cell data 1 |
| PDC | 1 | 0/1 | 0 | 0 | 1: Write unselected 0: Write |

F I G. 32B

With memory cell data 1, all of the writing with verify (a*) is completed
(the writing with verify (a') might not be completed)

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0 | 1 | 1 | Used for precharging bit line in programming and for charging in verifying memory cell data 1 |
| PDC | 1 | 1 | 0 | 0 | 1: Write unselected  0: Write |

FIG. 33A

With memory cell data 1, all of the writing with verify (a') is completed
(the writing with verify (a') might not be completed)

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 1 | 1 | 1 | Used for precharging bit line in programming and for charging in verifying memory cell data 1 |
| PDC | 1 | 1 | 0 | 0 | 1: Write unselected  0: Write |

FIG. 33B (After writing first page and before writing second page)

(After writing first page, before writing second page, and after writing adjacent cells of first page)

After writing second page, before writing third page, and after writing adjacent cells of second page After third page data load internal read 1

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 0 | 0 | 1 | 1 | 0 | 0 | 1 | Data to be written and read inputted from the outside world |
| DDC | 0 | 0 | 0 | 0 | 0 | 0 | 1 | 1 | Data to be read by internal read |
| PDC | 0 | 0 | 0 | 0 | 1 | 1 | 1 | 1 | Data to be read by internal read |

FIG. 39A

After third page data cache setting 1

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 1 | 1 | 1 | 1 | 1 | 0 | 0 | Used for charging in verifying memory cell data items 5, 4 |
| DDC | 0 | 1 | 1 | 0 | 0 | 1 | 1 | 0 | Used for charging in verifying memory cell data 6<br>Forced to be at VSS in verifying memory cell data 4 |
| PDC | 1 | 1 | 1 | 1 | 0 | 0 | 0 | 0 | 1: Write unselected  0: Write |

FIG. 39B

After third page data cache setting 2

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 1 | 0 | 0 | 0 | 0 | 0 | 0 | |
| DDC | 0 | 1 | 1 | 0 | 0 | 1 | 1 | 0 | |
| PDC | 1 | 0 | 1 | 1 | 1 | 1 | 1 | 1 | 1: Write unselected 0: Write |

FIG. 40A

After third page data cache setting 3

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 1 | 0 | 0 | 0 | 0 | 0 | 0 | Used for charging in verifying memory cell data 1 |
| DDC | 0 | 1 | 1 | 0 | 0 | 1 | 1 | 0 | Used for charging in verifying memory cell data 2 |
| PDC | 1 | 0 | 1 | 1 | 1 | 1 | 1 | 1 | 1: Write unselected 0: Write |

FIG. 40B

After data load and internal read

|  | Data in memory cell after writing | | | |
|---|---|---|---|---|
|  | 0 | 1 | 2 | 3 |
| SDC | 1 | 0 | 0 | 1 | Data to be written and read inputted from the outside world |
| PDC | 0 | 0 | 1 | 1 | Data read by internal read |

FIG. 43A

After setting data caches

|  | Data in memory cell after writing | | | |
|---|---|---|---|---|
|  | 0 | 1 | 2 | 3 |
| SDC | 1 | 1 | 0 | 0 | Used for charging in verifying memory cell data 1 |
| DDC | 0 | 0 | 1 | 0 | Used for charging in verifying memory cell data 2 |
| PDC | 1 | 0 | 0 | 0 | 1: Write unselected, 0: Write |

FIG. 43B

Verify(a*')
Charge bit line on the basis of data in SDC
Discharge bit line at a potential of WL=a*'

|  | Data in memory cell after writing | | | | |
|---|---|---|---|---|---|
|  | 0 | 1 | 2 | 3 |  |
| SDC | 1 | 1 | 0 | 0 | Used for charging in verifying memory cell data 1 |
| DDC | 0 | 0 | 1 | 0 | Used for charging in verifying memory cell data 2 |
| PDC | 1 | 0 | 0 | 0 | 1: Write unselected, 0: Write |

FIG. 44A

Set Vdd in TDC and transfer the potential of bit line to TDC when BLCLAMP is H
With VREG=H, REG=H, make TDC 1 when dynamic data is 1
Transfer data in PDC to DDC and data in TDC to DDC

|  | Data in memory cell after writing | | | | |
|---|---|---|---|---|---|
|  | 0 | 1 | 2 | 3 |  |
| SDC | 1 | 1 | 0 | 0 | Used for charging in verifying memory cell data 1 |
| DDC | 1 | 0 | 0 | 0 | 1: Write unselected, 0: Write |
| PDC | 0 | 0/1 | 1 | 0 | Used for charging in verifying memory cell data 2. When threshold voltage in memory cell into which data 1 is written exceeds a*' → 1 |

FIG. 44B

Discharge bit line at a potential of WL=a'
Set Vdd in TDC and transfer the potential of bit line to TDC when BLCLAMP is H
With VREG=H, REG=H, make TDC 1 when dynamic data is 1
Transfer data in PDC to DDC and data in TDC to DDC

| | Data in memory cell after writing | | | | | |
|---|---|---|---|---|---|---|
| | 0 | 1pass | 1fail | 2 | 3 | |
| SDC | 1 | 1 | 1 | 0 | 0 | Used for charging in verifying memory cell data 1 |
| DDC | 0 | 1 | 0/1 | 1 | 0 | Used for charging in verifying memory cell data 2. When threshold voltage in memory cell into which data 1 is written exceeds a*' → 1 |
| PDC | 1 | 1 | 0 | 0 | 0 | 1: Write unselected, 0: Write |

F I G. 45A

Verify(b')
Charge bit line on the basis of data in DDC
Discharge bit line at a potential of WL=b'
Transfer data in DDC to TDC, PDC to DDC and TDC to PDC during the discharge
Set Vdd in TDC and transfer the potential of bit line to TDC when BLCLAMP is H
With VREG=H, REG=H, make TDC 1 when dynamic data is 1
Transfer data in PDC to DDC and data in TDC to DDC

|     | Data in memory cell after writing |   |       |       |   |                                                                                                                                         |
| --- | --- | --- | --- | --- | --- | --- |
|     | 0 | 1 | 2fail | 2pass | 3 |                                                                                                                                         |
| SDC | 1 | 1 | 0     | 0     | 0 | Used for charging in verifying memory cell data 1                                                                                       |
| DDC | 0 | 0/1 | 1   | 1     | 0 | Used for charging in verifying memory cell data 2 When threshold voltage in memory cell into which data 1 is written exceeds a*' → 1 |
| PDC | 1 | 0 | 0     | 1     | 0 | 1: Write unselected, 0: Write                                                                                                           |

FIG. 45B

Verify (c)
Charge bit line
Discharge bit line at a potential of WL=c'
Transfer data in DDC to TDC, PDC to DDC and TDC to PDC during the discharge
Set Vdd in TDC and transfer the potential of bit line to TDC when BLCLAMP is H
With VREG=H, REG=H, make TDC 1 when dynamic data is 1
Transfer data in PDC to DDC and data in TDC to DDC

|     | Data in memory cell after writing |   |     |   |   | 3fail | 3pass |   |
| --- | --- | --- | --- | --- | --- | --- | --- | --- |
|     | 0 | 1 | 1 | 2 |   |   |   |   |
| SDC | 1 | 1 | 0/1 | 0 |   | 0 | 0 | Used for charging in verifying memory cell data 1 |
| DDC | 0 | 0 |   | 0 |   | 0 | 0 | Used for charging in verifying memory cell data 2. When threshold voltage in memory cell into which data 1 is written exceeds a*'→1 |
| PDC | 1 | 0 |   | 0 |   | 0 | 1 | 1: Write unselected, 0: Write |

FIG. 46

SEMICONDUCTOR MEMORY DEVICE FOR STORING MULTIVALUED DATA

CROSS-REFERENCE TO RELATED APPLICATIONS

This is a Continuation-in-Part application of U.S. patent application Ser. No. 10/358,643, filed Feb. 4, 2003 now U.S. Pat. No. 6,657,891, the entire contents of which are incorporated herein by reference.

This application is based upon and claims the benefit of priority from the prior Japanese Patent Application No. 2002-347797, filed Nov. 29, 2002, the entire contents of which are incorporated herein by reference.

BACKGROUND OF THE INVENTION

1. Field of the Invention

This invention relates to a nonvolatile semiconductor memory device capable of storing, for example, 2 bits or more of data.

2. Description of the Related Art

A nonvolatile semiconductor memory device capable of storing mutivalued data, such as a NAND flash memory using EEPROM, has been proposed (U.S. Pat. No. 6,178,115).

In a NAND flash memory where a plurality of cells are arranged in a matrix, all of or half of the cells arranged in the direction of row are selected simultaneously. Data is written into or read from the selected cells in unison. Specifically, the selected cells are connected to corresponding bit lines. A latch circuit for holding the write and read data is connected to each bit line. Data is written or read by using the latch circuit.

This type of nonvolatile semiconductor memory device has been miniaturized so significantly that the spacing between adjacent cells in the row direction and the column direction is very narrow. As the distance between adjacent cells becomes shorter, the capacitance between the floating gates of adjacent cells (FG-FG capacitance) becomes larger. This causes the following problem: the threshold voltage Vth of a cell written into previously varies according to the data in an adjacent cell written into later due to the FG-FG capacitance. In the case of a mutivalued memory that stores a plurality of data (k bits) in a single cell, it has a plurality of threshold voltages. Therefore, it is necessary to control the distribution of a threshold voltage per data very narrowly, which causes the following significant problem: the threshold voltage varies according to the data in the adjacent cells. Therefore, a nonvolatile semiconductor memory device capable of preventing the threshold voltage from varying with the data in the adjacent cells has been demanded.

BRIEF SUMMARY OF THE INVENTION

According to a first aspect of the present invention, there is provided a semiconductor memory device comprising: a memory cell which stores a plurality of data with an n-valued threshold voltage (n is a natural number equal to or larger than 1); a first data storage circuit which stores at least a first-logic-level or a second-logic-level data read from the memory cell; a second data storage circuit which is connected to a data line and stores at least the first- or second-logic-level data supplied from the data line; a third data storage circuit which stores at least the data read from the memory cell or the first- or second-logic-level data supplied from the first data storage circuit; and a control circuit which manipulates the data in the first, second and third data storage circuits in such a manner that the control circuit does not change the threshold voltage of the memory cell when the logic level of the first data storage circuit is at the second logic level, carries out a first write operation to raise the threshold voltage of the memory cell when the logic level of the first data storage circuit is at the first logic level and the logic level of the third data storage circuit is at the first logic level, and carries out a second write operation to raise the threshold voltage of the memory cell when the logic level of the third data storage circuit is at the second logic level, which, in a first verify operation, does not precharge the memory cell when the logic level of the second data storage circuit is at the first logic level and precharges the memory cell when the logic level of the second data storage circuit is at the second logic level, which sets the logic level of the third data storage circuit to the second logic level when the threshold voltage of the memory cell has exceeded a first verify voltage, does not change the logic level of the third data storage circuit when the threshold voltage of the memory cell has not exceeded the first verify voltage, sets the logic level of the first data storage circuit to the second logic level when the threshold voltage of the memory cell has exceeded a second verify voltage higher than the first verify voltage, and does not change the logic level of the first data storage circuit when the threshold voltage of the memory cell has not exceeded the second verify voltage, which, in a second verify operation, does not precharge the memory cell when the logic level of the third data storage circuit is at the first logic level and precharges the memory cell when the logic level of the second data storage circuit is at the second logic level, which sets the logic level of the first data storage circuit to the second logic level when the threshold voltage of the memory cell has exceeded a third verify voltage higher than the second verify voltage, and does not change the logic level of the first data storage circuit when the threshold voltage of the memory cell has not exceeded the third verify voltage, and which, in a third verify operation, sets the logic level of the first data storage circuit to the second logic level when the threshold voltage of the memory cell has exceeded a fourth verify voltage higher than the third verify voltage, does not change the logic level of the first data storage circuit when the threshold voltage of the memory cell has not exceeded the fourth verify voltage, and repeats the first and second write operations and verify operations until the logic level of the first data storage circuit reaches the second logic level.

According to a second aspect of the present invention, there is provided a semiconductor memory device comprising: a memory cell which store a plurality of data with an n-valued threshold voltage (n is a natural number equal to or larger than 1); a first data storage circuit which stores at least a first-logic-level or a second-logic-level data read from the memory cell; a second data storage circuit which is connected to a data line and stores at least the first- or second-logic-level data supplied from the data line; a third data storage circuit which stores at least the data read from the memory cell or the first- or second-logic-level data supplied from the first data storage circuit; and a control circuit which, after writing the data in a first page into the memory cell, stores the data in a second page via a data line into the second data storage circuit, stores the data in the first page read from the memory cell into the first data storage circuit, and manipulates the first, second, and third storage circuits in such a manner that the control circuit sets the second logic level in the third data storage circuit in a case where data "2" has been written into the memory cell or a case data "1" has been written into the memory cell and a first verify voltage has been exceeded, and, in other cases, sets the first logic level in the third data storage circuit.

According to a third aspect of the present invention, there is provided a semiconductor memory device comprising: a memory cell which stores a plurality of data with an n-valued threshold voltage (n is a natural number equal to or larger than 1); a first data storage circuit which stores at least a first-logic-level or a second-logic-level data read from the memory cell; a second data storage circuit which is connected to a data line and stores at least the first- or second-logic-level data supplied from the data line; a third data storage circuit which stores at least the data read from the memory cell or the first- or second-logic-level data supplied from the first data storage circuit; and a control circuit which stores the data in a first page supplied from the data line into the second data storage circuit, transfers the data in the first page stored in the second data storage circuit to the first data storage circuit, stores the data in a second page supplied from the data line into the second data storage circuit, sets write data on the basis of the data in the first page stored in the first data storage circuit and the data in the second page stored in the second data storage circuit, and writes the data in the first page and the data in the second page into the memory cell at the same time on the basis of the write data.

BRIEF DESCRIPTION OF THE SEVERAL VIEWS OF THE DRAWING

FIGS. 10A and 10B show the relationship between each data cache and the data in the memory cell;

FIG. 11 is a diagram to help explain the procedure for setting the data caches;

FIG. 12 is a diagram to help explain the procedure for setting the data caches;

FIG. 22 is a flowchart for part of the operations in FIG. 21;

FIG. 25 shows the relationship between each data cache and the data in the memory cell in the fifth embodiment;

FIGS. 27A and 27B show the relationship between each data cache and the data in the memory cell in the sixth embodiment;

FIGS. 29A and 29B show the relationship between each data cache and the data in the memory cell in the seventh embodiment;

FIGS. 30A, 30B, and 30C show the relationship between each data cache and the data in the memory cell in the seventh embodiment;

FIGS. 31A and 31B show the relationship between each data cache and the data in the memory cell in the seventh embodiment;

FIGS. 32A and 32B show the relationship between each data cache and the data in the memory cell in the seventh embodiment;

FIGS. 33A and 33B show the relationship between each data cache and the data in the memory cell in the seventh embodiment;

FIGS. 39A and 39B show the relationship between each data cache and the data in the memory cell in the eighth embodiment;

FIGS. 40A and 40B show the relationship between each data cache and the data in the memory cell in the eighth embodiment;

FIGS. 43A, 43B, 44A, 44B, 45A, 45B and 46 show the relationship between each data cache and the data in the memory cell in the ninth embodiment;

DETAILED DESCRIPTION OF THE INVENTION

Hereinafter, referring to the accompanying drawings, embodiments of the present invention will be explained.

The principle of the present invention will be explained. In the present invention, before the next data is stored into a memory cell into which, for example, i bits of data have been stored, i or less bits of data are written into the adjacent memory cells beforehand. In writing the i or less bits of data, the threshold voltage is made lower than the original threshold voltage (or the actual threshold voltage in storing i bits of data). After the adjacent memory cells have been written into, writing is done to raise the threshold voltage of the memory cell. In the cells whose threshold voltage has risen due to the FG-FG capacitance, the threshold voltage does not change much in the writing. In the cells whose threshold voltage has not risen much due to the FG-FG capacitance, the threshold voltage rises in the writing, with the result that the threshold voltage reaches the original value. However, before and after the writing to raise the threshold voltage, it is unknown whether the i bits of data have the original threshold voltage or a lower voltage than that. To differentiate between them, a flag memory cell (or flag cell) is prepared. A read operation is carried out according to the data in the flag cell.

In a NAND flash memory, all of or half of the cells arranged in the row direction are written into simultaneously. Therefore, a flag cell is provided for each unit of writing.

(First Embodiment)

Figure 2:
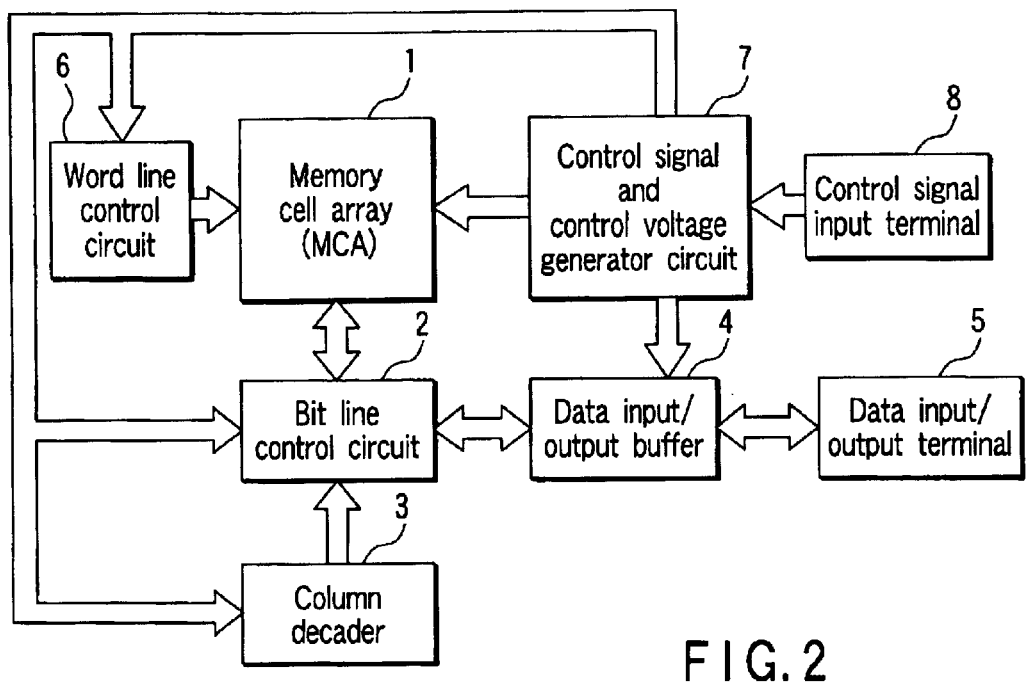
FIG. 2 shows a schematic configuration of a nonvolatile semiconductor memory device according to the present invention.

FIG. 2 shows a schematic configuration of a nonvolatile semiconductor memory device, such as a NAND flash memory for storing four values (or two bits), according to the present invention.

A memory cell array 1 includes a plurality of bit lines, a plurality of word lines, and a common source line. In the memory cell array 1, memory cells composed of, for example, EEPROM cells capable of electrically rewriting data are arranged in a matrix. A bit control circuit 2 for controlling the bit lines and a word line control circuit 6 are connected to the memory cell array 1.

The bit line control circuit 2 includes a plurality of data storage circuits and a flag data storage circuit as explained later. The bit line control circuit 2 reads the data from a memory cell in the memory cell array 1 via a bit line, senses the state of a memory cell in the memory cell array 1 via a bit line, or writes data into a memory cell in the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into a data storage circuit is outputted from a data input/output terminal 5 to the outside world via the data input/output buffer 4.

The write data externally inputted to the data input/output terminal 5 is inputted via the data input/output buffer 4 to the data storage circuit selected by the column decoder 3.

The word line control circuit 6 is connected to the memory cell array 1. The word line control circuit 6 selects a word line in the memory cell array 1 and applies the necessary voltage for reading, writing, or erasing to the selected word line.

The memory cell array 1, bit line control circuit 2, column decoder 3, data input/output buffer 4, and word line control circuit 6, which are connected to a control signal and control voltage generator circuit 7, are controlled by the control signal and control voltage generator circuit 7. The control signal and control voltage generator circuit 7, which is connected to a control signal input terminal 8, is controlled by a control signal externally inputted via the control signal input terminal 8.

The bit line control circuit 2, column decoder 3, word line control circuit 6, and control signal and control voltage generator circuit 7 constitute a write circuit and a read circuit.

Figure 3:
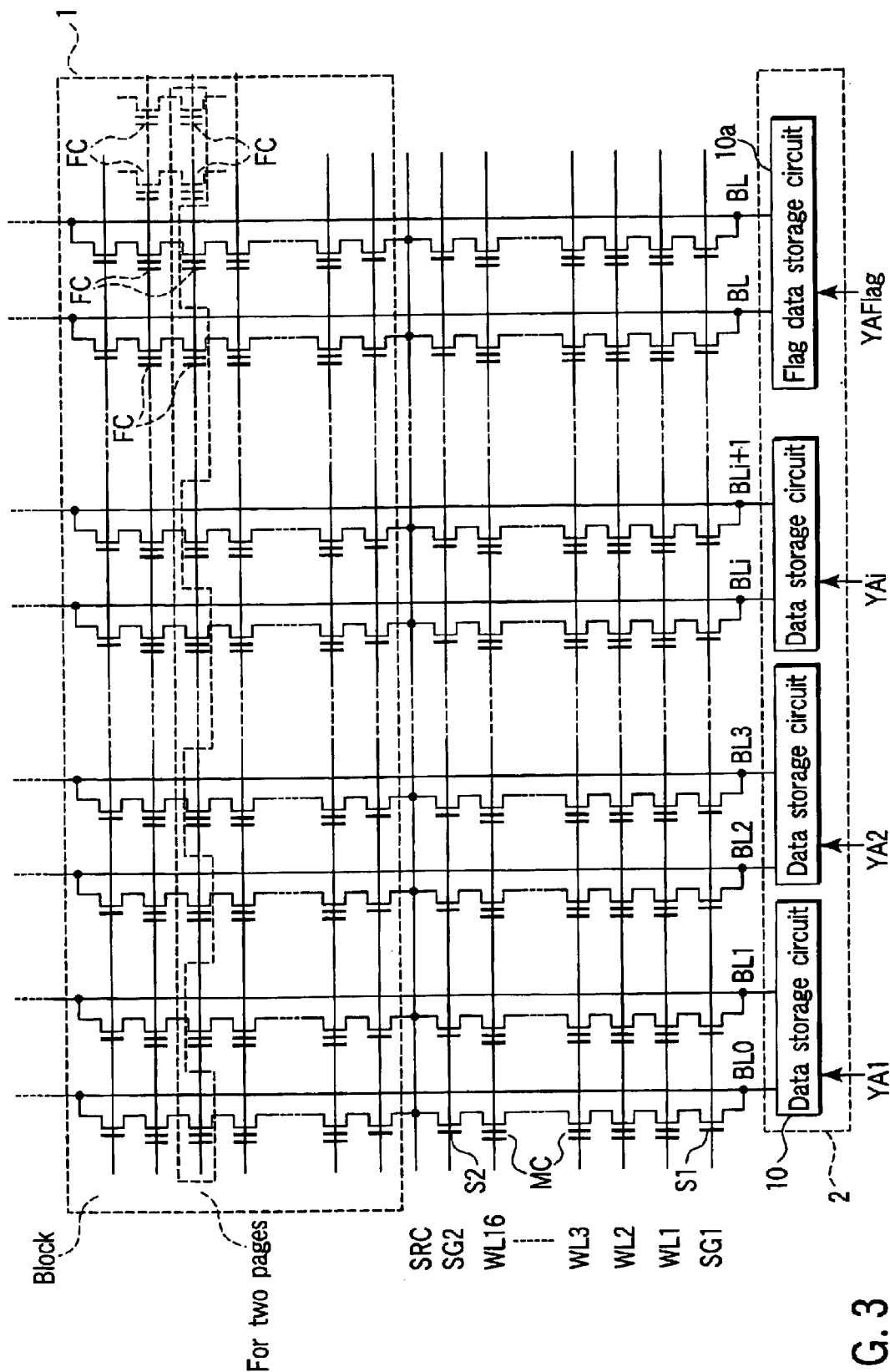
FIG. 3 is a circuit diagram showing the configuration of the memory cell array and bit line control section shown in FIG. 2.

FIG. 3 shows the configuration of the memory cell array 1 and the bit line control circuit 2 shown in FIG. 2. In the memory cell array 1, a plurality of NAND cells are provided. A NAND is composed of a memory cell made up of, for example, 16 EEPROMs connected in series, and select gates S1, S2. The first select gate S1 is connected to bit line BL0 and the second select gate S2 is connected to source line SRC. The control gates of the memory cells arranged in each row are connected in common to word lines WL2, WL2, WL3, . . . , WL16. The first select gate S1 is connected in common to select line SG1 and the second select gate S2 is connected in common to select line SG2.

The memory cell array 1 includes a plurality of blocks as shown by a broken line. Each block is composed of a plurality of NAND cells. Data is erased in blocks. An erase operation is carried out simultaneously on two bit lines connected to a data storage circuit 10 and a flag data storage circuit 10a.

The bit line control circuit 2 has a plurality of data storage circuits 10 and a flag data storage circuit 10a. Pairs of bit lines (BL0, BL1), (BL2, BL3), . . . , (BLi, Bli+1), (BL, BL) are connected to the individual data storage circuits 10 and flag data storage circuit 10a in a one-to-one correspondence.

A plurality of memory cells (the memory cells enclosed by a broken line) provided for every other bit line and connected to a word line constitute one sector. Data is written and read in sectors. In one sector, for example, two pages of data are stored. A flag cell FC for storing a flag is connected to each word line. That is, in the first embodiment, one sector includes one flag cell FC.

The number of flag cells FC is not limited to one for one sector. As shown by the broken line, a plurality of flag cells may be connected to one sector. In this case, as explained later, the data stored in the flag cells has only to be determined by a majority decision.

In a read operation, a program verity operation, and a program operation, of the two bit lines (BLi, BLi+1) connected to the data storage circuit 10, one bit line is selected according to the address signal (YA, YA2, . . . , YAi, YAFlag) externally specified. In addition, according to an external address, one word line is selected and one sector (for two pages) is selected. The switching between two pages is done according to an address.

Figure 4A:
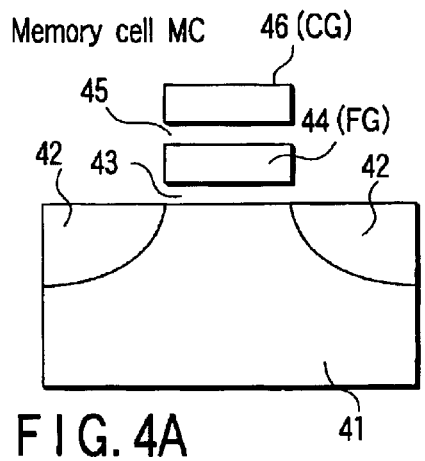
FIGS. 4A and 4B are sectional views of a memory cell and a select transistor, respectively.
Figure 4B:
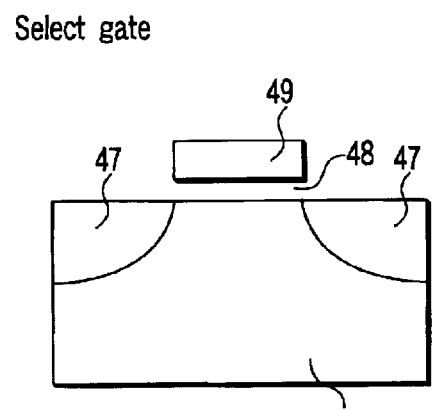

FIGS. 4A and 4B are sectional views of a memory cell and a select transistor. FIG. 4A shows a memory cell. In a substrate 41, n-type diffused layers 42 serving as the source and drain of a memory cell are formed. Above the substrate 41, a floating gate (FG) 44 is formed via a gate insulating film 43. Above the floating gate 44, a control gate (CG) 46 is formed via an insulating film 45. FIG. 4B shows a select gate. In a substrate 41, n-type diffused layers 47 acting as the source and drain are formed. Above the substrate 41, a control gate 49 is formed via a gate insulating film 48.

Figure 5:
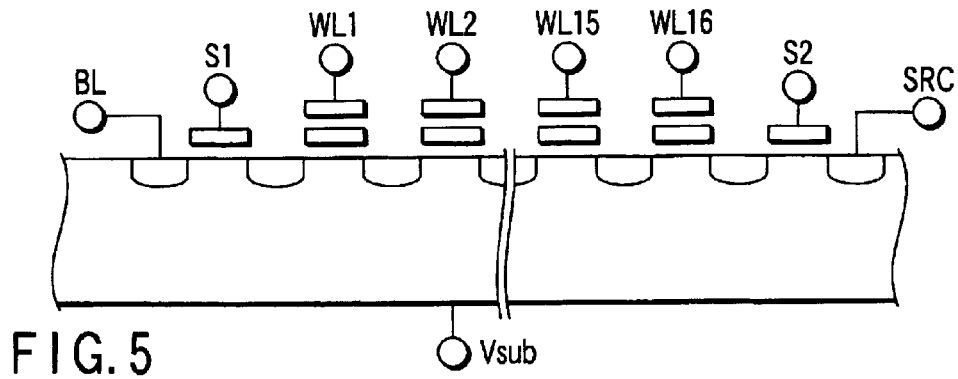
FIG. 5 is a sectional view of a NAND cell in the memory cell array.

FIG. 5 is a sectional view of a NAND cell in the memory cell array. In this example, a NAND cell is composed of 16 memory cells MC with the configuration of FIG. 4A connected in series. On the drain side and source side of the NAND cell, a first select gate S1 and a second select gate S2 with the configuration of FIG. 4B are provided.

Figure 6:
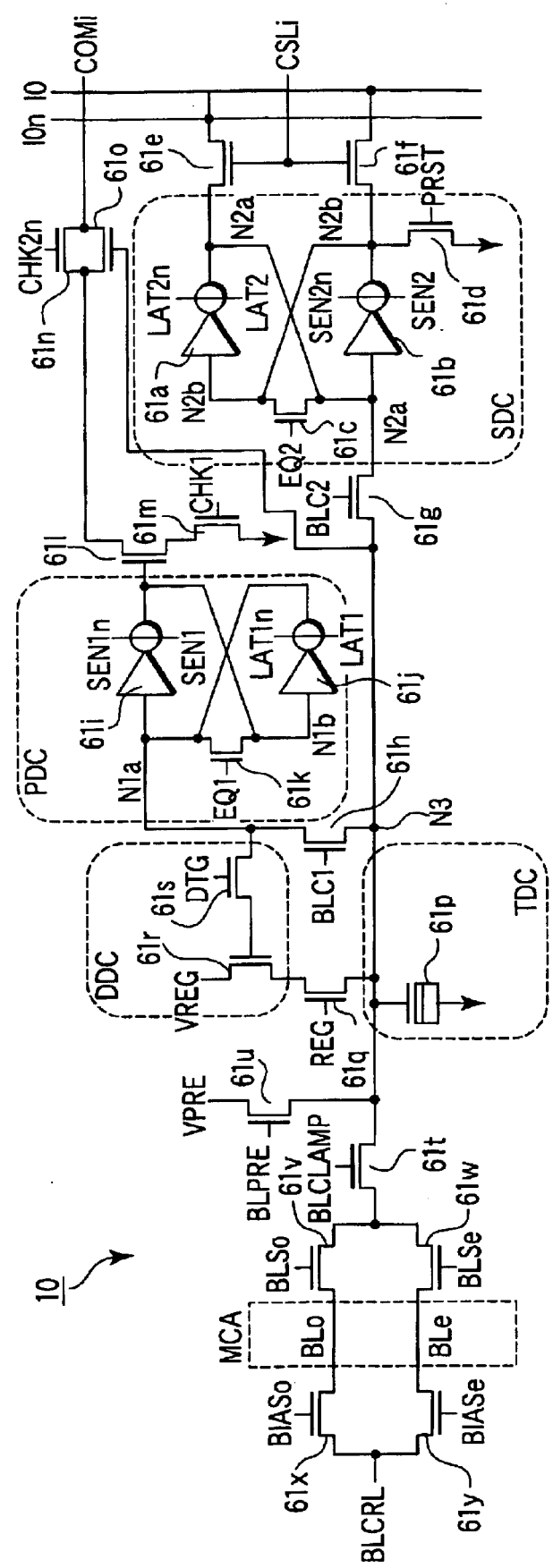
FIG. 6 is a circuit diagram of an example of the data storage circuit shown in FIG. 3.

FIG. 6 is a circuit diagram of the data storage circuit 10 shown in FIG. 3. The flag data storage circuit 10a has the same configuration as that of the data storage circuit 10.

The data storage circuit 10 includes a primary data cache (PDC), a secondary data cache (SDC), a dynamic data cache (DDC), and a temporary data cache (TDC). The SDC, PDC, DDC hold the input data in a write operation, the read data in a read operation, or the data temporarily in a verify operation, and are used to manipulate the internal data in storing mutivalued data. The TDC amplifies the data on the bit line and holds the data temporarily when reading the data and is used to manipulate the internal data when storing the manipulated data.

The SDC is composed of clocked inverter circuits 61a, 61b constituting a latch circuit and transistors 61c, 61d. The transistor 61c is inserted between the input terminal of the clocked inverter circuit 61a and the input terminal of the clocked inverter circuit 61b. Signal EQ2 is supplied to the gate of the transistor 61c. The transistor 61d is connected between the output terminal of the clocked inverter circuit 61b and the ground. Signal PRST is supplied to the gate of the transistor 61d. Node N2a of the SDC is connected to an input/output data line IOn via a column select transistor 61e. Node N2b is connected to an input/output data line IO via a column select transistor 61f. Column select signal CSLi is supplied to the gates of the transistors 61e, 61f. Node N2a of the SDC is connected to Node N1a of the PDC via transistors 61g, 61h. Signal BLC2 is supplied to the gate of the transistor 61g and signal BLC1 is supplied to the gate of the transistor 61h.

The PDC is composed of clocked inverter circuits 61i, 61j and a transistor 61k. The transistor 61k is connected between the input terminal of the clocked inverter circuit 61i and the input terminal of the clocked inverter circuit 61j. Signal EQ1 is supplied to the gate of the transistor 61k. Node N1b of the PDC is connected to the gate of a transistor 61i. One end of the current path of the transistor 61l is connected to the ground via a transistor 61m. Signal CHK1 is supplied to the gate of the transistor 61m. The other end of the current path of the transistor 61l is connected to one end of the current path of transistors 61n, 61o constituting a transfer gate. Signal CHK2n is supplied to the gate of the transistor 61n. The gate of the transistor 61o is connected to the junction node of the transistors 61g and 61h. Signal COMi is supplied to the other end of the current path of the transistors 61n, 61o. The signal COMi, which is a signal common to all of the data storage circuits 10, indicates whether all of the data storage circuits 10 have been verified. That is, as described later, after they have been verified, node N1b of the PDC goes low. In this state, when signal CHK1 and signal CHK2 are made high, signal COMi goes high, if all of the data storage circuits 10 have been verified.

The TDC is composed of, for example, a MOS capacitor 61p. The capacitor 61p is connected between junction node N3 of the transistors 61g, 61h and the ground. The DDC is connected via a transistor 61q to junction node N3. Signal REG is supplied to the gate of the transistor 61q.

The DDC is composed of transistors 61r, 61s. Signal VREG is supplied to one end of the current path of the transistor 61r. The other end of the current path of the transistor 61r is connected to the current path of the transistor 61q. The gate of the transistor 61r is connected via a transistor 61s to node N1a of the PDC. Signal DTG is supplied to the gate of the transistor 61s.

One end of the current path of transistors 61t, 61u is connected to the junction node N3. Signal VPRE is supplied to the other end of the current path of the transistor 61u. Signal BLPRE is supplied to the gate of the transistor 61u. Signal BLCLAMP is supplied to the gate of the transistor 61t. The other end of the current path of the transistor 61t is connected via a transistor 61v to one end of a bit line BLo and also connected via a transistor 61w to one end of a bit line BLe. The other end of the bit line BLo is connected to one end of the current path of a transistor 61x. Signal BlASo is supplied to the gate of the transistor 61x. The other end of the bit line BLe is connected to one end of the current path of a transistor 61y. Signal Blase is supplied to the gate of the transistor 61y. Signal BLCRL is supplied to the other end of the current path of the transistors 61x, 61y. The transistors 61x, 61y, which are turned on complementarily with transistors 61v, 61w according to signals BlASo, BlASe, supply the potential of the signal BLCRL to the unselected bit lines.

The above signals and voltages are generated by the control signal and control voltage generator circuit 7 shown in FIG. 2. The following operations are controlled by the control signal and control voltage generator circuit 7.

The memory, which is a mutivalued memory, is capable of storing 2 bits of data in a cell. The switching between the 2 bits is effected by an address (a first page, second page).

(Explanation of Operation)

The operation in the above configuration will be explained.

Figure 1A:
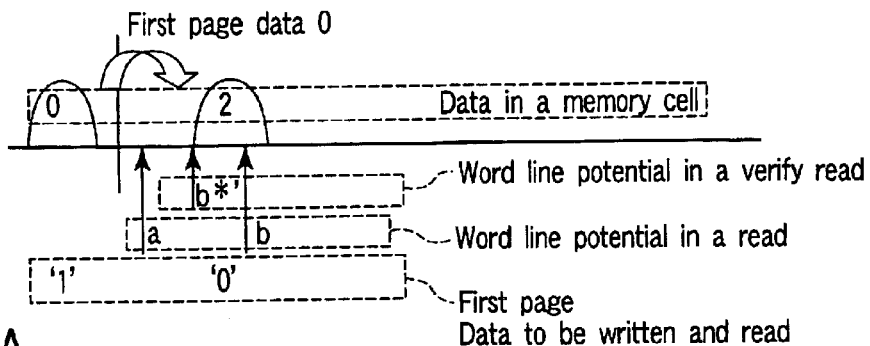
FIGS. 1A, 1B, and 1C show the relationship between the data in a memory cell according to a first embodiment of the present invention and the threshold voltages of the memory cell.
Figure 1B:
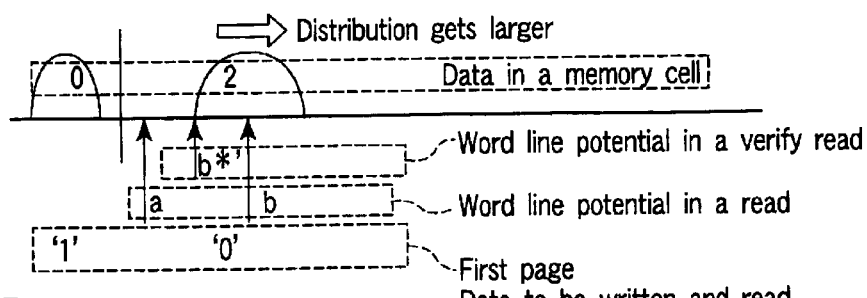
Figure 1C:
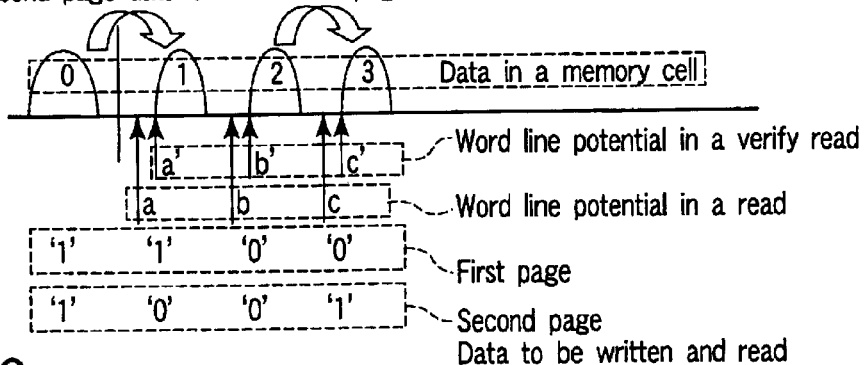

FIG. 1 shows the relationship between the data in a memory cell and the threshold voltages of the memory cell. After an erase operation is carried out, the data in a memory cell becomes "0". As shown in FIG. 1A, after a first page is written into, the data in the memory cell become data "0" and data "2". As shown in FIG. 1B, before a second page is written into, data equal to or lower than the threshold of the actual data is written into the adjacent cells. Then, the data written into the cells makes the distribution of the threshold voltage of data "2" larger. Thereafter, when data has been written into the second page, the data in the memory cell become data "0" to "3" with the original threshold voltage as shown in FIG. 1C. The data in the memory cell are defined in ascending order of threshold voltage.

Figure 7:
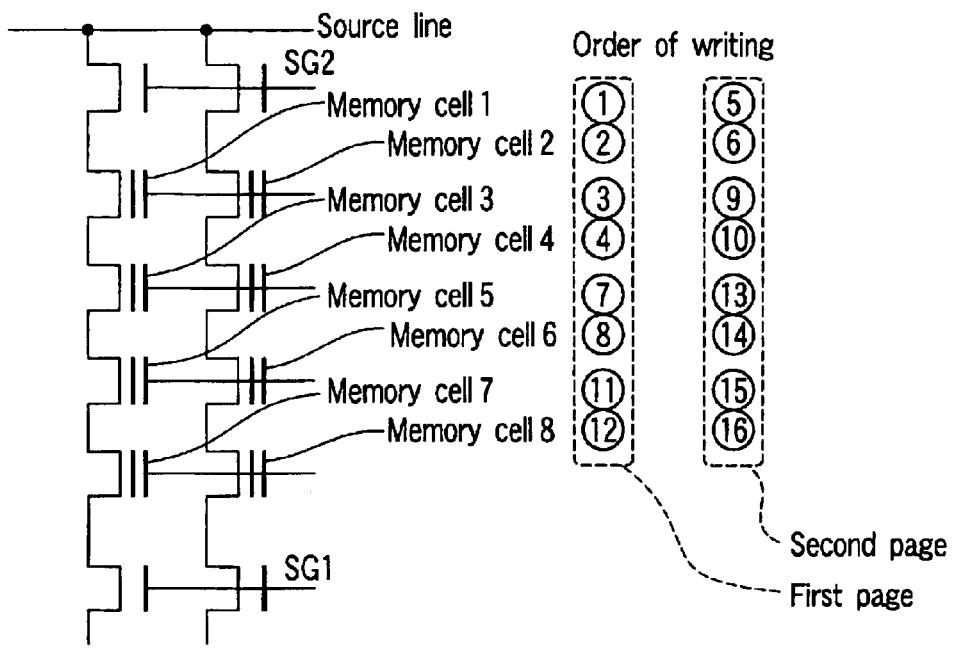
FIG. 7 is a diagram to help explain the order in which data is written into a NAND cell.

FIG. 7 shows the order in which NAND cells are written into. In a block, a write operation is carried out in pages, starting with the memory cell closest to the source line. In FIG. 7, for the sake of explanation, the number of word lines is assumed to be four.

In a first write operation, one bit of data is written into a first page of memory cell 1.

In a second write operation, one bit of data is written into the first page of memory cell 2 adjacent to memory cell 1 in the direction of word.

In a third write operation, one bit of data is written into the first page of memory cell 3 adjacent to memory cell 1 in the direction of bit.

In a fourth write operation, one bit of data is written into the first page of memory cell 4 adjacent to memory cell 1 in a diagonal direction.

In a fifth write operation, one bit of data is written into a second page of memory cell 1.

In a sixth write operation, one bit of data is written into the second page of memory cell 2 adjacent to memory cell 1 in the direction of word.

In a seventh write operation, one bit of data is written into the first page of memory cell 5 adjacent to memory cell 3 in the direction of bit.

In an eighth write operation, one bit of data is written into the first page of memory cell 6 adjacent to memory cell 3 in a diagonal direction.

In a ninth write operation, one bit of data is written into the second page of memory cell 3.

In a tenth write operation, one bit of data is written into the second page of memory cell 4 adjacent to memory cell 3 in the direction of word.

In an eleventh write operation, one bit of data is written into the first page of memory cell 7 adjacent to memory cell 5 in the direction of bit.

In a twelfth write operation, one bit of data is written into the first page of memory cell 8 adjacent to memory cell 5 in a diagonal direction.

In a thirteenth write operation, one bit of data is written into the second page of memory cell 5.

In a fourteenth write operation, one bit of data is written into the second page of memory cell 6 adjacent to memory cell 5 in the direction of word.

In a fifteenth write operation, one bit of data is written into the second page of memory cell 7.

In a sixteenth write operation, one bit of data is written into the second page of memory cell 8 adjacent to memory cell 7 in the direction of word.

(Program and Program Verify)

(First Page Program)

Figure 8:
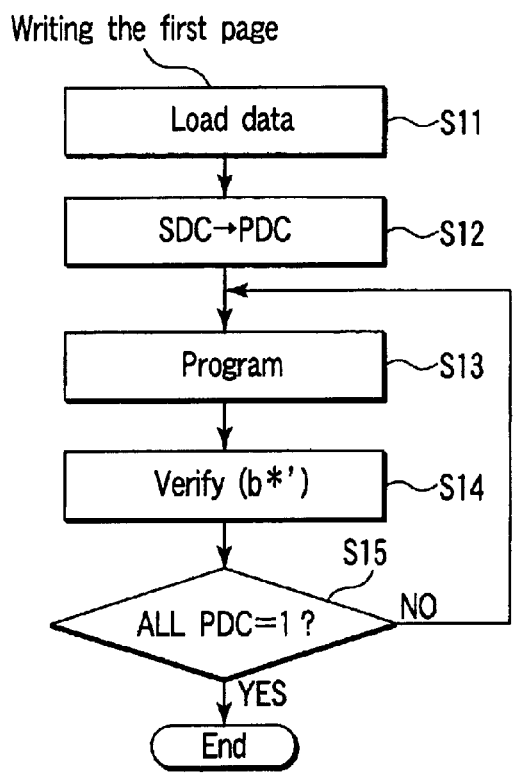
FIG. 8 is a flowchart for the operation of programming a first page.

FIG. 8 shows a flowchart for programming the first page. In a program operation, an address is first specified to select two pages (one sector) shown in FIG. 3. In the memory, of the two pages, a program operation can be carried out only in this order: the first page, the second page. Therefore, the first page is first selected by an address.

Next, the inputted write data is stored in the SDC (shown in FIG. 6) in each of the data storage circuits 10 (ST1). After a write command is inputted, the data in the SDCs in all of the data storage circuits 10 are transferred to the PDC (ST2). That is, signals BLC1, BLC2 are set to a specific voltage, for example, Vdd+Vth (Vdd: power supply voltage (e.g., 3V or 1.8V, to which they are not restricted, Vth: the threshold voltage of an n-channel MOS transistor), thereby turning on the transistors 61$h$, 61$g$. Then, the data on node N2$a$ is transferred via the transistors 61$g$, 61$h$ to the PDC. Therefore, when data "1" (to do no writing) is inputted from the outside world, node N1$a$ of the PDC goes high. When data "0" (to do writing) is inputted, node N1$a$ of the PDC goes low. Hereinafter, let the data in the PDC be the potential of node N1$a$ and the data in the SDC be the potential of node N2$a$.

In programming the first page, no data is written into the flag cell. As a result, the PDC in the flag data storage circuit 10$a$ has data "1" (program operation) (ST13).

The potentials of signal BLC1, signal BLCLAMP, and signal BLSo or BLSe shown in FIG. 6 are set to Vd+Vth. Then, the transistors 61$h$, 61$t$, and 61$v$ or 61$w$ turn on, causing the data held in the PDC to be supplied to the bit line. When data "1" (to do no writing) has been stored in the PDC, the bit line is at Vdd. When data "0" (to do writing), the bit line is at Vss (the ground potential). The cells in the unselected page (with its bit line unselected) connected to the selected word line must not be written into. For this reason, Vdd is also supplied to the bit lines connected to these cells as when data "1" has been stored. Here, Vdd is applied to the select line SG1 of the selected block, potential VPGM (20V) is applied to the selected word line, and potential VPASS (10V) is applied to the unselected word lines. Then, when the bit line is at Vss, writing is effected because the channel of the cell is at Vss and the word line is at VPGM. On the other hand, when the bit line is at Vdd, the channel of the cell is not at Vss. Raising the VPGM causes VPGM/2 to be produced by coupling. This prevents the cell from being programmed.

When data "0" is written, the data in the memory cell is made "2" as shown in FIG. 1. When data "1" is written, the data in the memory cell is kept at "0" (first page verify) (S14).

In a program verify operation, a potential a little higher than the potential in a read operation is applied to the selected word line. Hereinafter, a potential marked with "'" is assumed to indicate a verify potential a little higher than the read potential.

In the first page verify operation, verifying is done by applying a potential of "b*'" lower than the potential "b'" of the word line (shown in FIG. 1C) in an actual verify operation as shown in FIG. 1A. Hereinafter, "*" indicates a potential lower than the actual value and "*'" indicates a verify potential lower than the verify potential lower than the actual value.

First, a read potential Vread is applied to the unselected word lines and select line SG1 in the selected block. For example, Vdd+Vth is supplied as signal BLPRE to the data storage circuit 10, a specific voltage, for example, 1V+Vth, is supplied as BLCLAMP, and signal VPRE is set to Vdd. Under these condition, the bit line is precharged at 1V.

Next, select line SG2 on the source side of the cell is made high. The cells whose threshold voltage is higher than the potential "b*'" turn off. As a result, the bit line remains high. The cells whose threshold voltage is lower than the potential "b*'" turn on. As a result, the bit line is at Vss. While the bit line is being discharged, the TDC is set to VSS, with VPRE equal to VSS and BLPRE at the high level. Thereafter, signal REG is set to Vdd+Vth and VREG is set to Vdd, thereby turning on the transistor 61$q$, which causes the data in the DDC to the TDC.

Next, signal DTG is set to Vdd+Vth, thereby turning on the transistor 61$s$ temporarily, which causes the data in the PDC to the DDC. That is, the transferred data is held as the gate potential of the transistor 61$r$.

Thereafter, signal BLC1 is set to, for example, Vdd+Vth, thereby turning on the transistor 61$h$, which causes the data in the TDC to the PDC.

Next, signal BLPRE is set to a specific voltage, for example, Vdd+Vth, thereby meeting the equation VPRE= Vdd, which precharges node N3 of the TDC at Vdd. Thereafter, signal BLCLAMP is set to, for example, 0.9V+

Vth, thereby turning on the transistor 61t. When the bit line is at the low level, node N3 of the TDC is at the low level. When the bit line is at the high level, node N3 of the TDC is at the high level.

Here, when writing is done, the low level is stored in the DDC of FIG. 6. When no writing is done, the high level is stored in the DDC. Therefore, with signal VREG at Vdd and signal REG at the high level, node N3 of the TDC is forced to be high only when no writing is done. After this operation, the data in the PDC is moved to the DDC and the potential of the TDC is transferred to the PDC. The high level signal is latched in the PDC only when the cell is not written into and when data "2" has been written into the cell and the threshold voltage of the cell has reached the verify potential "b*". The low level signal is latched in the PDC only when the threshold voltage of the cell has not reached "b*".

When the PDC is at the low level, the write operation is carried out again and the program operation and verify operation are repeated until the data in all of the data storage circuits 10 have become high (S15 to S13). The above operations are identical with those in the case of two-valued data.

(Adjacent Cell Program)

As shown in FIG. 7, after one bit of data has been written into the first page of memory cell 1, the first page of memory cell 2 adjacent to memory cell 1 in the direction of word is written into, the first page of memory cell 3 adjacent to memory cell 1 in the direction of bit is written into, and the first page of memory cell 4 adjacent to memory cell 1 in a diagonal direction is written into in that order. After these write operations have been carried out, the threshold voltage of memory cell 1 may rise due to the FG-FG capacitance, depending on the written data. As a result, the distribution of the threshold voltages of data "0" and data "2" in memory cell 1 expands toward higher potentials as shown in FIG. 1B.

Thereafter, in the fifth write operation, one bit of data is written into the second page of memory cell 1.

(Second Page Program)

Figure 9:
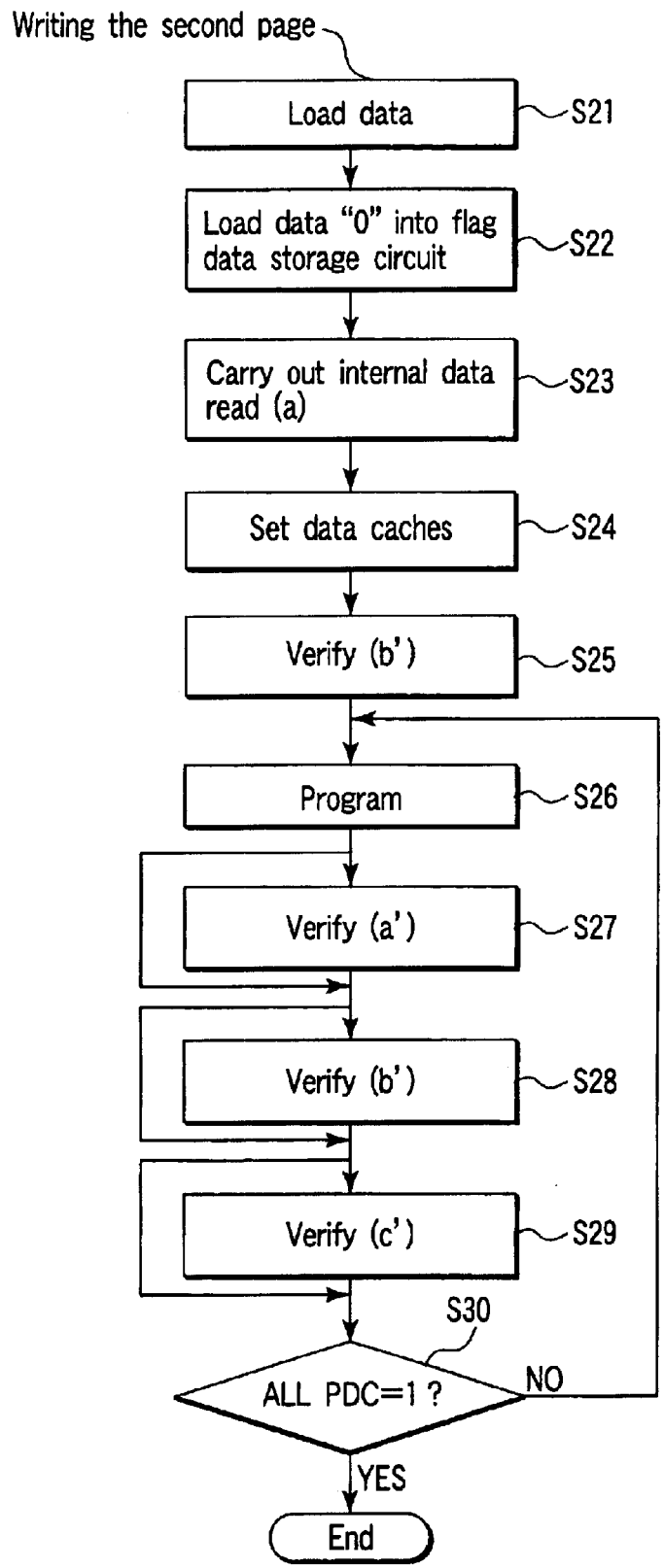
FIG. 9 is a flowchart for the operation of programming a second page.

FIG. 9 is a flowchart for the operation of programming (or writing data into) the second page. In the second page programming operation, too, two pages shown in FIG. 3 are selected.

Next, the inputted write data is stored in the SDC in each of all the data storage circuits (S21). When data "1" (to do no writing) is inputted, node N2a of the SDC of the data storage circuit 10 goes high. When data "0" (to do writing) is inputted, node N2a of the SDC goes low.

Thereafter, when a write command is inputted, data "0" is inputted to the SDC in the flag cell data storage circuit 10a to write data into the flag cell, because the second page is to be programmed (S22). As described earlier, more than one flag cell may be provided to increase the reliability. In this case, data "0" is inputted to the flag cells of the second page.

In programming the second page, when the data in the memory cell is "0" and the input data is "1", the data in the memory cell is kept at "0". When the input data is "0", the data in the memory cell is kept at "1".

When the data in the memory cell is "2" and the input data is "0", the data in the memory cell is kept at "2". However, after the first page is written into, the verify potential "b*" lower than the usual value is used in verifying whether the data in the memory cell has reached "2". Therefore, the memory cell is written into until the original verify potential "b" has been reached.

When the data in the memory cell is "2" and the input data is "1", the data in the memory cell is set to "3".

(Internal Data Read)

First, before the cell is written into, an internal read operation is carried out to determine whether the data in the memory cell of the first page is "0" or "2" (S23). An internal data read operation is identical with a read operation. In determining whether the data in an ordinary memory cell is "0" or "2", a read potential of "b" is applied to the selected word line. Since the verify potential is written only to "b*" lower than the ordinary level in the first page programming operation, it may be lower than the potential "b". Therefore, in the internal data read, a read operation is carried out by supplying a potential of "a" to the word line.

Specifically, a potential Vread is applied to the unselected word lines and select line SG1 in the selected block. At the same time, signal VPRE is set to Vdd and signals BLPRE and signal BLCLAMP are set to a specific voltage, for example, 1V+Vth. Under these conditions, the bit line is precharged at Vdd. Thereafter, select line SG2 on the source side of the cell is made high. Since the cells whose threshold voltage is higher than the potential "a" turn off, the bit line remains high. In addition, since the cells whose threshold voltage is lower than the potential "a" turn on, the bit line is discharged and has the ground potential Vss.

Next, signal VPRE of the data storage circuit 10 is set to Vdd and signal BLPRE is set to Vdd+Vth, thereby precharging node N3 of the TDC at Vdd. Thereafter, signal BLCLAMP is set to, for example, 0.9V+Vth. When the bit line is at the low level, node N3 of the TDC is at the low level. When the bit line is at the high level, node N3 of the TDC is at the high level. Thereafter, the potential of the TDC is transferred to the PDC. As a result, when the data in the memory cell is "2", or when a high level signal is latched in the PDC and the data in the memory cell is "0", a low level signal is latched in the PDC. FIG. 10A shows the relationship between the data in the memory cells in the SDC and PDC after a data load operation and an internal read operation.

(Setting Data Caches) (S24)

Thereafter, the data stored in each data cache is manipulated according to the procedure for data cache setting shown in FIGS. 11 and 12.

As a result of such manipulation, the data stored in each data cache is as shown in FIG. 10B.

Specifically, when the data in the memory cell is made "0" (data "1" in the first page and data "1" in the second page), the PDC is set to the high level, the DDC is set to the low level, and the SDC is set to the high level.

When the data in the memory cell is made "1" (data "1" in the first page and data "0" in the second page), the PDC is set to the low level, the DDC is set to the high level, and the SDC is set to the high level.

When the data in the memory cell is made "2" (data "0" in the first page and data "0" in the second page), the PDC is set to the low level, the DDC is set to the high level, and the SDC is set to the low level.

When the data in the memory cell is made "3" (data "0" in the first page and data "1" in the second page), the PDC is set to the low level, the DDC is set to the low level, and the SDC is set to the low level.

(Second Page Verify: Verifies Memory Cell Data "2") (S25)

A cell into which data "2" is to be written is written into with the verify potential "b*" lower than the original verify potential "b" of the first page. Thereafter, the threshold voltage may have risen as a result of the adjacent cells being written into and therefore some cells may have reached the original verify potential "b'". For this reason, data "2" is first verified. In the program verify operation, the potential "b'" a little higher than the read potential "b" is applied to the selected word line.

First, a potential Vread is applied to the unselected word lines and select line SG1 in the selected block. Then, signal BLCLAMP of the data storage circuit 10 of FIG. 6 is set to 1V+Vth and signal REG is set to Vdd+Vth. Under these conditions, the bit line is precharged. When date "0" and data "3" are written into the memory cell, the DDC has been set to the low level as shown in FIG. 10B. As a result, the bit line is prevented from being precharged. When date "1" and data "2" are written into the memory cell, the DDC has been set to the high level. As a result, the bit line is precharged.

Next, select line SG2 on the source side of the NAND cell is made high. The cells whose threshold voltage is higher than the potential "b'" turn off. As a result, the bit line remains high. The cells whose threshold voltage is lower than the potential "b'" turn on. As a result, the bit line is at Vss. While the bit line is being discharged, node N3 of the TDC is set to Vss temporarily. Thereafter, signal REG is made high, thereby turning on the transistor 61$q$, which causes the data in the DDC to be transferred to the TDC.

Next, signal DTG is set to Vdd+Vth, thereby turning on the transistor 61$s$ temporarily, which causes the data in the PDC to be transferred to the DDC. Thereafter, the data in the TDC is moved to the PDC.

Next, signal VPRE is set to Vdd and signal BLPRE is set to Vdd+Vth, thereby precharging node N3 of the TDC at Vdd. Thereafter, signal BLCAMP is set to 0.9V+Vth, thereby turning on the transistor 61$t$. When the bit line is at the low level, node N3 of the TDC is at the low level. When the bit line is at the high level, node N3 of the TDC is at the high level.

Here, when writing is done, the low level signal is stored in the DDC. When writing is not done, the high level is stored in the DDC. Therefore, with signal VREG at Vdd and signal REG at Vdd+Vth, node N3 of the TDC is forced to be high only when no writing is done.

Thereafter, the data in the PDC is moved to the DDC and the potential of the TDC is read into the PDC. The high level signal is latched in the PDC only when no writing is done, and when data "2" has been written into the cell and the threshold voltage of the cell has reached the verify potential "b'". The low level signal is latched in the PDC only when the threshold voltage of the cell has not reached "b'" and when data "1" and data "3" have been written in the memory cell.

(Program Operation) (S26)

A program operation is identical with the first page program operation. When data "1" has been stored in the PDC, no writing is done. When data "0" has been stored in the PDC, writing is done.

(Second Page Verity: Verifies Memory Cell Data "1") (S27)

In the program verify operation, a potential of "a'" a little higher than the read potential "a" is applied to the selected word line.

First, a read potential Vread is applied to the unselected word lines and select line SG1 in the selected block. Signal BLCLAMP of the data storage circuit 10 is set to 1V+Vth and BLC2 is set to Vdd+Vth. Under these conditions, the bit line is precharged. When data "2" and data "3" are written into the memory cell, the data stored in the SDC is "0". As a result, the bit line is prevented from being precharged. Only when data "0" and data "1" are written into the memory cell, the bit line is precharged.

Next, select line SG2 on the source side of the cell is made high. Since the cells whose threshold voltage is higher than the potential "a'" turn off, the bit line remains high. In addition, since the cells whose threshold voltage is lower than the potential "a'" turn on, the bit line is at Vss. While the bit line is being discharged, node N3 of the TDC is set to Vss temporarily and signal REG is made high, thereby turning on the transistor 61$q$, which causes the data in the DDC to be transferred to the TDC.

Next, signal DTG is made high, thereby turning on the transistor 61$s$ temporarily, which causes the data in the PDC to be transferred the DDC. Thereafter, the data in the TDC is transferred to the PDC. Next, signal BLPRE of the data storage circuit is set to the voltage Vdd+Vth, thereby turning on the transistor 61$u$, which precharges node N3 of the TDC at Vdd. Thereafter, signal BLCAMP is set to 0.9V+Vth, thereby turning on the transistor 61$t$. Then, when the bit line is at the low level, node N3 of the TDC is at the low level. When the bit line is at the high level, node N3 of the TDC is at the high level.

Here, when writing is done, the low level has been stored in the DDC. When writing is not done, the high level has been stored in the DDC. Therefore, with signal VREG at Vdd and signal REG at the high level, node N3 of the TDC is forced to be high only when no writing is done. After this operation, the data in the PDC is transferred to the DDC and the potential of the TDC is read into the PDC. The high level is latched in the PDC only when the cell is not written into and when data "1" has been written into the cell and the threshold voltage of the cell has reached the verify potential "a'". The low level is latched in the PDC only when the threshold voltage of the cell has not reached "a'" and when data 37 2" and data "3" have been written into the memory cell.

(Second Page Verify: Verifies Memory Cell Data "2") (S28)

Like the verification of memory cell data "2" before programming, memory cell data "2" is verified.

(Second Page Verify: Verifies Memory Cell Data "3") (S29)

In this program verify operation, a potential of "c'" a little higher than the read potential "c" is applied to the selected word line as shown in FIG. 1C. In this state, a read potential Vread is first applied to the unselected word lines and select line SG1 in the selected block. Signal BLCLAMP is set to 1V+Vth and signal BLPRE is set to Vdd+Vth, thereby turning on transistors 61$t$, 61$u$, which precharges the bit line.

Next, select line SG2 on the source side of the cell is made high. Since the cells whose threshold voltage is higher than the potential "c'" turn off, the bit line remains high. In addition, since the cells whose threshold voltage is lower than the potential "c'" turn on, the bit line is at Vss. While the bit line is being discharged, node N3 of the TDC is set to Vss and signal REG is made high, thereby turning on the transistor 61$q$, which causes the data in the DDC to be transferred to the TDC.

Next, signal DTG is made high, thereby turning on the transistor 61$s$, which causes the data in the PDC to be transferred the DDC. Thereafter, the data in the TDC is transferred to the PDC. Next, signal BLPRE is set to the voltage Vdd+Vth, thereby turning on the transistor 61$u$, which precharges node N3 of the TDC at Vdd. Thereafter, signal BLCAMP is set to 0.9V+Vth, thereby turning on the transistor 61t. Then, when the bit line is at the low level, node N3 of the TDC is at the low level. When the bit line is at the high level, node N3 of the TDC is at the high level.

Here, when writing is done, the low level has been stored in the DDC. When writing is not done, the high level has been stored in the DDC. Therefore, signal VREG is set to Vdd and signal REG is set to the high level, thereby turning on the transistor 61q. Then, node N3 of the TDC is forced to be high only when no writing is done. After this operation, the data in the PDC is transferred to the DDC and the potential of the TDC is read into the PDC. The high level is latched in the PDC only when the cell is not written into and when data "3" has been written into the memory cell and the threshold voltage of the cell has reached the verify potential "c'". The low level is latched in the PDC only when the threshold voltage of the cell has not reached "c'" and when data "1" and data "2" have been written into the memory cell.

When the PDC is at the low level, the write operation is carried out again and the program operation and verify operation are repeated until the data in the PDC of all of the data storage circuits have become high (S30).

In the first embodiment, after the first programming, three verify operations have been carried out. In the initial program loop, the threshold voltage does not rise. Therefore, the verification of memory cell data "3" or the verification of memory cell data "3" and the verification of memory cell data "2" may be omitted. In a program loop close to the end, the writing of memory cell data "1" or the writing of memory cell data "2" and memory cell data "1" has been completed. Therefore, these verify operations may be omitted. If the verification of memory cell data "1" is not needed, it is not necessary for the SDC to store the data. Thus, the data for writing the next data may be read from the outside world.

Furthermore, no data has been written into the flag cell on the first page. Only on the second page, the data has been written into the flag cell. As a result, the data in the flag cell has been "1".

(First Page Read)

Figure 13:
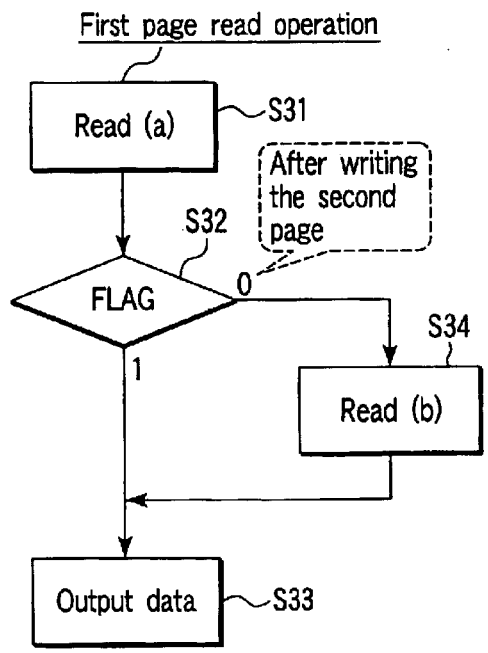
FIG. 13 is a flowchart for the operation of reading the first page.

FIG. 13 is a flowchart for the operation of reading the first page. First, an address is specified to select two pages shown in FIG. 3. As shown in FIGS. 1B and 1C, the distribution of the threshold voltage changes before and after the writing of the second page. Therefore, after the potential of the word line is set to "a", a read operation is carried out and it is determined whether the data in the flag cell is "0" or "1" (S31, S32). In this determination, if more than one flag cell is used, whether the data is "0" or "1" is determined by a majority decision.

When the data read from the flag cell is "1" (or the data in the memory cell is "0"), the writing of the second page has not been carried out. As a result, the distribution of the threshold voltage of the cell is as shown in FIG. 1A or 1B. To determine the data in such a cell, a read operation has to be carried out with the potential of the word line at "a". In step S31, however, the result of the read operation with the word line potential "a" has been already read into the data storage circuit. Therefore, the data stored in the data storage circuit is outputted (S33).

On the other hand, when the data read from the flag cell is "0" (or the data in the memory cell is "1"), the writing of the second page has been carried out. As a result, the distribution of the threshold voltage of the cell is as shown in FIG. 1C. To determine the data in such a cell, a read operation has to be carried out with the potential of the word line at "b". Thus, a read operation is carried out with the word line potential at "b" (S34). Thereafter, the data read into the data storage circuit is outputted (S33).

(Read Operation: First Page Read)

As described above, in the first page read operation, a read operation is carried out, with the read potential "a" or "b" being applied to the selected word line.

First, a read potential Vread is supplied to the unselected word lines and select line SG1 in the selected block. Signal BLPRE of the data storage circuit of FIG. 6 is set to 1V+Vth and signal BLCLAMP is set to Vdd+Vth. Under these conditions, the bit line is precharged. Thereafter, select line SG2 on the source side of the cell is made high. Since the cells whose threshold voltage is higher than the potential "a" or "b" turn off, the bit line remains high. In addition, since the cells whose threshold voltage is lower than the potential "a" or "b" turn on, the bit line is at Vss.

Next, signal BLPRE of the data storage circuit is set to the voltage Vdd+Vth, thereby turning on the transistor 61u, which precharges node N3 of the TDC at Vdd. Thereafter, signal BLCAMP is set to 0.9V+Vth, thereby turning on the transistor 61t. Then, when the bit line is at the low level, node N3 of the TDC is at the low level. When the bit line is at the high level, node N3 of the TDC is at the high level. Thereafter, the data in the PDC is transferred to the SDC.

(Second Page Read)

Figure 14:
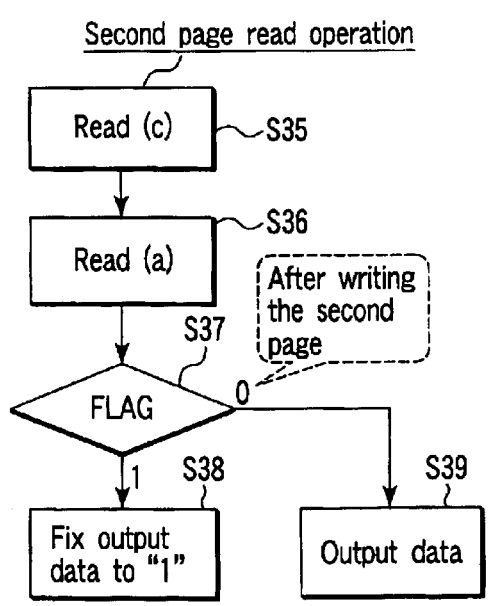
FIG. 14 is a flowchart for the operation of reading the second page.

FIG. 14 is a flowchart for the operation of reading the second page. In a second page read operation, an address is first specified to select two pages shown in FIG. 3. As shown in FIGS. 1B and 1C, the distribution of the threshold voltage changes before and after the writing of the second page. After the writing of the second page, the distribution is as shown in FIG. 1C. Therefore, a read operation is first carried out, with the potential of the word line set at "c" (S35). Thereafter, the word line potential is set to "a" and then a read operation is carried out (S36). When the threshold voltage of the cell is lower than "a" or higher than the word line potential "c", the data is determined to be "1". When the threshold voltage of the cell is higher than "a" or lower than the word line potential "c", the data is determined to be "0". Before the writing of the second page, the data on the second page should be outputted as "1". However, the threshold voltage distribution is as shown in FIG. 1A. As a result, when the same read operation as after the writing of the second page is carried out, the output data might be "0". Therefore, it is determined whether the data in the flag cell is "b" or "1" (S37). As a result, when the data in the flag cell is "1" and the writing of the second page has not been carried out, the output data is fixed to "1" (S38). To output "1", signal PRST of the data storage circuit is made high and "1" is set in the SDC. Alternatively, the data input/output buffer shown in FIG. 2 is caused to output only data "1". In addition, when the data in the flag cell is "0", the read-out data is outputted (S39).

Figure 15:
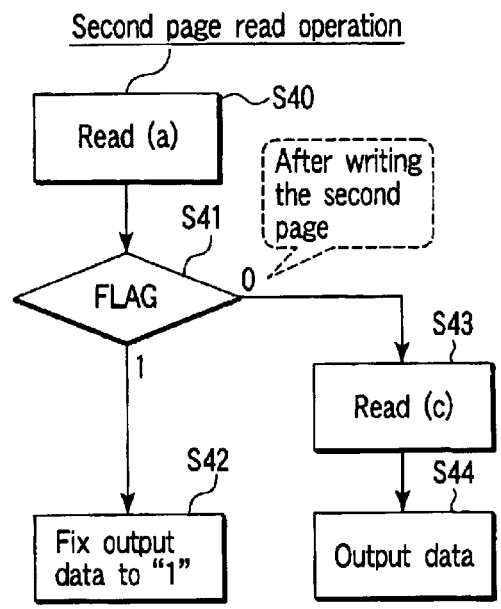
FIG. 15 is a flowchart for a modification of the operation of reading the second page.

FIG. 15 shows a modification of the second page read operation. In this case, the potential of the word line is set to "a" and the data in the flag cell is read. Then, the data in the flag cell is determined (S40, S41). When the data in the flag cell is "1", the writing of the second page has not been carried out. Thus, the output data is fixed to "1" (S42). When the data in the flag cell is "0", the writing of the second page has been carried out. Thus, the potential of the word line is set to "c" and a read operation is carried out. Then, the read-out data is outputted (S43, S44). With this configuration, too, the read operation of the second page can be carried out.

However, in the first embodiment, the potential of the word line is first set to "c" and a read operation is carried out as shown in FIG. 14. Thereafter, the potential of the word line is set to "a" and a read operation is carried out. When the data in the flag cell is "0", the data read into the data storage circuit is outputted. When the data in the flag cell is "1", the writing of the second page has not been carried out. Thus, when the data is outputted to the outside world, the data in the data storage circuit is not outputted, but data "1" is always outputted.

Specifically, in reading the second page, the following operation will be carried out.

(Read Operation: a First Second Page Read)

In a first read operation of the second page, the read potential "c" is supplied to the selected word line and a read operation is carried out (S35). The read operation, which is identical with the above-described first page read, stores the read-out cell data into the PDC.

(Read Operation: a Second Page Read Operation)

In a second read operation of the second page, the read potential "a" is supplied to the selected word line and a read operation is carried out (S36).

First, a read potential Vread is supplied to the unselected word lines and select line SG1 in the selected block. In this state, signal BLPRE of the data storage circuit and signal BLCLAMP are set to 1V+Vth. Under these conditions, the bit line is precharged. Thereafter, select line SG2 on the source side of the cell is made high. Since the cells whose threshold voltage is higher than the potential "a" turn off, the bit line remains high. In addition, since the cells whose threshold voltage is lower than the potential "a" turn on, the bit line is at Vss.

Next, signal BLPRE of the data storage circuit is set to the voltage Vdd+Vth, thereby precharging node N3 of the TDC at Vdd. Thereafter, signal BLCAMP is set to Vdd+Vth, thereby turning on the transistor 61t. Then, when the bit line is at the low level, node N3 of the TDC is at the low level. When the bit line is at the high level, node N3 of the TDC is at the high level. Thereafter, the DTG is made high, the REG is made high, and the VREG is made low. Then, only when the PDC is high, node N3 of the TDC is at the low level. After this operation, the data in the PDC is transferred to the SDC. As a result, when the threshold voltage of the cell is lower than the potential "a" or higher than the potential "c", the output data becomes "1". When the threshold voltage of the cell is higher than the potential "a" or lower than the potential "c", the output data becomes "0".

(Erase)

In an erase operation, an address is first specified to select the block enclosed by a broken line in FIG. 3. After the erase operation, the data in the memory cell becomes "0". Even when a read operation is carried out on any one of the first, second, and third pages, data "1" is outputted.

In the first embodiment, the data on the first page is written into the memory cell with a potential lower than the original threshold voltage. Before the data on the second page is written, the data on the first page is written into the adjacent memory cells. After the adjacent cells are written into, the data on the second page is written into the memory cell, thereby setting the original threshold voltage corresponding to the stored data. Because the data on the first page is written into the memory cell, taking into the effect of the FG-FG capacitance of the adjacent memory cells, it is possible to set the threshold voltage corresponding to the mutivalued data accurately.

Furthermore, when the data on the second page is written, or when the data is written into the flag cell and the data is read from each page, the output data is controlled according to the data stored in the flag cell. Therefore, it is possible to output the data on each page reliably.

(Second Embodiment)

Figure 16:
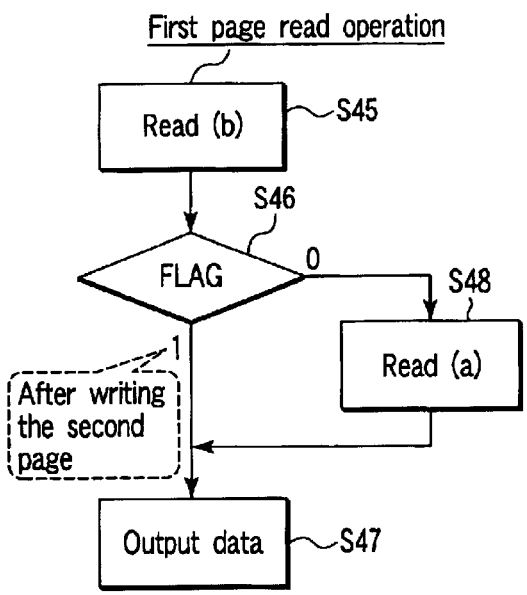
FIG. 16 is a flowchart for the operation of reading the first page according to a second embodiment of the present invention.

FIG. 16 shows a second embodiment of the present invention obtained by modifying the first embodiment. In the first embodiment, when the second page is written, the memory cell data in the flag cell is changed from "0" to "1". However, the memory cell data in the flag cell may be changed from "0" to "2". With this configuration, the operation of reading the first page can be modified as shown in FIG. 16.

First, the potential of the word line is set to "b" and a read operation is carried out to determine the data in the flag cell (S45, S46). When data has been written in the flag cell, the data stored in the data storage circuit is outputted as it is (S47). When no data has been written in the flag cell, the potential of the word line is set to "a" and a read operation is carried out (S48). This causes the read-out data to be outputted (S47).

With the second embodiment, when the second page is written, memory cell data "2" is written into the flag cell. This enables the data to be read out in one cycle in reading the data on the first page in the memory cell selected together with the flag cell into which memory cell data "2" has been written. Therefore, the number of reads can be decreased, which enables a high-speed reading.

(Third Embodiment)

Figure 17:
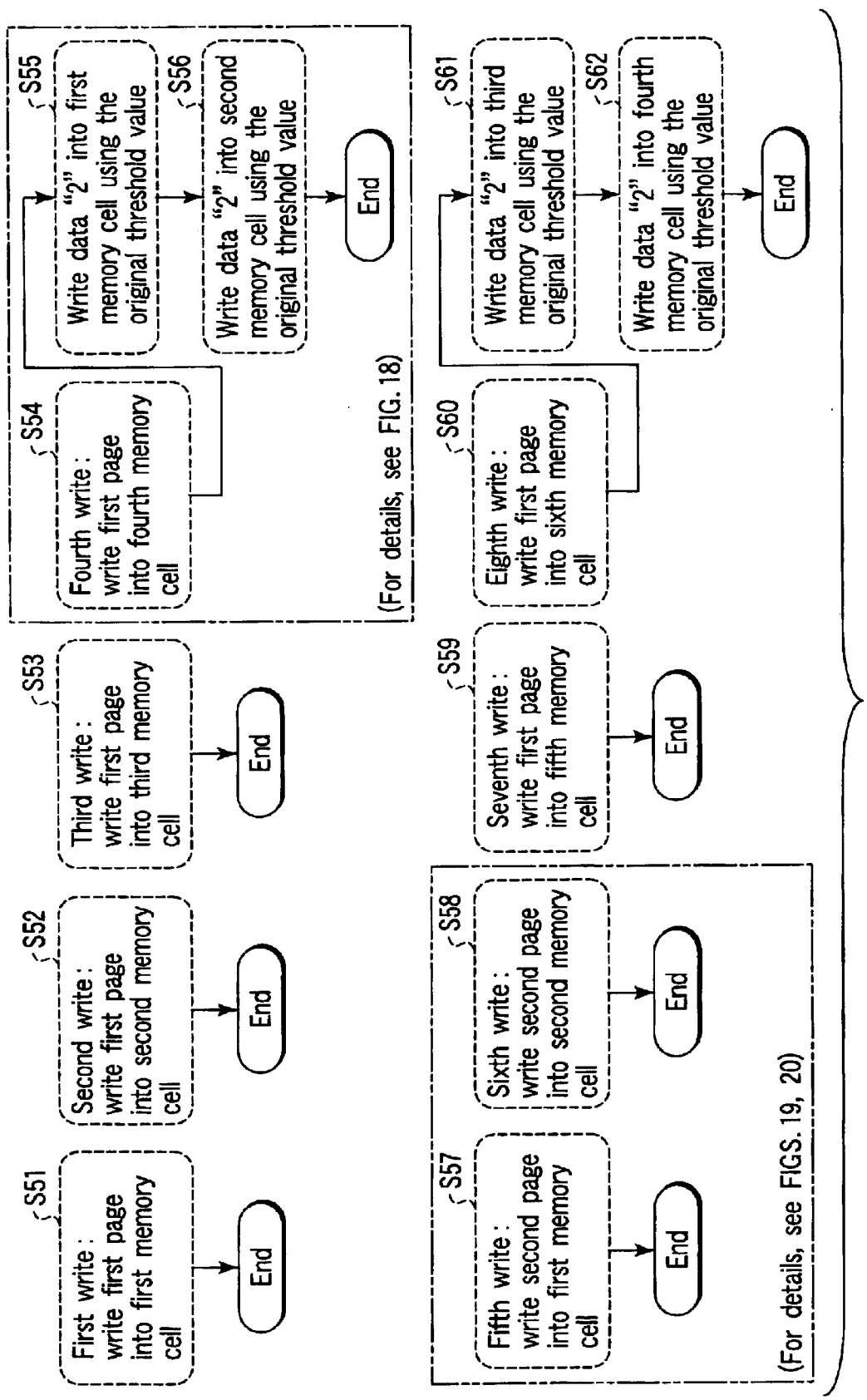
FIG. 17 is a diagram to help explain program operations according to a third embodiment of the present invention.

FIG. 17 is a diagram to help explain program operations according to a third embodiment of the present invention.

In the first and second embodiments, data "1", data "2", and data "3" are written simultaneously into a memory cell in writing the second page. In the third embodiment, however, only data "2" is written into the memory cell first. After the writing is completed, data "1" and data "3" are written simultaneously into the memory cell. A write operation in the third embodiment is executed as follows.

A first write: the first page is written into a first memory cell (S51).

A second write: the first page is written into a second memory cell (S52).

A third write: the first page is written into a third memory cell (S53).

A fourth write: the first page is written into a fourth memory cell (S54). Thereafter, before the data for a fifth write is loaded, data "2" is written into the first memory cell and second memory cell with the original threshold voltage in that order (S55, S56).

A fifth write: the second page is written into the first memory cell (S57).

A sixth write: the second page is written into the second memory cell (S58).

A seventh write: the first page is written into a fifth memory cell (S59).

An eighth write: the first page is written into a sixth memory cell (S60). Thereafter, before the data for a ninth write is loaded, data "2" is written into the third memory cell and fourth memory cell with the original threshold voltage in that order (S61, S62).

Figure 18:
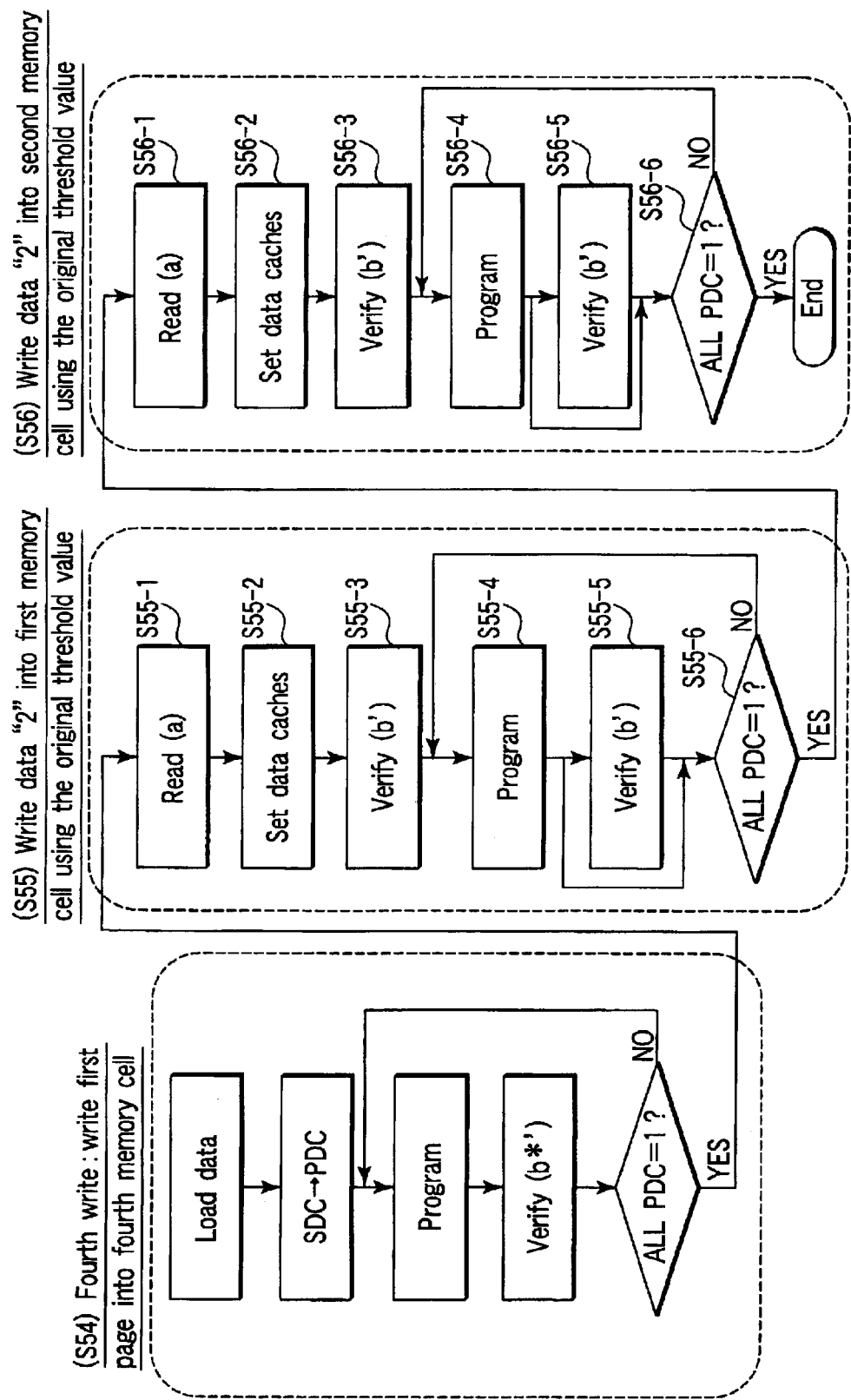
FIG. 18 is a concrete flowchart for a fourth write operation in FIG. 17.
Figure 19:
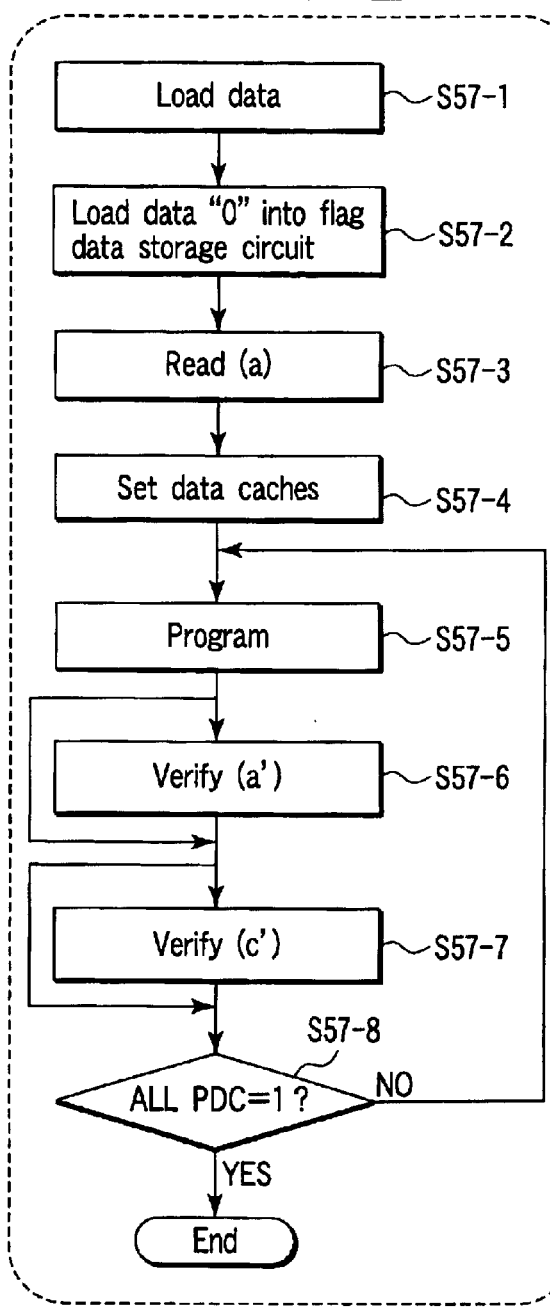
FIG. 19 is a concrete flowchart for a fifth write operation in FIG. 17.
Figure 20:
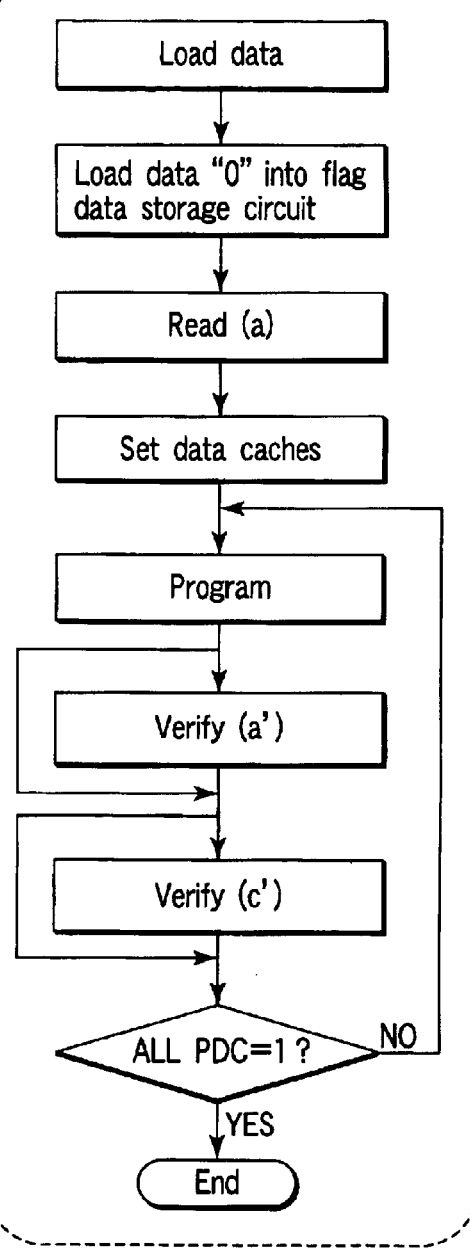
FIG. 20 is a concrete flowchart for a sixth write operation in FIG. 17.

FIG. 18 is a concrete flowchart for the fourth write operation. FIG. 19 is a concrete flowchart for the fifth write operation. FIG. 20 is a concrete flowchart for the sixth write operation.

In FIG. 18, the operation of writing the first page into the fourth memory cell is the same as the operation shown in FIG. 8. Thereafter, data "2" is written into the first memory cell with the original threshold voltage. Specifically, the voltage of the word line is set to "a" and the data is read from the memory cell (S55-1). According to the read-out data, the TDC, DDC, and PDC are set (S55-2). Thereafter, the original threshold voltage "b'" of data "2" is supplied to the word line for verification (S55-3). Then, a program operation is carried out, thereby changing the threshold voltage of the memory cell (S55-4). Then, the threshold voltage of the memory cell is verified with the threshold voltage "b'" (S55-5). The program operation and verify operation are repeated until all of the PDCs have taken the value of "1" (S55-6 to S55-4).

Thereafter, data "2" is written into the second memory cell with the original threshold voltage in the same manner as writing the data into the first memory (S56-1 to S56-6).

The operation of writing the second page into the first memory cell in FIG. 19 (S57-1 to S57-8) differs from the operation of writing the second page in the first embodiment of FIG. 9 in the following point. In FIG. 9, after the data cache setting, the data in the memory cell is verified with the threshold voltage "b'". In contrast, in a write operation shown in FIG. 19, since data "2" has been already written a verify operation with the threshold voltage "b'" is omitted. Therefore, after the data cache setting, the second page is programmed into the first memory (S57-4, S57-5). Even in a verify operation after the program operation, a verify operation with threshold voltage "b'" is omitted. Therefore, only verify operations with the threshold voltages "a'" and "c'" are carried out (S57-6, S57-7).

Because the operation of writing the second page into the second memory cell shown in FIG. 20 is the same as writing the second page into the first memory cell shown in FIG. 19, its explanation is omitted.

In the third embodiment, after the first page is written, data "2" is written with original threshold voltage before the second page is written. Consequently, although the programming time for the second page is longer than that for the first page in the first embodiment, the programming time for the first page can be made almost equal to that for the second page in the third embodiment.

(Fourth Embodiment)

Figure 21:
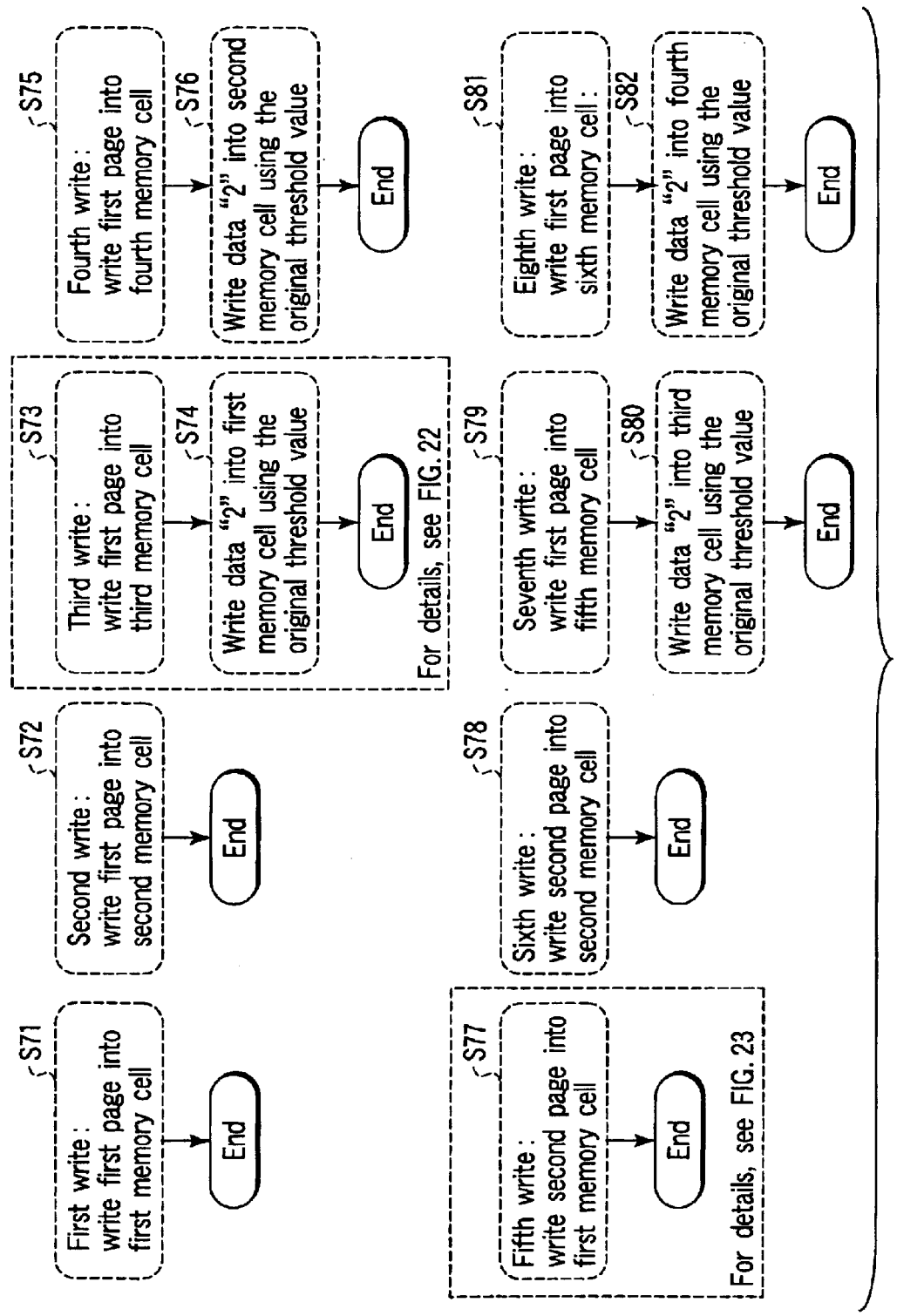
FIG. 21 is a diagram to help explain write operations in a fourth embodiment of the present invention.

FIGS. 21 and 22 show a fourth embodiment of the present invention obtained by modifying the third embodiment. Write operations in the fourth embodiment are executed as shown in FIG. 21.

A first write: the first page is written into a first memory cell (S71).

A second write: the first page is written into a second memory cell (S72).

A third write: the first page is written into a third memory cell (S73). Thereafter, data "2" is written into the first memory with the original threshold voltage (S74).

A fourth write: the first page is written into a fourth memory cell (S75). Thereafter, data "2" is written into the second memory with the original threshold voltage (S76).

A fifth write: the second page is written into the first memory cell (S77).

A sixth write: the second page is written into the second memory cell (S78).

A seventh write: the first page is written into a fifth memory cell (S79). Thereafter, data "2" is written into the third memory with the original threshold voltage (S80).

An eighth write: the first page is written into a sixth memory cell (S81). Thereafter, data 11211 is written into the fourth memory with the original threshold voltage (S82).

FIG. 22 is a flowchart to help explain the third write operation concretely.

Because the operation of writing the first page into the third memory cell (S73) and the operation of writing data "2" into the first memory cell with the original threshold voltage (S74) shown in FIG. 22 are the same as the operation of writing the first page into the fourth memory cell (S54) and the operation of writing data "2" into the first memory cell with the original threshold voltage (S55) shown in FIG. 18, explanation of them is omitted.

Furthermore, the operation of writing the second page into the first memory cell (S77) is the same as the writing operation shown in FIG. 19.

In the fourth embodiment, after the first page is written, data "2" is written with the original threshold voltage before the second page is written. Therefore, like the third embodiment, the fourth embodiment enables the programming time for the first page to be almost equal to that for the second page.

(Fifth Embodiment)

In recent years, a pass write method has been proposed to narrow the distribution of the threshold voltage in a write operation of a mutivalued flash memory that store a plurality of bits.

Figure 23A:
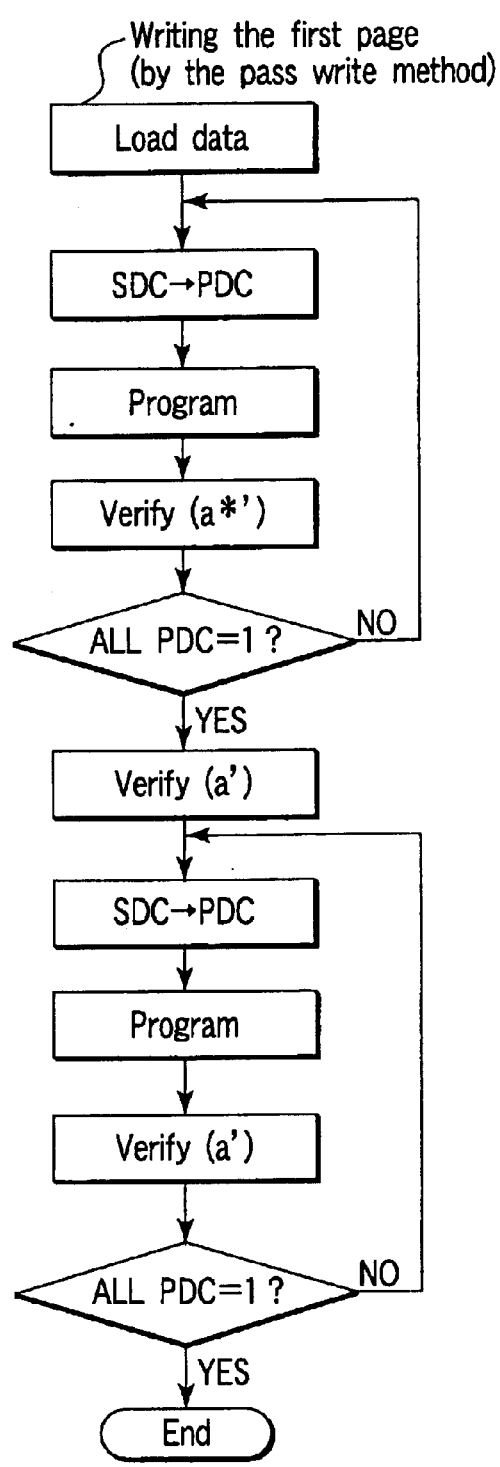
FIGS. 23A and 23B are flowcharts for the sequence of writing data by a conventional pass write method.
Figure 23B:
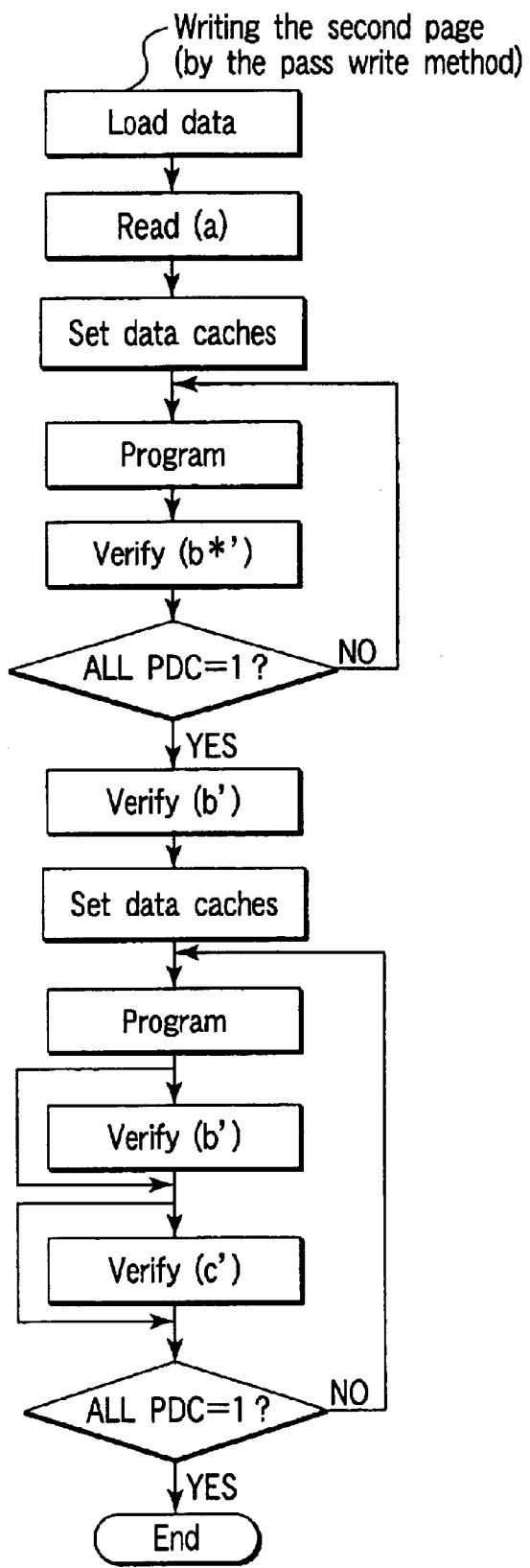

FIG. 23 shows a write sequence in a conventional pass write method.

In a first program sequence of the first page write (see FIG. 23A) and the second page write (see FIG. 23B) by the pass write method, the threshold voltage of the memory cell is set to the verify potentials "a*'" and "b*'" lower than the original threshold voltage and a write and a verify operation for the first page are carried out. After the program verify has passed, the verify potential is set to the original voltages "a'", "b'", and "c'" and a write and a verify operation for the first page are carried out in the second page program sequence of the first page write and the second page write. In the pass write method, a cell once written into is written into again until its threshold voltage has risen a little. The degree of variability of the threshold voltage in rewriting becomes smaller. As a result, the threshold voltage distribution becomes smaller.

Generally, in a NAND flash memory, half of the cells connected to the same word line are written into simultaneously. For this reason, in the first verification of a write verify loop, there are many cells whose threshold voltage is lower and therefore a lot of current flows into the source line, which brings the source line into a floating state. As a result, the threshold voltage of the cell first written into is determined in this state. Thereafter, when another cell has been written into, the potential of the source line returns from the floating state. Consequently, the threshold voltage of the cell first written into apparently gets lower, causing the problem of spreading the threshold voltage distribution. In the pass write method, however, the threshold voltage can be prevented from spreading.

Generally, a write voltage of Vpgm is increased by ΔVpgm each time a program verify operation is carried out. In the pass write method, the write voltage ΔVpgm in a first write is increased in, for example, 0.4V steps. After the first write sequence is completed, the write voltage Vpgm is returned to the initial voltage value. In a second write, too, the write voltage Vpgm is increased by ΔVpgm each time a program verify operation is carried out. The second write voltage, however, is increased by a lower voltage than the first write voltage ΔVpgm, for example, in 0.2V steps. Under these conditions, a write operation is carried out. By setting the write voltage this way, high-speed writing can be done.

In the first to fourth embodiments, when data "2" and data "3" are written into a memory cell, data "2" is written into the memory cell in writing the first page with the threshold voltage "b*'" lower than the original threshold voltage "b'". Thereafter, the second page is written with the threshold voltage "b'" and threshold voltage "c'". Therefore, the pass write is also carried out.

In the conventional pass write method of FIG. 23, there are two sequences in writing the first page: a first write verify for the threshold voltage "a*'" and a second write verify for the threshold voltage "a'". In addition, there are two sequences in writing the second page: a first write verify for the threshold voltage "b*'" and a second write verify for the threshold voltages "a*'" and "c*'".

In the first to fourth embodiments, however, there are only a write verify for the threshold voltage "b*'" in writing the first page and a write verify for the threshold voltages "b'" and "c'" in writing the second page. Therefore, when data "1" is written into a memory cell, the pass write is not carried out. Thus, in the fifth embodiment, the second page is written into using the following algorithm.

Figure 24:
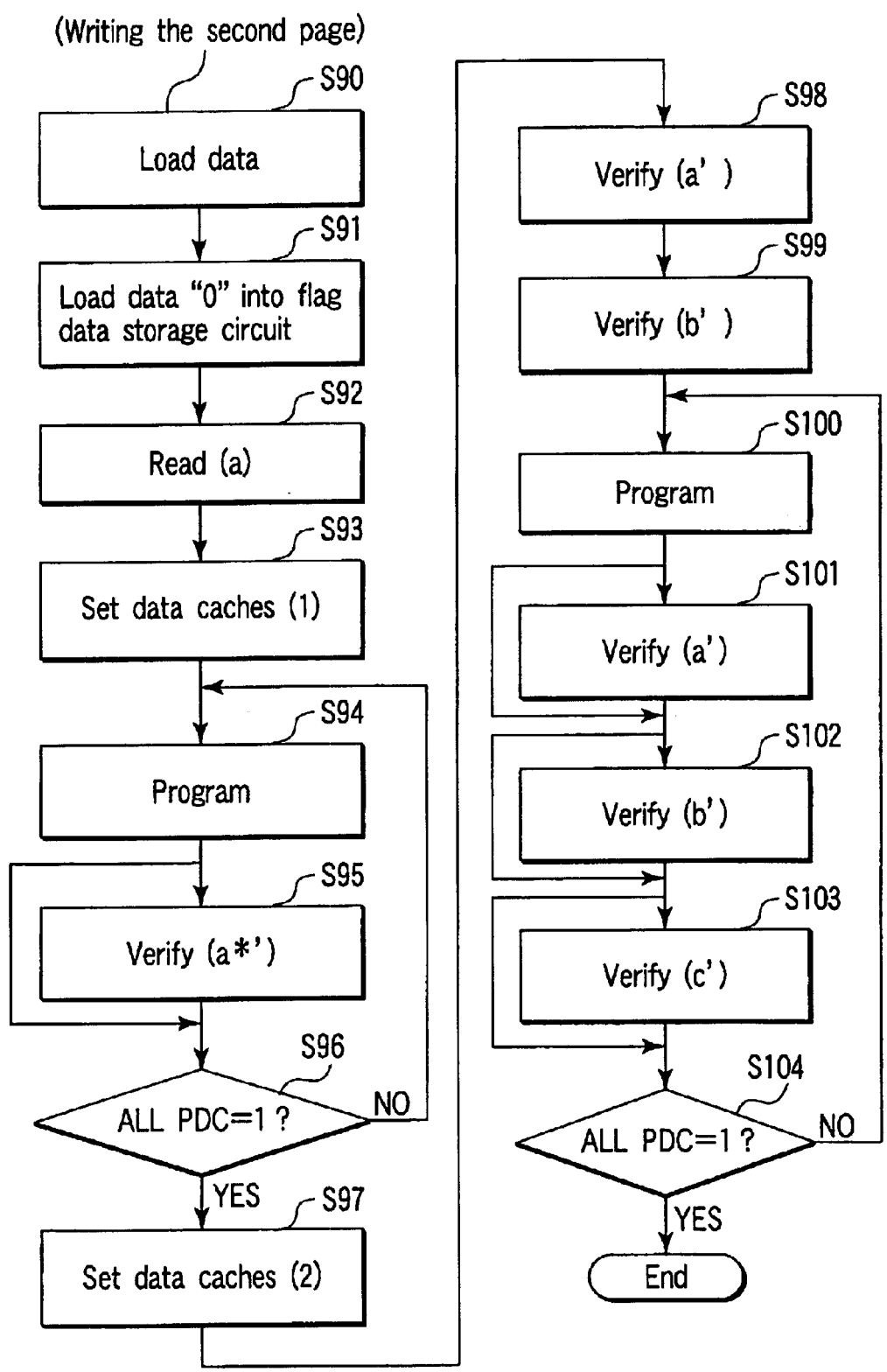
FIG. 24 shows an algorithm for the operation of writing data "1" applied to a fifth embodiment of the present invention.

FIG. 24 shows an algorithm for writing data "1" applied to the fifth embodiment.

First, data caches SDC, DDC, and TDC are set as shown in FIG. 25. In this state, a verify potential of "a*'" lower than the original threshold voltage is set and a write operation is carried out on the basis of the data in the PDC (S90 to S95). The program is verified repeatedly until all of the PDCs have become high (S94 to S96). Thereafter, as shown in FIG. 10B, the data caches are set (S97) and a write operation is carried out to set the verify potential to the original threshold voltage "a'". The second write operation is carried out at the same time writing is done with the threshold voltage "b'" and the threshold voltage "c'". The program is verified repeatedly until all of the PDCs have become high (S98 to S104).

In the fifth embodiment, since the pass write method can be applied even to the writing of memory cell data "1", all of the data can be written by the pass write method.

(Sixth Embodiment)

Figure 26:
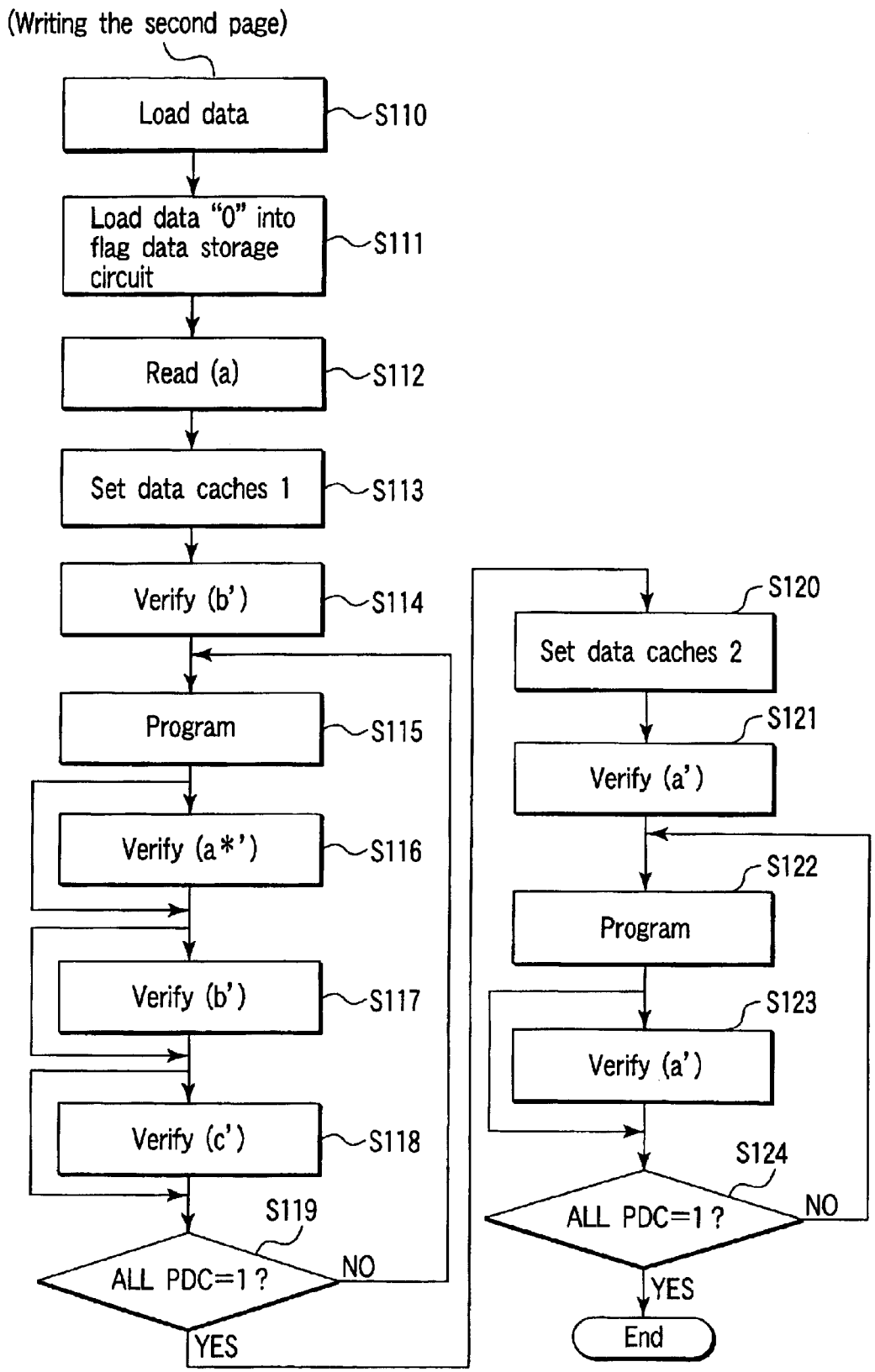
FIG. 26 is a flowchart to help explain the order in which a second page is written into in a sixth embodiment of the present invention.

FIG. 26 shows a sixth embodiment of the present invention obtained by modifying the fifth embodiment. Specifically, In the sixth embodiment, the sequence of writing the second page is changed. As shown in FIG. 27A, after the data caches are set, a write operation is carried out to reach the verify potential "a*'" lower than the original voltage, the threshold voltage "b'", and the threshold voltage "c'". The program and verify operations are repeated until all of the PDCs have become high (S110 to S119). Thereafter, the data in the SDC is inverted as shown in FIG. 27B. Then, the resulting data is transferred to the PDC (S120). Thereafter, the verify potential for the cell with data "1" is set to the original threshold voltage "a'" and writing is done. The program and verify operations are repeated until all of the PDCs have become high (S121 to S124).

Therefore, the sixth embodiment also produces the same effect as that of the fifth embodiment.

(Seventh Embodiment)

Figure 28:
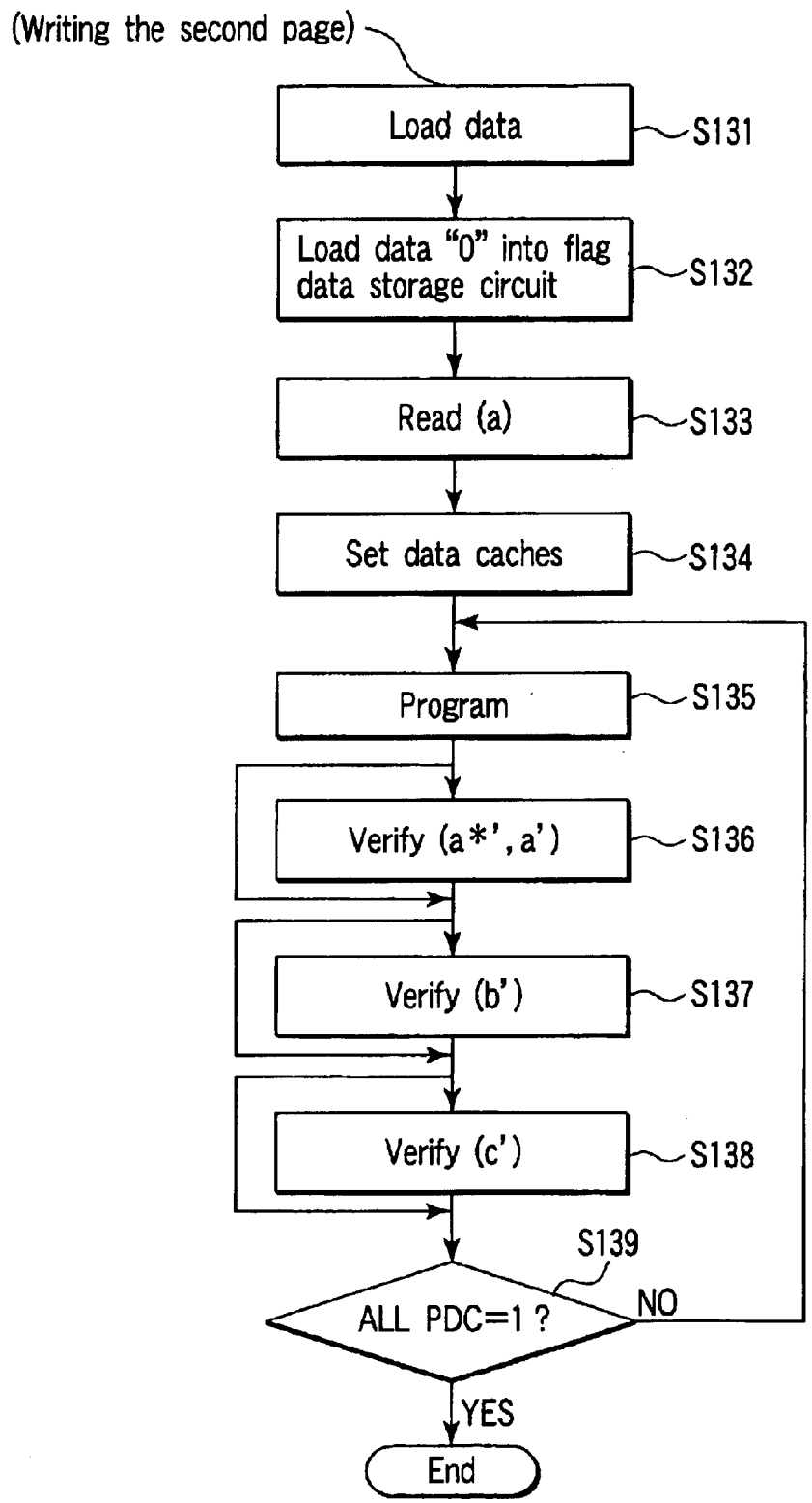
FIG. 28 is a flowchart to help explain the order in which a second page is written into in a seventh embodiment of the present invention.

FIGS. 28 and 29 show a seventh embodiment of the present invention obtained by modifying the fifth embodiment. In the fifth embodiment, writing is done to reach the verify potential "a*'" in writing the second page. Thereafter, a write operation with the verify potential "a'" and write operations with the threshold voltage "b'" and the threshold voltage "c'" are carried out simultaneously.

In the seventh embodiment, however, an intermediate potential is supplied to the bit line in a write operation and data is written into the cells whose threshold voltage has exceeded the verify potential "a*'". By doing this, the degree of variability of the threshold voltage in writing is made smaller, thereby making the threshold voltage distribution smaller.

FIG. 28 shows the sequence of writing in the seventh embodiment. FIGS. 29A to 33B show the workings of the data caches.

(a) The data inputted from the outside world is stored in the SDC and the data read by an internal data read is stored in the PDC (S131 to S134, FIG. 29).

(b) The data caches are set as shown in FIG. 29B.

(c) With VREG=Vdd and REG=Vsg, when DDC=1, the bit line is precharged at Vdd. When DDC is at "0", the bit line is not precharged (FIG. 30A).

(d) With BLC1=intermediate potential+Vth (=2V+Vth) (Vclamp), when the PDC is at "0", the bit line is at Vss. When the PDC has "1" and precharging has been done, the bit line remains unchanged. If it is has not been precharged, the bit line is at an intermediate potential (2V) (FIG. 30B).

Here, with the selected word line at Vpgm and the unselected word line at Vpass, when the bit line is at Vdd, no writing is done. When the bit line is at Vss, writing is done. When the bit line is at an intermediate potential (2V), writing is done a little (S135).

(e) After the write operation is completed, while the word line is setting up, the data in the PDC is transferred to the DDC. Then, the data in the DDC is inverted and the resulting data is transferred to the PDC (see FIG. 30C).

(f) As shown in FIG. 31A, in an operation with the verify potential "a'" (S136), with BLC1 being high (e.g., Vdd+Vth) and BLCLAMP being at a specific potential, for example, 1V+Vth, only when the PDC is at "1" (that is, when data "1" has been written into the memory cell), the bit line is precharged. When the PDC is at "0", the bit line is not precharged (or remains at Vss). Next, the potential of the word line is set to the verify potential "a*'", thereby discharging the bit line. While the bit line is being discharged, the data in the PDC is inverted.

(g) With VPRE=Vdd and BLPRE=Vsg, the TDC is charged at Vdd. Thereafter, signal BLCLAMP is set to 0.9V+Vth, thereby turning on transistor 61t. When the bit line is at Vss, the TDC is at Vss. When the precharge potential is left on the bit line, the TDC is at Vdd. It is when data "1" has been written into the memory cell and the threshold voltage has reached the verify potential "a*'" that the TDC is at Vdd. When data "1" has not been written into the memory cell, the bit line has not been precharged, with the result that the TDC is at Vss. The TDC is also at Vss when data "1" has been written into the memory cell and the threshold voltage has not reached the verify potential "a*'".

Here, with VREG being high and REG being high, when the data in the DDC is at "1", the TDC is forced to be high. Therefore, it is when data "1" has been written into the memory cell and the threshold voltage has reached the verify potential "a*'" or when a write operation has not been selected that the TDC is at Vdd. Thereafter, with DTG=Vsg, the data in the PDC is copied into the DDC. Thereafter, with BLC1=Vsg, the PDC takes in the potential of the TDC (see FIG. 31B).

(h) Next, the potential of the word line is lowered a little to produce the verify potential "a'''", thereby discharging the bit line (see FIG. 32A).

Thereafter, with VPRE=Vdd and BLPRE=Vsg, the TDC is charged again at Vdd. Then, signal BLCLAMP is set to 0.9V+Vth, thereby turning on the transistor 61t. When the bit line is at Vss, the TDC is at Vss. When the precharge potential is left on the bit line, the TDC is at Vdd. It is when data "1" has been written into the memory cell and the verify potential "a'''" has been reached that the TDC is at Vdd. When data "1" has not been written into the memory cell, the bit line has not been precharged. Thus, the TDC is at Vss. The TDC is also at Vss when data "1" has been written into the memory cell and the threshold voltage has not reached the verify potential "a'''".

Here, with VREG being high and REG being high, when the data in the DDC is "1" (or when data "1" has not been written into the memory cell), the TDC is forced to be high. Thus, it is when data "1" has not been written into the memory cell or when data "1" has been written into the memory cell and the threshold voltage has reached the verify potential "a'''" that the TDC is at Vdd.

Thereafter, with DTG=Vsg, the data in the PDC is copied into the DDC. Then, with BLC1=Vsg, the PDC takes in the potential of the TDC.

(i) The data in the DDC is transferred to the PDC. Then, the data in the PDC is transferred to the DDC (see FIG. 32B).

(j) In a memory cell into which data "1" has been written, after all of the writing with the verify potential "a*'" is completed, the data in the PDC becomes "1" (see FIG. 33A).

(k) In a memory cell into which data "1" has been written, after all of the writing with the verify potential "a'''" is completed, all of the data in the DDCs become "1" (see FIG. 33B).

(l) In an operation with the verify potential "b'''" (see FIG. 28, S137), BLC2 is made high (e.g., Vdd+Vth) and a specific potential, for example, 1V+Vth, is supplied as BLCLAMP. Then, only when the SDC is at "1" (that is, when data "1" or data "2" has been written into the memory cell), the bit line is precharged. When the SDC is at "0", the bit line is not precharged (or remains at Vss).

Next, the verify potential "b'''" is supplied to the word line and the bit line is discharged. While the bit line is being discharged, the data in the DDC is transferred to the TDC. Then, the data in the PDC is transferred to the DDC. The data in the TDC is then transferred to the PDC. Thereafter, the TDC is charged at Vdd. Then, a specific potential, for example, 0.9V+Vth, is supplied as BLCLAMP. It is only when data "2" has been written into the memory cell and the threshold voltage has reached the verify potential "b'''" that the TDC becomes high. With VREG being high and REG being at Vsg, when the data in the DDC is at the high level, the TDC is forced to be high. Therefore, it is when data "2" has been written into the memory cell and the threshold voltage has reached the verify potential "b'''" or when a write operation has not been selected that the TDC is at Vdd. Thereafter, with DTG=Vsg, the data in the PDC is copied into the DDC. Then, with BLC1=Vsg, the PDC takes in the potential of the TDC.

(m) In an operation with the verify potential "c'''" (see FIG. 28, S138), BLPRE is made high (e.g., Vdd+Vth) and a specific potential, for example, 1V+Vth, is supplied as BLCLAMP. Under these conditions, the bit line is precharged. Next, the verify potential "c'''" is supplied to the word line and the bit line is discharged. While the bit line is being discharged, the data in the DDC is transferred to the TDC. Then, the data in the PDC is transferred to the DDC. The data in the TDC is then transferred to the PDC. Thereafter, the TDC is charged at Vdd. Then, a specific potential, for example, 0.9V+Vth, is supplied as BLCLAMP. It is only when the threshold voltage of the memory cell has reached the verify potential "c'''" that the TDC becomes high. With VREG being high and REG being at Vsg, when the data in the DDC is at the high level, the TDC is forced to be high. Therefore, it is when data "3" has been written into the memory cell and the threshold voltage has reached the verify potential "c'''" or when a write operation has not been selected that the TDC is at Vdd. Thereafter, with DTG=Vsg, the data in the PDC is copied into the DDC. Then, with BLC1=Vsg, the PDC takes in the potential of the TDC.

In this way, the program and verify operations are repeated until all of the data in the PDC and the DDC have become "1" (S139).

In the seventh embodiment, a cell whose threshold voltage has exceeded the verify potential "a*'" is written into in a write operation by supplying an intermediate potential to the bit line. Therefore, the degree of variability in a write operation can be made smaller and therefore the threshold voltage distribution can be made smaller. As a result, a high-speed write operation can be carried out.

(Eighth Embodiment)

Figure 34:
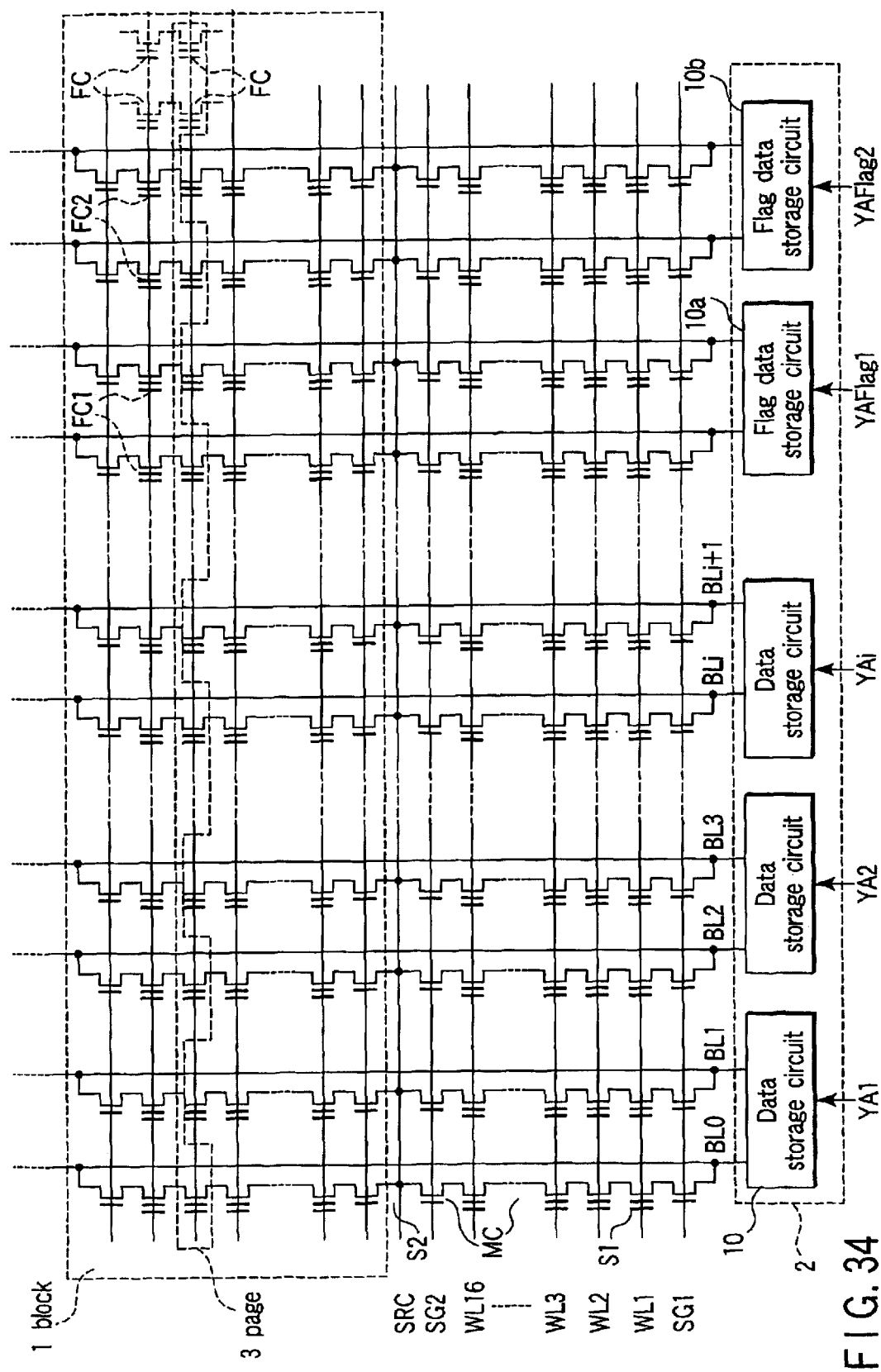
FIG. 34 is a circuit diagram of a memory cell array and a bit line control circuit according to an eighth embodiment of the present invention.

FIG. 34 shows a memory cell array 1 and a bit line control circuit 2 in a NAND flash memory for storing eight-valued (3-bit) data according to an eighth embodiment of the present invention. Because the configuration of FIG. 34 is almost the same as the four-valued (2-bit) configuration of FIG. 3, what differs from the latter will be explained.

In FIG. 34, when one word line is selected according to an external address, one sector shown by a broken line is selected. One sector is composed of three pages. The three pages are switched according to an address. That is, since 3-bit data can be stored in a memory cell, three bits are switched according to an address (a first page, a second, page, or a third page). One sector has two flag cells FC1, FC2. Therefore, when one word line is selected, two flag cells FC1, FC2 are selected simultaneously. The flag cells FC1, FC2 are connected via bit lines to flag data storage circuits 10a, 10b, respectively. The flag cell FC1 stores the fact that the second page has been written. The flag cell FC2 stores the fact that the third page has been written.

However, since one cell can store 3-bit data, one flag cell may store the fact that the second page and third page have been written, instead of using the two flag cells.

Furthermore, to increase the reliability, a plurality of flag cells FC1 and FC2 may be provided. In this case, the same data is stored in these flag cells, and the data read from the flag cells is determined by a majority decision in a read operation.

The operation of the eighth embodiment will be explained.

The erase operation is the same as in the case of four-valued data.

Figure 35A:
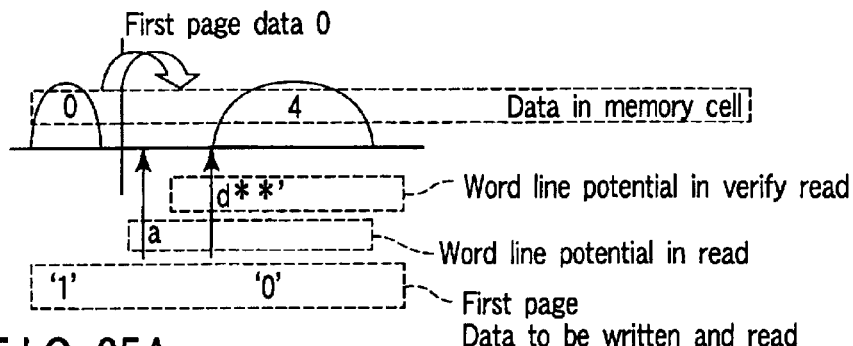
FIGS. 35A, 35B, and 35C show the relationship between the data in a memory cell and the threshold voltages of the memory cell in the eighth embodiment.
Figure 35B:
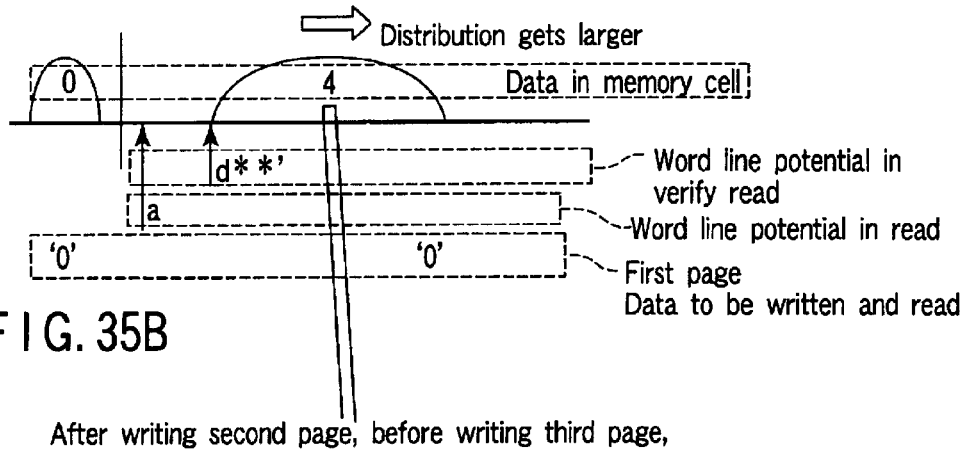
Figure 35C:
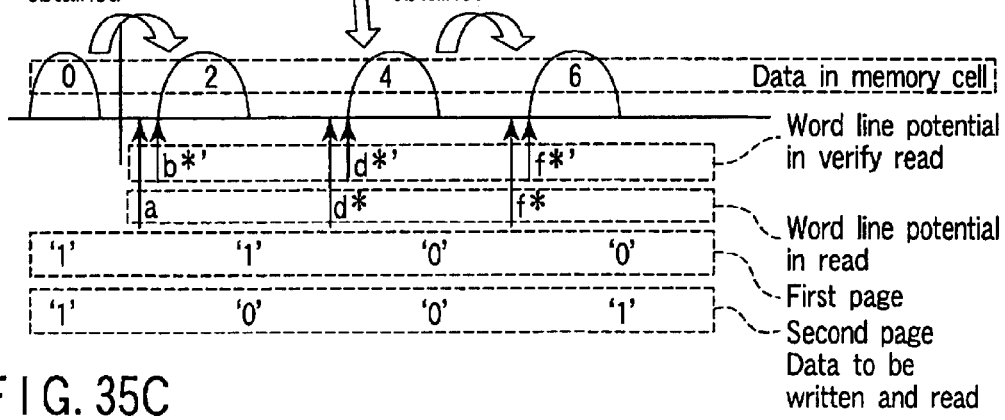
Figure 36A:
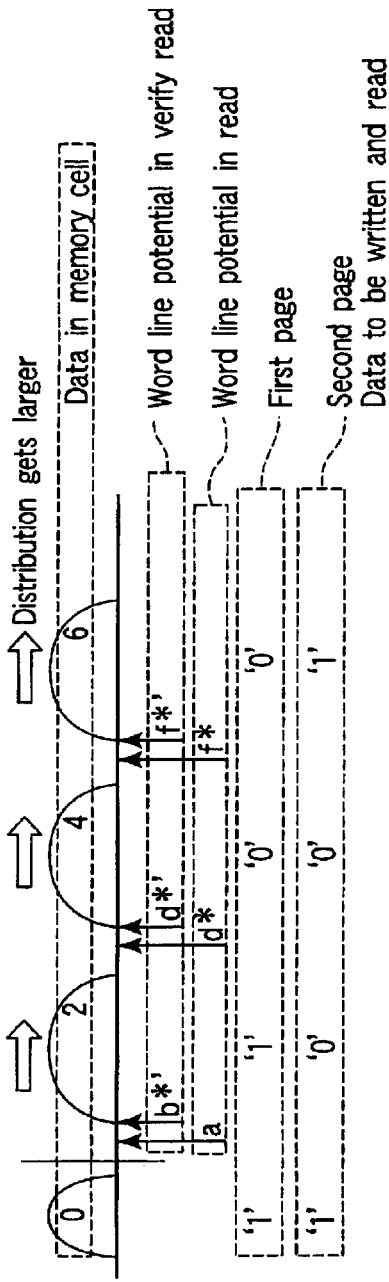
FIGS. 36A and 36B show the relationship between the data in a memory cell and the threshold voltages of the memory cell in the eighth embodiment.
Figure 36B:
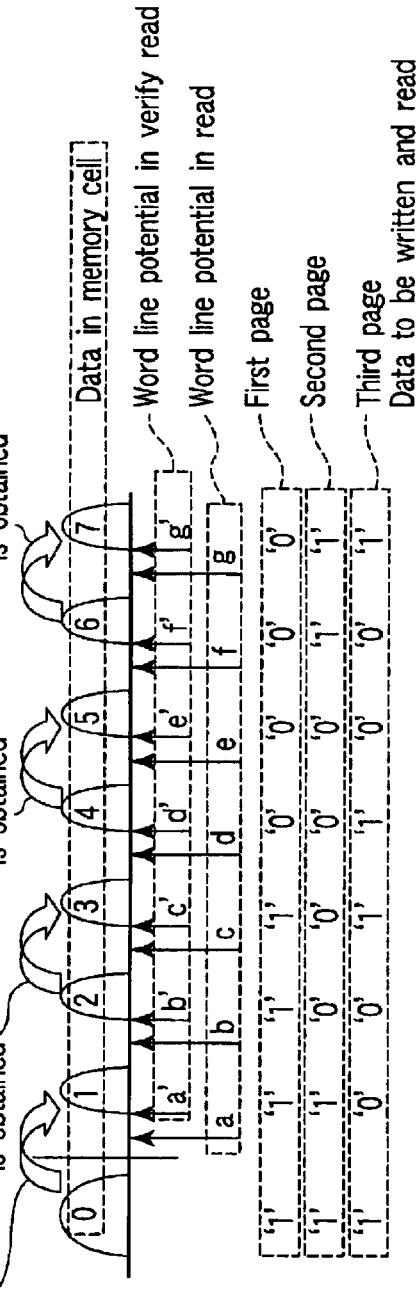

FIGS. 35 and 36 show the relationship between the data in a memory cell and the threshold voltages of the memory cell. After an erase operation is carried out, the data in the memory cell becomes "0" as shown in FIG. 35A. After a first page is written, the data in the memory cell become data "0" and data "4" (FIG. 35B). After a second page is written, the data in the memory cell become "0", "2", "4", and "6" (FIGS. 35C and 36A). After a third page is written, the data in the memory cell become data "0" to data "7" (FIG. 36B). In the eighth embodiment, the data in the memory cell are defined in ascending order of threshold voltage.

Figure 37A:
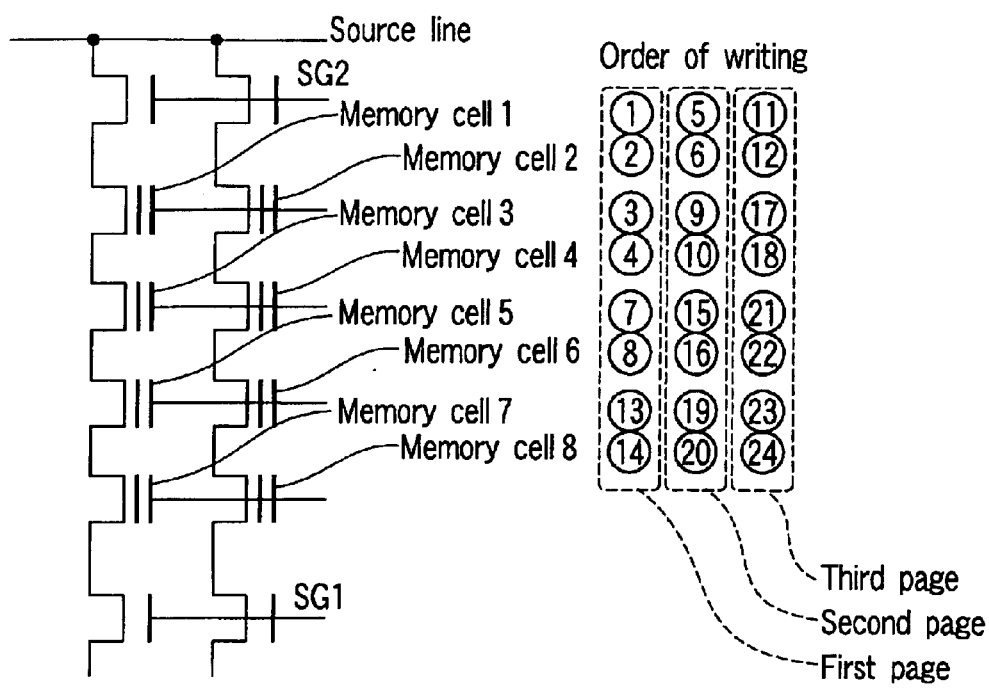
FIGS. 37A and 37B are diagrams to help explain the order in which data is written into a memory cell in the eighth embodiment.
Figure 37B:
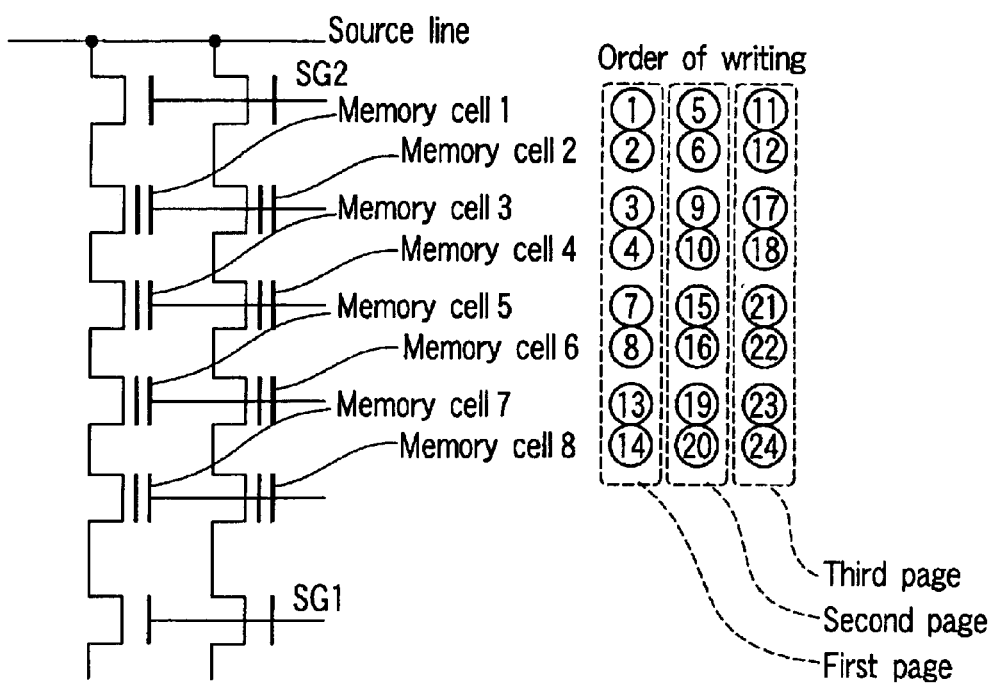

FIGS. 37A and 37B show two write sequences in the eighth embodiment. In a block, a write operation is carried out in pages, starting with the memory cell closest to the source line. In FIGS. 37A and 37B, for the sake of explanation, the number of word lines is assumed to be four. The write sequence shown in FIG. 37A is similar to that shown in FIG. 7. In contrast, the write sequence shown in FIG. 37B differs a little from that shown in FIG. 37A. Specifically, after the first page is written, up to the second page is written into the same cells, instead of writing the second page into the adjacent cells. Thereafter, before the third page is written, up to the second page is written into the adjacent cells. Then, the third page is written. In this way, writing may be done, taking into account the effect of the adjacent cells on the third page.

It is assumed that the original read potentials of word lines of the third page are "a", "b", "c", "d", "e", "f", and "g" and the verify potentials are "a'", "b'", "c'", "d'", "e'", "f'", and "g'". It is assumed that the read potentials of the second page are "b*" (="a"), "d*", and "f*" lower than the original read potentials and the verify potentials of the second page are "b*'", "d*'", and "f*'" a little lower than these potentials. The verify potential of the first page is a potential of "d" (="a") lower than the original read potential and the verify potential of the first page is a potential of "d'" a little higher than the verify potential of the first page.

(Program and Program Verify)

In a program operation, an address is first specified to select three pages shown in FIG. 34. In the memory, of the three pages, a program operation can be carried out only in this order: the first page, the second page, the third page. Therefore, the first page and second page programs are the same as in the case of four-valued data.

The data in a four-valued memory cell and the threshold voltages of the memory cell shown in FIGS. 35A to 35C correspond to FIGS. 1A to 1C. The program and program verify flowcharts are the same as those in FIGS. 8 and 9, so they are omitted. Here, the data in the memory cell are defined as "0", "1", "2", and "3" and the potentials of the word line are "a", "b", and "c" in the case of four-valued data, whereas the data in the memory cell are defined as "0", "2", "4", and "6" and the potentials of the word line are "b", "d", and "f" in the case of eight-valued data.

(First Page Program)

The flowchart diagram for the first page program is the same as in FIG. 8 except that the definition of the word line potentials are changed as described above.

(Adjacent Cell Program)

As shown in FIG. 37A, after one bit of data is written into the first page of memory cell 1, the first page of memory cell 2 adjacent to memory cell 1 in the direction of word is written into. Then, the first page of memory cell 3 adjacent to memory cell 1 in the direction of bit is written into and the first page of memory cell 4 adjacent to memory cell 1 in a diagonal direction is written into. After these write operations have been carried out, the threshold voltage of memory cell 1 rises due to the FG-FG capacitance, depending on the written data. As a result, the distribution of the threshold voltages of data "0" and data "4" in memory cell 1 expands toward higher threshold voltages as shown in FIG. 35B.

Thereafter, one bit of data is written into the second page of memory cell 1.

(Second Page Program)

The flowchart for the second page program is the same as the flowchart for writing by the pass write method in FIG. 9 expect that the definition of the word line potentials is changed. The data in the data caches after a data load and an internal read and the data in the data caches after the data caches are set are the same as those in FIGS. 10A and 10B.

(Adjacent Cell Program)

As shown in FIG. 37A, after data is written into the first and second pages of memory cell 1, data is written into the second page of memory cell 2, the first pages of memory cells 5 and 6, and the second page of memory cells 3 and 4. After these write operations have been carried out, the threshold voltage of memory cell 1 rises due to the FG-FG capacitance, depending on the written data. As a result, the distribution of the threshold voltages of data "2", data "4", and data "6" in memory cell 1 expands as shown in FIG. 36A.

Thereafter, one bit of data is written into the third page of memory cell 1.

(Third Page Program)

Figure 38:
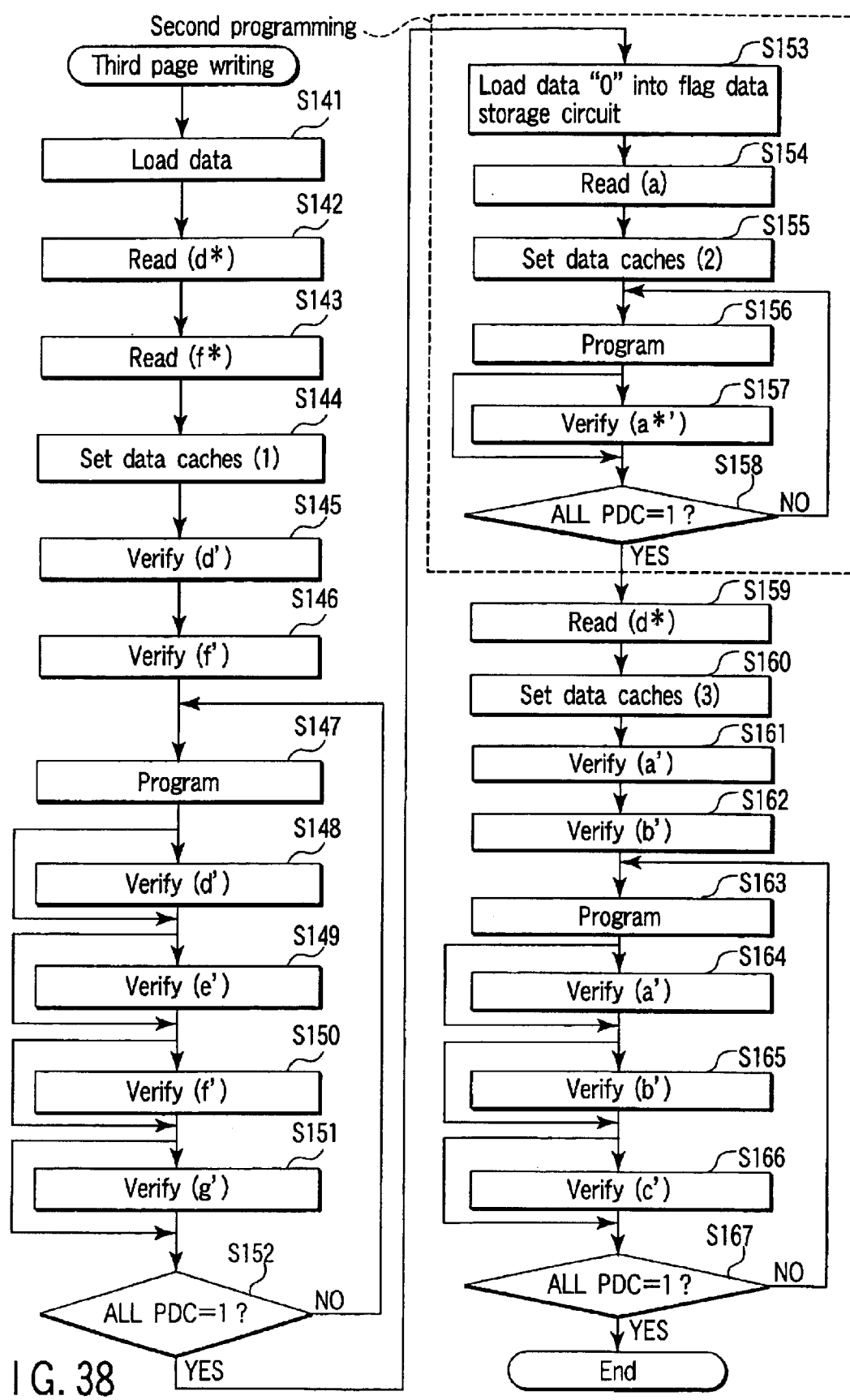
FIG. 38 is a flowchart for the operation of programming a third page in the eighth embodiment.

FIG. 38 is a flowchart for programming the third page. In the operation of programming the third page, an address is first specified to select three pages shown in FIG. 34.

Next, the write data is inputted from the outside world and stored in the SDCs of all the data storage circuits (S141). When data "1" (to do no writing) is inputted, the SDC of the data storage circuit 10 shown in FIG. 6 goes high. When data "0" (to do writing) is inputted, the SDC goes low. Thereafter, when a write command is inputted, because the third page is to be programmed, data "0" is inputted to the SDCs in the flag cell data storage circuits 10a, 10b to write data into the flag cells FC1, FC2.

In programming the third page, as shown in FIG. 36B, with the data in the memory cell being "0", the data in the memory cell is kept at "0" when the input data is "1", whereas the data in the memory cell is made "1" when the input data is "0".

With the data in the memory cell being "2", when the input data is "0", the data in the memory cell is kept at "2". However, in writing the second page, the verify potential "b*'" lower than the original value is used when it is verified whether the data in the memory cell has reached "2". For this reason, a memory cell in which data "2" has been stored is written into until a potential of "b'", the original verify potential, has been reached. With the data in the memory cell being "2", when the data inputted from the outside world is "1", the data in the memory cell is made "3".

With the data in the memory cell being "4", when the input data is "1", the data in the memory cell is kept at "4". However, in writing the second page, the verify potential "d*'" lower than the original value is used when it is verified whether the data in the memory cell has reached "4". For this reason, a memory cell in which data "4" has been stored is written into until a potential of "d'", the original verify potential, has been reached. With the data in the memory cell being "4", when the input data is "0", the data in the memory cell is made "5".

With the data in the memory cell being "6", when the input data is "0", the data in the memory cell is kept at "6". However, in writing the second page, the verify potential "f*'" lower than the original value is used when it is verified whether the data in the memory cell has reached "6". For this reason, a memory cell in which data "6" has been stored is written into until a potential of "f'", the original verify potential, has been reached. With the data in the memory cell being "6", when the input data is "1", the data in the memory cell is made "7".

(First Third Page Programming)

In programming the third page, data "1" to data "7" are written into the memory cell.

Although these data items can be programmed simultaneously, four data items, data "4" to data "7" are first written into the memory cell in the eighth embodiment. In programming by the pass write method, a memory cell into which data "1" is to be written has not been written at all. For this reason, a memory cell into which data "1" is to be written is written into roughly. Thereafter, memory cell data "1" to memory cell data "3" are written. Hereinafter, a concrete explanation will be given.

(Internal Data Read 1 and Data Cache Setting 1) (S142 to S144)

Before the cells are written into, it is determined whether the data in the memory cell of the second page is "4" or "6" or is "1" or "2", or whether the data in the memory cell is "6" or not or the data is any one of "0", "2", and "4". To do this, the potential of the. word line is set to "d*" and "f*" in that order, thereby carrying out an internal read operation (S142, S143).

FIG. 39A shows the state of the data caches after an internal read. Thereafter, by manipulating the data caches, the data caches are set as shown in FIG. 39B (S144).

In FIG. 39B, when the data in the memory cell is made "0" to "3", the PDC is set high. When the data in the memory cell is made "4", the PDC is set low, the DDC is set low, and the SDC is set high. When the data in the memory cell is made "5", the PDC is set low, the DDC is set high, and the SDC is set high. When the data in the memory cell is made "6", the PDC is set low, the DDC is set high, and the SDC is set low. When the data in the memory cell is made "7", each of the PDC, DDC, and SDC is set low.

(Third Page Verify: verifies data "4") (S145)

In a memory cell into which data "4" is to be written, writing is done on the second page until the verify potential "d*'" lower than the original verify potential "d" has been reached. Thereafter, the threshold voltage of the cell into which data "4" has been written may have risen as a result of writing the adjacent cells. In addition, there may be cells whose verify potential has reached the original verify potential "d'". For this reason, data "4" is first verified.

In a program verify operation to determine whether the threshold voltage of the memory cell has reached data "4", a potential of "d'" a little higher than the read potential "d" is supplied to the selected word line.

First, a read potential Vread is supplied to the unselected word lines and select line SG1 in the selected block. In this state, signal BLCLAMP of the data storage circuit 10 shown in FIG. 6 is set to, for example, 1V+Vth and signal BLC2 is set to a specific voltage, for example, Vdd+Vth. Under these conditions, the bit line is precharged. As a result, the bit line is prevented from being precharged, when data "7" and data "6" are written into the memory cell. Only when data "0" to data "5" are written into the memory cell, the bit line is precharged.

Next, with signal VREG being at Vss and signal REG being high, when data "6" and data "5" are written into the memory cell, the precharged potential becomes Vss. That is, it is only when data "0", data "3", and data "4" are written into the memory cell that the bit line is precharged. Next, select line SG2 on the source side of the cell is made high.

Since the cells whose threshold voltage is higher than "d'" turn off, the bit line remains high. In addition, since the cells whose threshold voltage is lower than "d'" turn on, the bit line is at Vss. While the bit line is being discharged, node N3 of the TDC is set to Vss temporarily and signal REG is made high, thereby turning on the transistor 61q, which causes the data in the DDC to be transferred to the TDC. Then, the DTG is turned on temporarily, causing the data in the PDC to be transferred to the DDC. Thereafter, the data in the TDC is transferred to the PDC.

Next, signal BLPRE is set to a specific voltage, for example, Vdd+Vth, thereby precharging node N3 of the TDC at Vdd. Thereafter, signal BLCLAMP is set to 0.9V+Vth, thereby turning on the transistor 61t. When the bit line is at the low level, node N3 of the TDC is at the low level. When the bit line is at the high level, node N3 of the TDC is at the high level. Here, when writing is done, the low level has been stored in the DDC. When no writing is done, the high level has been stored in the DDC. Therefore, when signal VREG is set to Vdd and signal REG is made high, the node of the TDC is forced to be high only when no writing is done. After this operation, the data in the PDC is transferred to the DDC and the potential of the TDC is read into the PDC. It is only when no writing is done or when data "4" has been written into the memory cell and the threshold voltage of the cell has reached the threshold voltage "d" that the high level is latched in the PDC. It is when the threshold voltage of the cell has not reached "d'" or when data "7", "6", and "5" have been written into the memory cell that the low level is latched in the PDC.

(Third Page Verify: Verifies Memory Data "6") (S146)

In a memory cell into which data "6" is to be written, writing is done on the second page until the verify potential "f*'" lower than the original verify potential "f" has been reached. Thereafter, the threshold voltage may have risen as a result of writing the adjacent cells. In addition, there may be cells whose verify potential has reached the original verify potential "f'". For this reason, data "6" is first verified.

The operation of verifying data "6" is identical with the operation of verifying data "4" in writing the second page (data "2" in writing the second page in the first to seventh embodiments). Here, the verify potential is "f'".

(Program Operation) (S147)

The program operation is identical with the program operations for the first and second pages. Specifically, when data "1" has been stored in the PDC, no writing is done. When data "0" has been stored in the PDC, writing is done. Thereafter, data "4" to data "7" are verified. Since the operations of verifying data "4" and data "6" (S148, S150) are the same as those in S145 and S146, explanation of them is omitted.

(Third Page Verify: Verifies Memory Cell Data "5") (149)

The operation of verifying data "5" is identical with the operation of verifying data "2" in writing the second page (data "1" in writing the second page in the first to seventh embodiments). Here, the verify potential is "e'".

(Third Page Verify: Verifies Memory Cell Data "7") (151)

The operation of verifying data "7" is identical with the operation of verifying data "6" in writing the second page (data "3" in writing the second page in the first to seventh embodiments). Here, the verify potential is "g'".

When the PDC is low, the write operation is carried out again and the program operation and the verify operation are repeated until the data in the PDCs of all of the data storage circuits have become high (S152).

In the above explanation, after one programming is completed, four verify operations are carried out. In the initial loop of the programming, the threshold voltage of the memory cell does not rise. Therefore, the operations of verifying data "7", of verifying data "7" and data "6", and of verifying data "7", data "6", and data "5" may be omitted.

Furthermore, in a loop close to the end of the programming, the operations of verifying data "4", of verifying data "4" and data "5", and of verifying data "4", data "5", and data "6" may be omitted.

(Second Programming) (S153 to S158)

In programming by the pass write method, a memory cell into which data "1" is to be written has not been written into at all. For this reason, the memory cell is written into roughly as described above. When programming is not done by the pass write method, the second programming may be omitted.

In the second programming, data "0" is stored into the flag data storage circuit 10b (S153).

(Internal Data Read 2 and Data Cache Setting 2) (S154, S155)

Before the memory cells are written into, the potential of the word line is set to "a" and an internal read operation is carried out to determine whether the data in the memory cell of the second page is "0" or is "2", "4", or "6" (S154). Thereafter, by manipulating the data caches, the data caches are set as shown in FIG. 40A (S155).

Specifically, when the data in the memory cell is made "1", the PDC is set low. When the data in the memory cell is set to a value other than "1", the PDC is set high.

In this state, a program operation is carried out (S156).

(Third Page Verify: Verifies Data "1") (S157)

The operation of verifying data "1" is identical with the operation of verifying data "5" in writing the third page and data "2" in writing the second page (data "1" in writing the second page in the first to seventh embodiments). Here, the verify potential is "a'" (S157).

When the PDC is low, the write operation is carried out again and the program operation and the verify operation are repeated until the data in the PDCs of all of the data storage circuits have become high (S158).

(Third Programming)

Finally, data "1", "2", and "3" are written into the memory cell as follows.

(Internal Data Read 3 and Data Cache Setting 3) (S159, S160)

First, before the memory cells are written into, the potential of the word line is set to "d*" and an internal read operation is carried out to determine whether the data in the memory cell of the second page is "0" or "2" or is "4" or "6" (S159).

Thereafter, by manipulating the data caches, the data caches are set as shown in FIG. 40B (S160). Specifically, when the data in the memory cell is made "0", the PDC is set high, the DDC is set low, and the SDC is set high. When the data in the memory cell is made "1", the PDC is set low, the DDC is set high, the SDC is set high. When data in the memory cell is made "2", the PDC is set low, the DDC is set high, and the SDC is set low. When the data in the memory cell is made "3", the PDC is set low, the DDC is set low, and the SDC is set low. When the data in the memory cell is set to "4" to "7", all of the PDCs are set high.

(Third Page Verify: Verifies Memory Cell Data "1") (S161)

In programming by the pass write method, a memory cell into which data "1" is to be written has been written into in the second programming until the verify potential "a*'" lower than the original verify potential "a'" has been reached. Therefore, there may be cells whose verify potential has reached the original verify potential "a'". For this reason, data "1" is first verified. The operation of verifying data "1" is identical with the operation of verifying data "5" in writing the third page and data "2" in writing the second page (data "1" in writing the second page in the first to seventh embodiments). Here, the verify potential is "a'".

(Third Page Verify: Verifies Memory Cell Data "2") (S162)

In a memory cell into which data "2" is to be written, the second page is written until the verify potential "b*'" lower than the original verify potential "b'" has been reached. Thereafter, the threshold voltage may have risen as a result of writing the adjacent cells. In addition, there may be cells whose verify potential has reached the original verify potential "b'". For this reason, data "2" is first verified.

The operation of verifying data "2" is identical with the operation of verifying data "6" in writing the third page and the operation of verifying data "2" in writing the second page (data "1" in writing the second page in the first to seventh embodiments). Here, the verify potential is "b'".

(Program Operation) (S163)

The program operation is identical with the first and second program operations for the first, second, and third pages. When data "1" has been stored in the PDC, the memory cell is not written into. When data "0" has been stored in the PDC, the memory cell is written into.

Thereafter, the verify potentials "a'" and "b'" are set in that order and data "1" and data "2" are verified (S164, S165). At the same time, data "3" is verified as described below.

(Third Page Verify: Verifies Data "3") (166)

The operation of verifying data "3" is identical with the operation of verifying data "7" in writing the third page and he operation of verifying data "6" in writing the second page (data "3" in writing the second page in the first to seventh embodiments). Here, the verify potential is "c'".

When the PDC is low, the write operation is carried out again and the program operation and verify operations are repeated until the data in the PDCs of all the data storage circuits have become high (S167).

In the above explanation, after one programming is completed, four verify operations are carried out. In the initial loop of the programming, since the threshold voltage does not rise, the operations of verifying data "3" and of verifying data "3" and data "2" may be omitted.

Furthermore, in a loop close to the end of the programming, data "1" has been written or data "2" and data "1" have been written. Therefore, the verify operations for them may be omitted. If the operation of verifying data "1" is not needed, it is not necessary for the SDC to store the data. Therefore, the data for next writing may be read from the outside world and stored in the SDC. This configuration enables a much higher-speed operation.

Furthermore, on the first and second pages, no data is written into the flag cells FC1, FC2. Only on the third page, data is written. Therefore, the data in the cells FC1 and FC2 are "1".

(First Page Read)

Figure 41A:
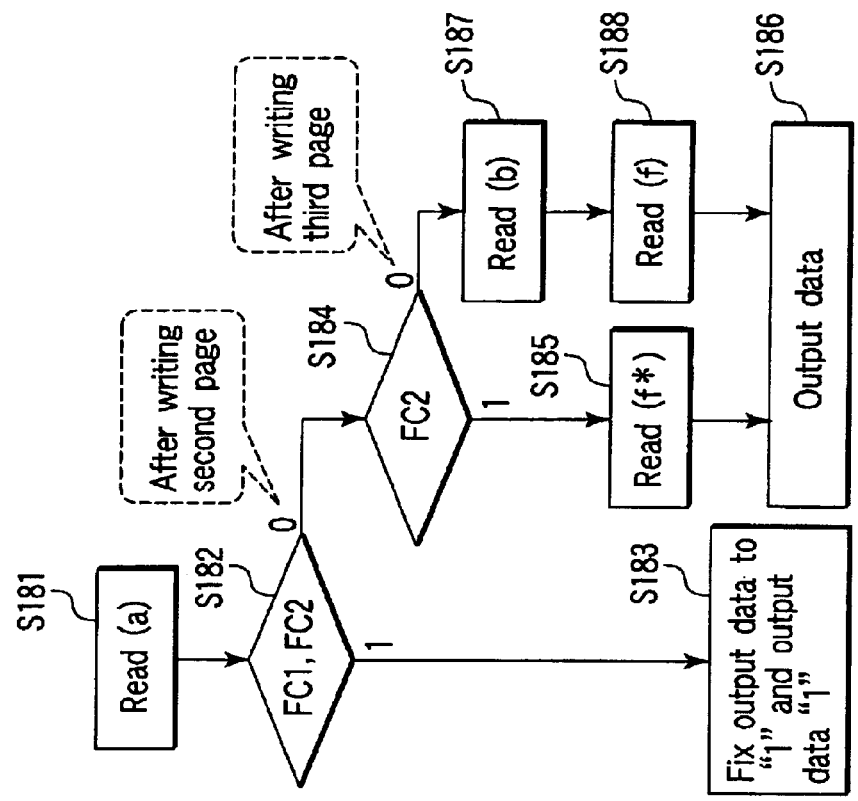
FIG. 41A is a flowchart for the operation of reading a first page in the eighth embodiment and FIG. 41B is a flowchart for the operation of reading a second page.

FIG. 41A is a flowchart for the operation of reading the first page.

First, an address is specified to select three pages shown in FIG. 34. As shown in FIGS. 35A to 35C and FIGS. 36A and 36B, the distribution of the threshold voltage has changed before and after the writing of the second page and before and after the writing of the third page. Therefore, after the potential of the word line is set to "a", a read operation is carried out and it is determined whether the flag cell has been written into (S171, S172). In this determination, if more than one flag cell is used, the determination is made by a majority decision.

When both of the data items read from the flag cells FC1, FC2 are "1" (or none of the flag cells FC1, FC2 have been written into), the writing of the second and third pages has not been carried out. As a result, the distribution of the threshold voltage of the cell is as shown in FIG. 35A or 35B. To determine the data in such cells, a read operation has to be carried out with the potential of the word line at "a". The result of the read operation with the word line potential "a" has been already read into the data storage circuit. Therefore, the data stored in the data storage circuit is outputted (S173).

When the data in the flag cell FC1 is "0" and the data in the flag cell FC2 is "1" (or when the flag cell FC1 has been written into and the flag cell FC2 has not been written into), the data has been written into the second page and the data has not been written into the third page. As a result, the cell threshold voltage distribution is as shown in FIG. 35C or FIG. 36A. To determine the data on the first page of such cells, a read operation has only to be carried out with the potential of the word line at "d*". After the read operation is carried out with the word line potential "d*", the data is outputted (S174, S175, S173).

When both of the data items in the flag cells FC1, FC2 are "0" (or both of the flag cells FC1, FC2 have been written into), the data has been written into the second and third pages. Therefore, the cell threshold voltage distribution is as shown in FIG. 36B. To determine the data on the first page of such cells, the potential of the word line is set to "d" and a read operation is carried out. Then, the data read in the read operation is outputted (S172, S174, S176, S173).

(Second Page Read)

Figure 41B:
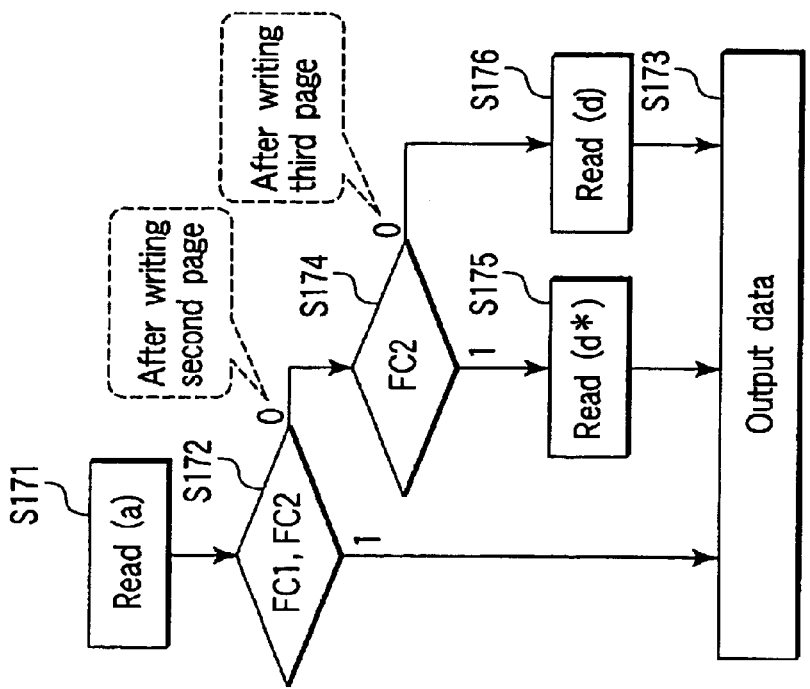

FIG. 41B is a flowchart for the operation of reading the second page. In reading the second page, an address is first specified to select three pages shown in FIG. 34. Thereafter, the potential of the word line is set to "a" and a read operation is carried out (S181). Then, it is determined whether data has been written into the flag cells FC1, FC2 (S182). In the determination, if more than one flag cell is used, the determination is made by a majority decision.

When both of the data items read from the flag cells FC1, FC2 are "1" (or none of the flag cells FC1, FC2 have been written into), the data has not been written into the second and third pages. Therefore, the output data is fixed to "1" (S183).

When the data in the flag cell FC1 is "0" and the data in the flag cell FC2 is "1" (or when the flag cell FC1 has been written into and the flag cell FC2 has not been written into), the data has been written into the second page and the data has not been written into the third page. As a result, the cell threshold voltage distribution is as shown in FIG. 35C or FIG. 36A. To determine the data on the first page of such cells, a read operation is carried out with the potential of the word line at "a" and at "f*". The result of reading with the word line potential "a." has been already loaded into the data storage circuit. Therefore, after a read operation is carried out with the word line potential set to "f*", the read-out data is outputted (S185, S186).

When both of the data items in the flag cells FC1, FC2 are "0" (or both of the flag cells FC1, FC2 have been written into), the data has been written into the second and third pages. Therefore, the memory cell threshold voltage distribution is as shown in FIG. 36B. To determine the data on the first page of such cells, the potential of the word line is set to "b" and "f" and a read operation is carried out. That is, after a read operation is carried out, with the potential of the word line being set to "b", a read operation is carried out, with the potential of the word line being set to "f". Then, the read-out data is outputted (S187, S188, S186).

(Third Page Read)

Figure 42:
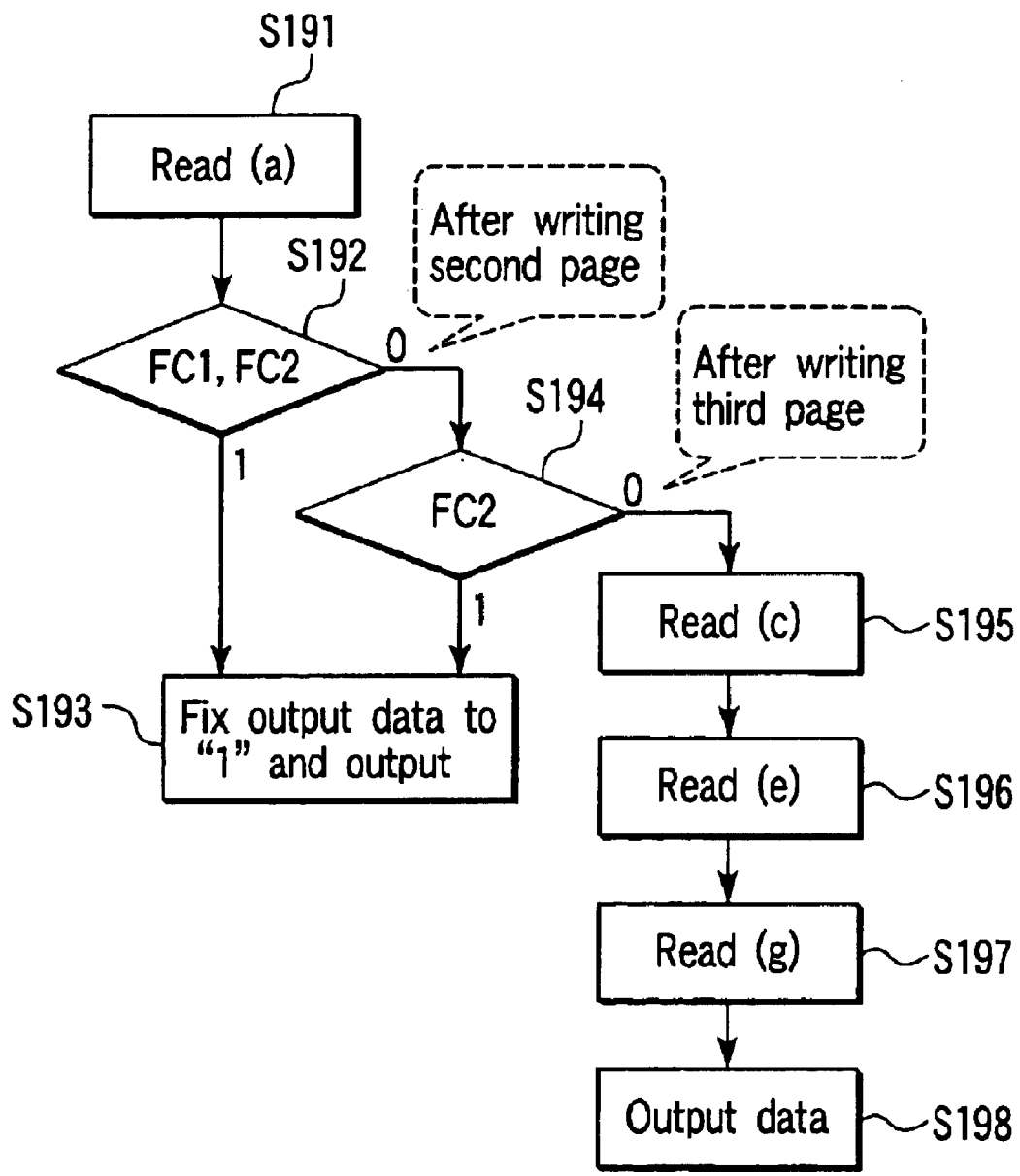
FIG. 42 is a flowchart for the operation of reading a third page in the eighth embodiment.

FIG. 42 is a flowchart for the operation of reading the third page. In this case, too, an address is first specified to select three pages shown in FIG. 34. The distribution of the threshold voltage has changed before and after the writing of the third page. Therefore, after the potential of the word line is set to "a", a read operation is carried out and it is determined whether data has been written into the flag cells FC1 and FC2 (S191, S192).

When both of the data items in the flag cells FC1, FC2 are "1" (or data has been written into none of the flag cells FC1, FC2), the third page has not been written into. Therefore, the output data is fixed to "1" (S193).

When the data in the flag cell FC1 is "0" and the data in the flag cell FC2 is "1" (or when data has been written into the flag cell FC1 and no data has been written into the flag cell FC2), the data has not been written into the third page. Therefore, the output data is fixed to "1" (S194, S193).

When both of the data items in the flag cells FC1, FC2 are "0" (or data has been written into both of the flag cells FC1, FC2), the data has been written into the second and third pages. Therefore, the memory cell threshold voltage distribution is as shown in FIG. 36B. To determine the data on the first page of such memory cells, the potential of the word line is set to "a", "c", "e", and "g" and a read operation is carried out. The result of reading with the word line potential "a" has been already loaded into the data storage circuit. Therefore, the potential of the word line is set to "c", "e", and "g" in that order and a read operation is carried out. Then, the read-out data is outputted (S195, S196, S197, S198).

(Erase)

Since an erase operation is the same as in the first to seventh embodiments, its explanation will be omitted.

According to the eighth embodiment, it is possible to write and read eight-valued (3-bit) data reliably at a high speed.

With the eight-valued (3-bit) NAND flash memory of the eighth embodiment, in writing the third page, data "4" to data "7" are written in the first writing, data "1" is written roughly in the second writing, and data "1" to data "3" are written in the third writing. However, the present invention is not limited to this. For instance, data "2", "4", and "6" may be written first and then data "1", "3", "5", and "7" be written.

This way of writing also produces the same effect as that of the eighth embodiment.

(Ninth Embodiment)

In the sixth embodiment, when the DDC has data "1" in it in FIG. 27A, an intermediate potential is supplied to the bit line. When the PDC has data "0" in it, the bit line is discharged to Vss. In contrast, a ninth embodiment of the present invention eliminates that operation in writing a second page. The write sequence in the ninth embodiment is the same as that in the flowchart shown in FIG. 28. The operation of the data cache is as shown in FIG. 43A to FIG. 46.

(a) First, externally inputted data is loaded into the SDC and the data read in an internal data read is stored into the PDC. FIG. 43A shows the relationship between the data in the SDC and PDC and the data in the memory cell after a data load and an internal read. The PDC represents the data in a lower page (a first page) and the SDC represents the data in an upper page (a second page).

(b) Thereafter, operations as shown in FIGS. 11 and 12 are carried out, thereby setting the data cache (FIG. 43B). In the case of the data cache setting as shown in FIG. 27A, to write data "1" into a memory cell, data "1" has been set in the DDC. In contrast, to write data "1" into a memory cell in the ninth embodiment, data "0" is set in the DDC.

Then, the data is written into the memory cell. First, if BLC1=Vsg, when the PDC has data "0" in it, the bit line is at Vss, whereas when the PDC has data "1" in it, the bit line is at Vdd. Next, let BLC1=VSS, and then let VREG=Vdd and REG=intermediate potential+Vth(1V+Vth). Then, when the DDC has data "1" in it, the bit line is at Vdd. When the DDC has data "0" in it, the bit line is not precharged. As a result, only when data "1" or "3" has been written into the memory cell, the bit line is at Vss. When data "2"has been written into the memory cell), the bit line is at the intermediate potential (1 V). When the data in the memory cell is "0" (or when no data has been written into the memory cell), the bit line is at Vdd. Here, if the selected word line is Vpgm and the unselected word line is Vpass, when the bit line is at Vdd, no writing is done. When the bit line is at Vss, writing is done. When the bit line is at the intermediate potential (1 V), writing is done a little. Accordingly, a memory cell into which data "2" has been written may not be written into heavily.

Figure 47A:
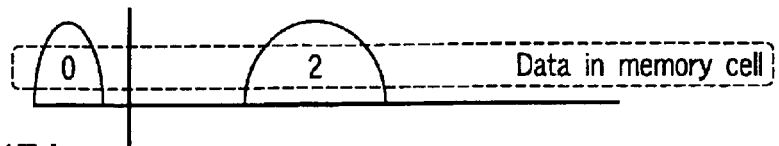
FIGS. 47A and 47B show the relationship between data of the memory cell and the threshold voltages of the memory cell in ninth embodiment.
Figure 47B:
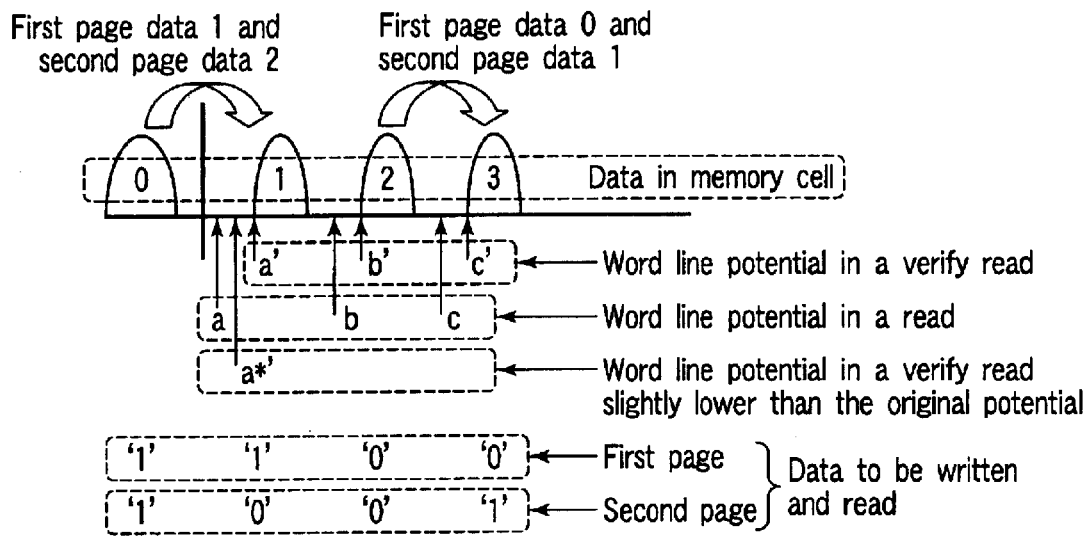

However, as shown in FIG. 47A, before the second page is written, a memory cell into which data "2" is to be written has been written into up to a rather high threshold level before being written into. For this reason, writing may be done slowly. In addition, as the Vpgm rises, the memory cell is written into.

(c) Thereafter, a verify voltage "a*'" is set and a write verify operation is carried out. In the verify operation, with BLC2 being set to the high level and a specific potential being applied to BLCLAMP, only when the SDC has data "1" in it (that is, data "1" has been written into the memory cell), the bit line is precharged. When the SDC has data "0" in it, the bit line is not precharged and remains at Vss.

FIG. 44A shows the data cache after a verify operation is carried out at the verify voltage "a*'".

Next, the potential of the word line is set to the verify potential "a*'" and the bit line is discharged. Let VPRE=Vdd and BLPRE=Vsg. Then, after the TDC is charged to Vdd, a specific voltage is applied to BLCLAMP. If the bit line is at Vss, the TDC is at Vss. If the precharge potential is left on the bit line, the TDC is at Vdd. It is when the memory cell into which data "1" has been written reaches the verify potential "a*'" that the TDC goes to Vdd. When data "1" has not been written into the memory cell, the bit line has not been precharged, with the result that the TDC is at Vss. In addition, when the memory cell into which data "1" has been written does not reach the verify potential "a*", the TDC is 60 at Vss.

Here, if VREG=high level and REG=high level, when the DDC has data "1" in it, the TDC is forced to go to the high level. Therefore, it is when the memory cell into which data "1" has been written reaches the verify potential "a*'" or when the data in the DDC is "1" or data "2" has been written into the memory cell that the TDC goes to Vdd. Let DTG=Vsg and the data in PDC is copied into the DDC. Thereafter, let BLC1=Vsg and the potential of the TDC is loaded into the PDC.

In FIG. 44B, it is when the memory cell into which data "1" has been written exceeds the verify potential "2*'" or data "2" has been written in the memory cell that the PDC has data "1" in it.

(d) Next, the potential of the word line is dropped a little to produce a verify potential "a'" and the bit line is discharged. Let VPRE=Vdd and BLPRE=Vsg. Then, after the TDC is charged to Vdd again, a specific voltage is applied to BLCLAMP. If the bit line is at Vss, the TDC is at Vss. When the precharge potential is left on the bit line, the TDC is at Vdd. It is when the memory cell into which data "1" has been written reaches the verify potential "a'" that the TDC goes to Vdd. When data "1" has not been written into the memory cell, the bit line has not been precharged, with the result that the TDC is at Vss. In addition, when the memory cell into which data "1" has been written does not reach the verify potential "a'", the TDC is also at Vss.

Here, let VREG=high level and REG=high level. In this state, when the data in the DDC is "1", that is, when no data has been written into the memory cell, the TDC is forced to be set at the high level. Therefore, it is when writing is not selected or when the memory cell into which data "1" has been written reaches the verify potential "a'" that the TDC goes to Vdd.

Next, let DTG=Vsg. Then, after the data in the PDC is copied into the DDC, let BLC1=Vsg. Then, the potential in the TDC is loaded into the PDC (FIG. 45A).

In a memory cell into which data "1" has been written, when the threshold voltage rises above the verify potential "a*'", the data in the DDC becomes "1". In addition, in a memory cell into which data "1" has been written, all of the write operation using the verify potential "a'" has been completed, the data in the PDC becomes "1".

(e) A verify operation using a verify potential "b" (FIG. 45B). As in the first embodiment, in the verify operation, let REG=high level. Then, a specific potential is supplied to BLCLAMP. In this state, in a case where the DDC has data "1" in it, that is, in a case where data "2" has been written into the memory cell, or only in a case where data "1" has been written into the memory cell and the threshold voltage is higher than the verify potential "a*'", the bit line is precharged. Moreover, in a case where the DDC has data "0" in it, the bit line is not precharged and remains at Vss.

Next, a verify potential "b" is supplied to the word line and the bit line is discharged. While the bit line is being discharged, the data in the DDC is transferred to the TDC. Thereafter, the data in the PDC is transferred to the DDC and the data in TDC is transferred to the PDC. Next, after the TDC is charged to Vdd, a specific potential is supplied to BLCLAMP. Then, it is only when data "2" has been written into the memory cell and the threshold voltage reaches the verify potential "b'" that the TDC goes high.

Here, let VREG=high level and REG=Vsg. In this state, when the data in the DDC is at the high level, the TDC is forced to go high. Therefore, it is when data "2" has been written into the memory cell and the verify potential "b'" is reached or when writing is not selected that the TDC goes to Vdd. Let DTG=Vsg. Then, after the data in the PDC is copied into the DDC, let BLC1=Vsg. Then, the potential in the TDC is loaded into the PDC.

(f) A verify operation using a verify potential "c" (FIG. 46). As in the first embodiment, in this verify operation, too, let BLPRE=high level. Then, a specific potential is supplied to BLCLAMP and the bit line is precharged.

Next, the verify potential "c'" is supplied to the word line and the bit line is discharged. While the bit line is being discharged, the data in the DDC is transferred to the TDC. Thereafter, the data in the PDC is transferred to the DDC and the data in the TDC is transferred to the PDC.

Then, after the TDC is charged to Vdd, a specific potential is supplied to BLCLAMP. It is only when the threshold voltage reaches the verify potential "c'" that the TDC goes high. Then, let VREG=high level and REG=Vsg. In this state, when the data in the DDC is at the high level, the TDC is forced to go high. Therefore, it is when data "3" has been written into the memory cell and the verify potential "c'" is reached or when writing is not selected that the TDC goes to Vdd.

Next, let DTG=Vsg. Then, the data in the PDC is copied into the DDC. Thereafter, let BLC1=Vsg. Then, the potential in the TDC is loaded into the PDC.

In this way, the program and verify operations are repeated until the data in all of PDCs become "1". However, in a write operation, when the data in the DDC is "1", that is, when data "2" has been written into the memory cell, or when data "1" has been written into the memory cell and the verify potential "a*'" has been exceeded, the bit line is set to the intermediate potential and writing is done. Each time the program and verify operations are repeated, Vpgm is raised little by little.

With the ninth embodiment, in the second page write operation, when the DDC has data "1" in it after the data cache is set, or when the bit line is precharged to Vdd in verifying data "2" in the memory cell and the DDC has data "0" in it, the bit line is not precharged. As a result, the bit line goes to Vss only when data "1" has been written into the memory cell and the verify level "a*'" is not exceeded, or when data "3" has been written into the memory cell. The bit line goes to the intermediate potential (2 V) when data "1" has been written into the memory cell and the verify level "a*'" is exceeded, or when data "2" has been written into the memory cell. The bit line goes to Vdd when the data in the memory cell is "0". Thus, if the selected word line is Vpgm and the unselected word line is Vpass, when the bit line is Vdd, no writing is done. Furthermore, the bit line is at Vss, writing is done. Moreover, when the bit line is at the intermediate potential (2 V), writing is done a little, which raises the threshold voltage of the memory cell a little. Accordingly, when the DDC has data "1" in it, the bit line goes to the intermediate potential during programming, which decreases the write speed. This makes it possible to set the distribution of threshold voltages accurately.

In the ninth embodiment, when the data in the first page (lower page) is written into the memory cells and then the data in the second page (upper page) is written into the memory cell, the data in the first page is read and three levels of threshold voltages are written. However, the data in the first page and the data in the second page may be written into the memory cells at the same time.

Figure 48:
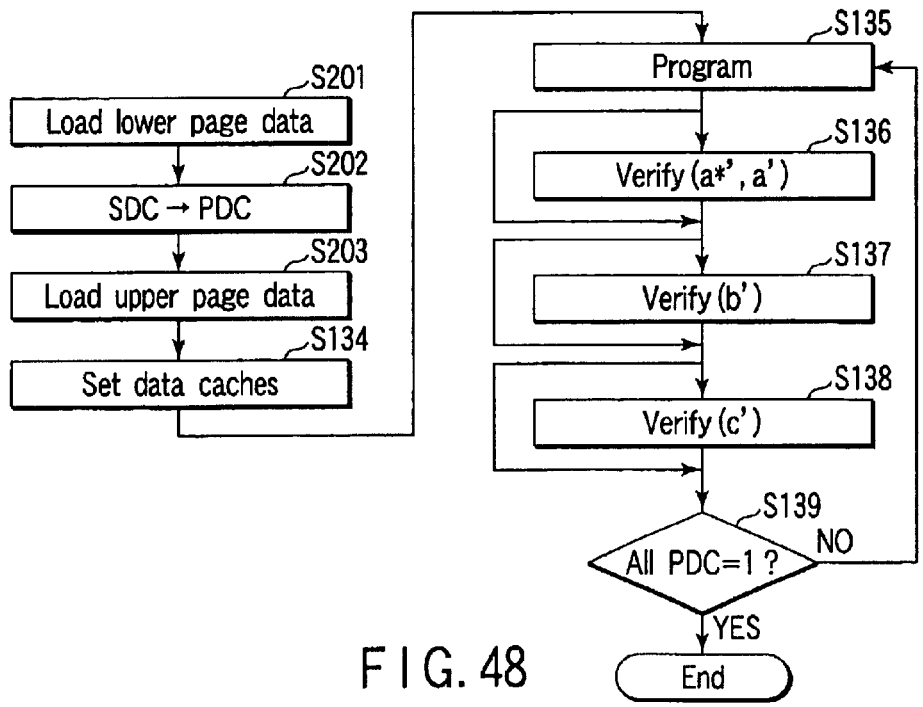
FIG. 48 shows a flowchart of the modification of the ninth embodiment.

Specifically, as shown in FIG. 48, the data in the first page is loaded into the SDC (S201). Then, the data in the first page is transferred from the SDC to the PDC (S202). Next, the data in the second page is loaded into the SDC (S203). Thereafter, the data cache is set as shown in FIG. 43B (S134). According to the data in the data cache, the program is executed (S135). In FIG. 48, since the operations subsequent to the program are the same as those in FIG. 28, the same parts are indicated by the same reference numerals and explanation of them will be omitted.

With the above method, since the data in the first page and the data in the second page are written into the memory cells at the same time, the data in the first page need not be read by the write operation and internal data read operation only for the first page. As a result, high-speed writing can be done.

(Tenth Embodiment)

Figure 49:
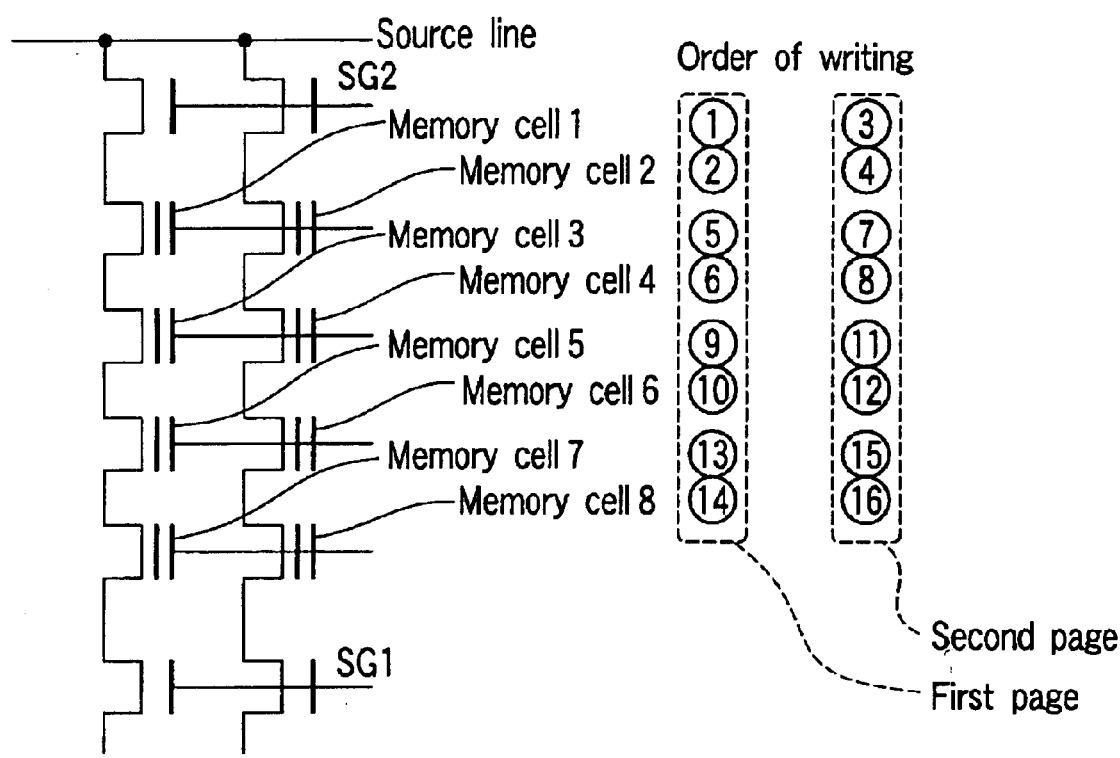
FIG. 49 shows a diagram to help explain the order in which data is written into a NAND cell in the tenth embodiment.

FIG. 49, which shows a modification of FIG. 7, shows the order in which a plurality of adjacent memory cells are written into.

In a tenth embodiment of the present invention, a plurality of memory cells in a block are written into in pages, starting with the memory cells closer to a source line. In FIG. 49, only four word lines are shown to simplify the explanation.

In a first write operation, one bit of data is written into a first page of memory cell 1.

In a second write operation, one bit of data is written into a first page of memory cell 2 adjacent to memory cell 1 in the word direction.

In a third write operation, one bit of data is written into a second page of memory cell 1.

In a fourth write operation, one bit of data is written into a second page of memory cell 2 adjacent to memory cell 1 in the word direction.

In a fifth write operation, one bit of data is written into a first page of memory cell 3 adjacent to memory cell 1 in the bit direction.

In a sixth write operation, one bit of data is written into a first page of memory cell 4 diagonally adjacent to memory cell 1.

In a seventh write operation, one bit of data is written into a second page of memory cell 3.

In an eighth write operation, one bit of data is written into a second page of memory cell 4 adjacent to memory cell 3 in the word direction.

In a ninth write operation, one bit of data is written into a first page of memory cell 5 adjacent to memory cell 3 in the bit direction.

In a tenth write operation, one bit of data is written into a first page of memory cell 6 diagonally adjacent to memory cell 3.

In an eleventh write operation, one bit of data is written into a second page of memory cell 5.

In a twelfth write operation, one bit of data is written into a second page of memory cell 6 adjacent to memory cell 5 in the word direction.

In a thirteenth write operation, one bit of data is written into a first page of memory cell 7 adjacent to memory cell 5 in the bit direction.

In a fourteenth write operation, one bit of data is written into a first page of memory cell 8 diagonally adjacent to memory cell 5.

In a fifteenth write operation, one bit of data is written into a second page of memory cell 7.

In a sixteenth write operation, one bit of data is written into a second page of memory cell 8 adjacent to memory cell 7 in the word direction.

Even in the above write sequence, the same effect as shown in the example of FIG. 7 can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a memory cell which stores a plurality of data with an n-valued threshold voltage (n is a natural number equal to or larger than 1);

a first data storage circuit which stores at least a first-logic-level or a second-logic-level data read from the memory cell;

a second data storage circuit which is connected to a data line and stores at least the first- or second-logic-level data supplied from the data line;

a third data storage circuit which stores at least the data read from the memory cell or the first- or second-logic-level data supplied from the first data storage circuit; and a control circuit which manipulates the data in the first, second and third data storage circuits in such a manner that the control circuit does not change the threshold voltage of the memory cell when the logic level of the first data storage circuit is at the second logic level, carries out a first write operation to raise the threshold voltage of the memory cell when the logic level of the first data storage circuit is at the first logic level and the logic level of the third data storage circuit is at the first logic level, and carries out a second write operation to raise the threshold voltage of the memory cell when the logic level of the third data storage circuit is at the second logic level, which, in a first verify operation, does not precharge the memory cell when the logic level of the second data storage circuit is at the first logic level and precharges the memory cell when the logic level of the second data storage circuit is at the second logic level, which sets the logic level of the third data storage circuit to the second logic level when the threshold voltage of the memory cell has exceeded a first verify voltage, does not change the logic level of the third data storage circuit when the threshold voltage of the memory cell has not exceeded the first verify voltage, sets the logic level of the first data storage circuit to the second logic level when the threshold voltage of the memory cell has exceeded a second verify voltage higher than the first verify voltage, and does not change the logic level of the first data storage circuit when the threshold voltage of the memory cell has not exceeded the second verify voltage, which, in a second verify operation, does not precharge the memory cell when the logic level of the third data storage circuit is at the first logic level and precharges the memory cell when the logic level of the second data storage circuit is at the second logic level, which sets the logic level of the first data storage circuit to the second logic level when the threshold voltage of the memory cell has exceeded a third verify voltage higher than the second verify voltage, and does not change the logic level of the first data storage circuit when the threshold voltage of the memory cell has not exceeded the third verify voltage, and which, in a third verify operation, sets the logic level of the first data storage circuit to the second logic level when the threshold voltage of the memory cell has exceeded a fourth verify voltage higher than the third verify voltage, does not change the logic level of the first data storage circuit when the threshold voltage of the memory cell has not exceeded the fourth verify voltage, and repeats the first and second write operations and verify operations until the logic level of the first data storage circuit reaches the second logic level.

2. The device according to claim 1, wherein the memory cell is composed of an EEPROM.

3. The device according to claim 1, wherein the memory cell constitutes a NAND flash memory.

4. The device according to claim 1, wherein the second write operation is slower in write speed than the first write operation.

5. A semiconductor memory device comprising:

a memory cell which store a plurality of data with an n-valued threshold voltage (n is a natural number equal to or larger than 1);

a first data storage circuit which stores at least a first-logic-level or a second-logic-level data read from the memory cell;

a second data storage circuit which is connected to a data line and stores at least the first- or second-logic-level data supplied from the data line;

a third data storage circuit which stores at least the data read from the memory cell or the first- or second-logic-level data supplied from the first data storage circuit; and a control circuit which, after writing the data in a first page into the memory cell, stores the data in a second page via a data line into the second data storage circuit, stores the data in the first page read from the memory cell into the first data storage circuit, and manipulates the first, second, and third storage circuits in such a manner that the control circuit sets the second logic level in the third data storage circuit in a case where data "2" has been written into the memory cell or a case data "1" has been written into the memory cell and a first verify voltage has been exceeded, and, in other cases, sets the first logic level in the third data storage circuit.

6. The device according to claim 5, wherein the memory cell is composed of an EEPROM.

7. The device according to claim 5, wherein the memory cell constitutes a NAND flash memory.

8. A semiconductor memory device comprising:

a memory cell which stores a plurality of data with an n-valued threshold voltage (n is a natural number equal to or larger than 1);

a first data storage circuit which stores at least a first-logic-level or a second-logic-level data read from the memory cell;

a second data storage circuit which is connected to a data line and stores at least the first- or second-logic-level data supplied from the data line;

a third data storage circuit which stores at least the data read from the memory cell or the first- or second-logic-level data supplied from the first data storage circuit; and a control circuit which stores the data in a first page supplied from the data line into the second data storage circuit, transfers the data in the first page stored in the second data storage circuit to the first data storage circuit, stores the data in a second page supplied from the data line into the second data storage circuit, sets write data on the basis of the data in the first page stored in the first data storage circuit and the data in the second page stored in the second data storage circuit, and writes the data in the first page and the data in the second page into the memory cell at the same time on the basis of the write data.

9. The device according to claim 8, wherein the memory cell is composed of an EEPROM.

10. The device according to claim 8, wherein the memory cell constitutes a NAND flash memory.

11. A semiconductor memory device comprising:
a plurality of memory cells each of which is capable of having at least one of a first, a second, a third, and a fourth threshold voltage and stores two bits of data; and
a write circuit which controls the threshold voltages of said plurality of memory cells to write data and which includes
a first step of, according to data to be written, keeping the threshold voltage of a first memory cell at the first threshold voltage or changing the threshold voltage from the first threshold voltage to the third threshold voltage,
a second step of, according to data to be written, keeping the threshold voltage of a second memory cell at the first threshold voltage or changing the threshold voltage from the first threshold voltage to the third threshold voltage, and
a third step of, when the threshold voltage of the first memory cell is the first threshold voltage, according to data to be written, keeping the threshold voltage of the first memory cell at the first threshold voltage or changing the threshold voltage from the first threshold voltage to the second threshold voltage, and of, when the threshold voltage of the first memory cell is the third threshold voltage, according to data to be written, keeping the threshold voltage of the first memory cell at the third threshold voltage or changing the threshold voltage from the third threshold voltage to the fourth threshold voltage, and
which, when the threshold voltage of the first memory cell is kept at the third threshold voltage in the third step, changes the threshold voltage of the first memory cell if the threshold voltage of the first memory cell has not reached a specific threshold voltage.

12. The device according to claim 11, wherein the second threshold voltage lies between the first threshold voltage and the third threshold voltage.

13. The device according to claim 12, wherein each of the second threshold voltage and the third threshold voltage lies between the first threshold voltage and the fourth threshold voltage.

14. The device according to claim 11, wherein the write circuit further includes
a fourth step of, when the threshold voltage of the second memory cell is the first threshold voltage, according to data to be written, keeping the threshold voltage of the second memory cell at the first threshold voltage or changing the threshold voltage from the first threshold voltage to the second threshold voltage, and of, when the threshold voltage of the second memory cell is the third threshold voltage, according to data to be written, keeping the threshold voltage of the second memory cell at the third threshold voltage or changing the threshold voltage from the third threshold voltage to the fourth threshold voltage.

15. The device according to claim 14, wherein the write circuit changes the threshold voltage of the second memory cell, if the threshold voltage of the second memory cell has not reached a specific threshold voltage in the fourth step of keeping the threshold voltage of the second memory cell at the third threshold voltage.

16. The device according to claim 11, wherein the first memory cell and the second memory cell are provided so as to be adjacent to each other.

17. The device according to claim 11, wherein the first memory cell and the second memory cell are connected to a common word line and provided so as to be adjacent to each other.

18. The device according to claim 11, wherein the first memory cell and the second memory cell are connected to a common bit line and provided so as to be adjacent to each other.

19. The device according to claim 11, wherein the definition of the value of the third threshold voltage before the third step differs from that after the third step.

20. The device according to claim 19, further comprising a third memory cell which stores data that indicates whether the third step has been carried out or not, in order to control the value of the third threshold voltage.

21. A semiconductor memory device comprising:
a plurality of memory cells each of which is capable of having at least one of a first, a second, a third, and a fourth threshold voltage and stores two bits of data; and
a write circuit which controls the threshold voltages of said plurality of memory cells to write data and which includes
a first step of, according to data to be written, keeping the threshold voltage of a first memory cell at the first threshold voltage or changing the threshold voltage from the first threshold voltage to the third threshold voltage,
a second step of, according to data to be written, keeping the threshold voltage of a second memory cell at the first threshold voltage or changing the threshold voltage from the first threshold voltage to the third threshold voltage,
a third step of, according to data to be written, keeping the threshold voltage of a third memory cell at the first threshold voltage or changing the threshold voltage from the first threshold voltage to the third threshold voltage, and
a fourth step of, when the threshold voltage of the first memory cell is the first threshold voltage, according to data to be written, keeping the threshold voltage of the first memory cell at the first threshold voltage or changing the threshold voltage from the first threshold voltage to the second threshold voltage, and of, when the threshold voltage of the first memory cell is the third threshold voltage, according to data to be written, keeping the threshold voltage of the first memory cell at the third threshold voltage or changing the threshold voltage from the third threshold voltage to the fourth threshold voltage.

22. The device according to claim 21, wherein the write circuit changes the threshold voltage of the first memory cell, when the threshold voltage of the first memory cell has not reached a specific threshold voltage in the fourth step of keeping the threshold voltage of the first memory cell at the third threshold voltage.

23. The device according to claim 21, wherein the second threshold voltage lies between the first threshold voltage and the third threshold voltage.

24. The device according to claim 23, wherein each of the second threshold voltage and the third threshold voltage lies between the first threshold voltage and the fourth threshold voltage.

25. The device according to claim 22, wherein the write circuit further includes a fifth step of, when the threshold voltage is the first threshold voltage, according to data to be written, keeping the threshold voltages of the second memory cell and the third memory cell at the first threshold voltage or changing the threshold voltage from the first threshold voltage to the second threshold voltage, and of, when the threshold voltage is the third threshold voltage, according to data to be written, keeping the threshold voltages of the second memory cell and the third memory cell at the third threshold voltage or changing the threshold voltage from the third threshold voltage to the fourth threshold voltage.

26. The device according to claim 25, wherein the write circuit changes the threshold voltages of the second memory cell and the third memory cell, when the threshold voltages of the second memory cell and the third memory cell have not reached a specific threshold voltage in the fifth step of keeping the threshold voltages at the third threshold voltage.

27. The device according to claim 21, wherein the first memory cell and the second memory cell are provided so as to be adjacent to each other and the first memory cell and the third memory cell are provided so as to be adjacent to each other.

28. The device according to claim 21, wherein the first memory cell and the second memory cell are connected to a common word line and provided so as to be adjacent to each other and the first memory cell and the third memory cell are connected to a common bit line and provided so as to be adjacent to each other.

29. The device according to claim 22, wherein the definition of the value of the third threshold voltage before the fourth step differs from that after the fourth step.

30. The device according to claim 29, further comprising a fourth memory cell which stores data that indicates whether the fourth step has been carried out or not, in order to control the value of the third threshold voltage.

* * * * *